United States Patent
Lindsey et al.

(10) Patent No.: US 10,401,385 B2
(45) Date of Patent: Sep. 3, 2019

(54) LIMITING TRANSLATION FOR CONSISTENT SUBSTRATE-TO-SUBSTRATE CONTACT

(71) Applicant: Aehr Test Systems, Fremont, CA (US)

(72) Inventors: Scott E. Lindsey, Brentwood, CA (US); Junjye Yeh, Livermore, CA (US); Jovan Jovanovic, Santa Clara, CA (US); Seang P. Malathong, Newark, CA (US)

(73) Assignee: Aehr Test Systems, Fremont, CA (US)

( * ) Notice: Subject to any disclaimer, the term of this patent is extended or adjusted under 35 U.S.C. 154(b) by 55 days.

(21) Appl. No.: 15/839,707

(22) Filed: Dec. 12, 2017

(65) Prior Publication Data

US 2018/0113150 A1 Apr. 26, 2018

Related U.S. Application Data

(62) Division of application No. 15/453,819, filed on Mar. 8, 2017, now Pat. No. 9,880,197, which is a division
(Continued)

(51) Int. Cl.
*G01R 1/04* (2006.01)
*G01R 1/073* (2006.01)
(Continued)

(52) U.S. Cl.
CPC ......... *G01R 1/0441* (2013.01); *G01R 1/0416* (2013.01); *G01R 1/0491* (2013.01);
(Continued)

(58) Field of Classification Search
None
See application file for complete search history.

(56) References Cited

U.S. PATENT DOCUMENTS

| | | | |
|---|---|---|---|
| 5,973,285 A | 10/1999 | Dietrich et al. | |
| 6,867,608 B2 | 3/2005 | Richmond et al. | |

(Continued)

FOREIGN PATENT DOCUMENTS

| | | | |
|---|---|---|---|
| JP | 2002-151558 A | 5/2002 | |
| JP | 2006-98064 A | 4/2006 | |

(Continued)

*Primary Examiner* — Jermele M Hollington
(74) *Attorney, Agent, or Firm* — Stephen M. De Klerk

(57) ABSTRACT

A method of testing an integrated circuit of a device is described. Air is allowed through a fluid line to modify a size of a volume defined between the first and second components of an actuator to move a contactor support structure relative to the apparatus and urge terminals on the contactor support structure against contacts on the device. Air is automatically released from the fluid line through a pressure relief valve when a pressure of the air in the fluid line reaches a predetermined value. The holder is moved relative to the apparatus frame to disengage the terminals from the contacts while maintaining the first and second components of the actuator in a substantially stationary relationship with one another. A connecting arrangement is provided including first and second connecting pieces with complementary interengaging formations that restricts movement of the contactor substrate relative to the distribution board substrate in a tangential direction.

20 Claims, 53 Drawing Sheets

Related U.S. Application Data of application No. 14/583,545, filed on Dec. 26, 2014, now Pat. No. 9,625,521, which is a division of application No. 13/223,319, filed on Sep. 1, 2011, now Pat. No. 8,947,116, which is a division of application No. 12/411,233, filed on Mar. 25, 2009, now Pat. No. 8,030,957.

(51) Int. Cl.
G01R 31/28 (2006.01)
G01R 1/067 (2006.01)
G01R 31/26 (2014.01)

(52) U.S. Cl.
CPC ..... *G01R 1/06705* (2013.01); *G01R 1/07307* (2013.01); *G01R 31/2601* (2013.01); *G01R 31/2855* (2013.01); *G01R 31/2863* (2013.01); *G01R 31/2886* (2013.01); *G01R 31/2887* (2013.01)

(56) References Cited

U.S. PATENT DOCUMENTS

| | | | |
|---|---|---|---|
| 7,762,822 B2* | 7/2010 | Richmond, II | G06F 8/30 439/131 |
| 7,800,382 B2 | 9/2010 | Lindsey et al. | |
| 7,826,995 B2 | 11/2010 | Maenner | |
| 7,969,175 B2 | 6/2011 | Hendrickson et al. | |
| 8,030,957 B2 | 10/2011 | Lindsey et al. | |
| 8,228,085 B2 | 7/2012 | Lindsey et al. | |
| 8,506,335 B2 | 8/2013 | Richmond et al. | |
| 8,628,336 B2 | 1/2014 | Richmond, II et al. | |
| 8,947,116 B2 | 2/2015 | Lindsey et al. | |
| 9,625,521 B2 | 4/2017 | Lindsey et al. | |
| 9,880,197 B2* | 1/2018 | Lindsey | G01R 31/2887 |
| 2007/0001790 A1* | 1/2007 | Richmond, II | G06F 8/30 335/2 |
| 2008/0048688 A1 | 2/2008 | Mathieu et al. | |
| 2008/0079451 A1 | 4/2008 | Maenner | |
| 2009/0160468 A1 | 6/2009 | Lindsey et al. | |
| 2010/0213957 A1 | 8/2010 | Richmond et al. | |
| 2010/0244866 A1 | 9/2010 | Lindsey et al. | |
| 2011/0006800 A1 | 1/2011 | Lindsey et al. | |
| 2012/0280704 A1 | 11/2012 | Lindsey et al. | |
| 2013/0304412 A1 | 11/2013 | Richmond, II et al. | |
| 2014/0232424 A1 | 8/2014 | Richmond, II et al. | |

FOREIGN PATENT DOCUMENTS

| | | |
|---|---|---|
| JP | 2008-541415 A | 11/2008 |
| WO | 2006/116767 A1 | 11/2006 |

* cited by examiner

LIMITING TRANSLATION FOR CONSISTENT SUBSTRATE-TO-SUBSTRATE CONTACT

CROSS-REFERENCE TO OTHER APPLICATIONS

This is a division of U.S. patent application Ser. No. 15/453,819, filed on Mar. 8, 2017 now U.S. Pat. No. 9,880,197, which is a division of U.S. patent application Ser. No. 14/583,545, filed on Dec. 26, 2014 now U.S. Pat. No. 9,625,521, which is a division of U.S. patent application Ser. No. 13/223,319, filed on Sep. 1, 2011 now U.S. Pat. No. 8,947,116, which is a division of U.S. patent application Ser. No. 12/411,233, filed on Mar. 25, 2009 now U.S. Pat. No. 8,030,957.

BACKGROUND OF THE INVENTION

1). Field of the Invention

This invention relates to an apparatus that is used for full-wafer testing and/or burn-in testing and/or built-in self-testing.

2). Discussion of Related Art

Microelectronic circuits are usually fabricated in and on semiconductor wafers. Such a wafer is subsequently "singulated" or "diced" into individual dies. Such a die is typically mounted to a supporting substrate for purposes of providing rigidity thereto and electronic communication with an integrated or microelectronic circuit of the die. Final packaging may include encapsulation of the die and the resulting package can then be shipped to a customer.

It is required that the die or the package be tested before being shipped to a customer. Ideally, the die should be tested at an early stage for the purposes of identifying the defects that occur during early stage manufacturing.

The earliest stage that a die can be tested is after completion of the manufacture of circuits at wafer level and before a wafer is singulated. Full-wafer testing carries with it a number of challenges. One challenge in full-wafer testing is that there are a large amount of contacts on a wafer and that a large number of power, ground, and signal connections thus have to be made.

SUMMARY OF THE INVENTION

The invention provides a method of testing an integrated circuit of a device, including holding the device against a surface of a holder, moving a contactor board assembly relative to the holder to bring terminals of the contactor board assembly into contact with contacts on the device, and providing signals through the terminals and contacts to the integrated circuit.

The method may further include allowing air through a fluid line to modify a size of a volume defined between the first and second components of the actuator to move the contactor support structure relative to the apparatus frame.

The method may further include automatically releasing air from the fluid line though a pressure relief valve when a pressure of the air in the fluid line reaches a predetermined value.

In the method, the device may be a first device, further including reducing a pressure in the internal volume while maintaining the terminals in contact with the contacts, moving the holder relative to the apparatus frame to disengage the terminals from the contacts while maintaining the first and second components of the actuator in a substantially stationary relationship with one another, replacing the first device with a second device by removing the first device from the holder and holding the second device against the surface of the holder, moving the holder relative to the frame to bring the terminals into contact with contacts of the second device while the first and second components of the actuator remain in substantially in the stationary relationship relative to one another, increasing the pressure in the volume to urge the terminals against the contacts on the second device, and providing signals through the terminals and the contacts of the second device to an integrated circuit of the second device.

In the method, the first and second portions of the actuator may be a cylinder and a piston, respectively, the piston being located in the cylinder so that the cylinder and the piston jointly define the volume, further including modify a pressure of the volume and move the piston relative to the cylinder.

The method may further include adjusting the force of at least one spring that connects the piston to the cylinder to level the piston relative to the cylinder.

In the method, the actuator may include inflatable and deflatable bladder, the first and second portions of the actuator being opposing sides of the bladder.

In the method, a plurality of electrical components may be mounted on the contactor board assembly.

In the method, the electrical components may be mounted on a side on the contactor board assembly opposing the terminals held by the contactor board assembly.

In the method, the electrical components may be located between a force distribution substrate and the contactor board assembly, further including transferring force from the contactor substrate to the force distribution substrate through a stand-off component.

The method may further include locating a compensating piece against a first piece of a subassembly that may include the contactor board assembly, the compensating piece having a profiled surface to improve planarity of a surface of the subassembly other than the profiled surface of the compensating piece.

In the method, the contactor support structure may include a distribution board substrate and a contactor substrate mounted to the distribution board substrate.

The method may further include connecting the contactor substrate to the distribution board substrate with at least a first connecting arrangement, the first connecting arrangement including first and second connecting pieces with complementary interengaging formations that allow for movement of the contactor substrate relative to the distribution board substrate in a first radial direction and restricts movement of the contactor substrate relative to the distribution board substrate in a first tangential direction transverse to the first radial direction.

In the method, the distribution board may have a plurality of layers having a plurality of different stiffnesses, one of the layers in a half of the distribution board substrate opposing the terminals held by the contactor support structure being stiffer than a majority of the layers.

The method may further include removably mounting a cartridge frame of a cartridge to the apparatus frame, the contactor board assembly forming part of the cartridge, and connecting a surface of a connector interface to a surface of a contactor interface.

In the method, the cartridge may include a common subassembly and a first unique contactor subassembly, further including replacing the first unique contactor subassembly with a second unique contactor subassembly.

The method may further include reducing a pressure in an area between the common subassembly and the second unique contactor subassembly.

The invention also provides an apparatus for testing an integrated circuit of a device, including an apparatus frame, a holder for the device, secured to the apparatus frame, a contactor support structure held by the apparatus frame, a plurality of terminals held by the contactor support structure, the holder and contactor support structure being movable relative to one another so that each one of the terminals releasably makes contact with a respective contact of the device, a power source, a power electrical path connecting the power source to a power terminal of the terminals held by the support structure, a signal source, and a plurality of signal electrical paths, each connecting the signal source to a respective signal terminal of the terminals held by the support structure.

The apparatus may further include an actuator connected between the apparatus frame and the contactor support structure, having first and second portions that may be movable relative to one another to move the contactor support structure relative to the apparatus frame and toward the surface of the holder so that the terminals may be urged against contacts of the device.

In the apparatus, the actuator may have a volume defined between the first and second components and a fluid line connected to the volume to allow air through the volume and thereby modify a size of the volume and move the contactor support structure relative to the apparatus frame.

The apparatus may further include a pressure relief valve connected to the fluid line to automatically release air from the fluid line though the pressure relief valve when a pressure of the air in the fluid line reaches a predetermined value.

In the apparatus, the device may be a first device, further including a processor, a memory connected to the processor, and a computer program stored in the memory and executable by the processor to carry out a method including reducing a pressure in the internal volume while maintaining the terminals in contact with the contacts, moving the holder relative to the apparatus frame to disengage the terminals from the contacts while maintaining the first and second components of the actuator in a substantially stationary relationship with one another, replacing the first device with a second device by removing the first device from the holder and holding the second device against the surface of the holder, moving the holder relative to the frame to bring the terminals into contact with contacts of the second device while the first and second components of the actuator remain in substantially in the stationary relationship relative to one another, increasing the pressure in the volume to urge the terminals against the contacts on the second device, and providing signals through the terminals and the contacts of the second device to an integrated circuit of the second device.

In the apparatus, the first and second portions of the actuator may be a cylinder and a piston, respectively, the piston being located in the cylinder so that the cylinder and the piston jointly define a volume, further including, the fluid line being connected to the volume to modify a pressure of the volume and move the piston relative to the cylinder.

The apparatus may further include a spring, and a spring adjustment mechanism having a first portion secured to the piston and a second portion connected to the spring, the spring adjustment mechanism being adjustable to adjust a force of the spring and level the piston relative to the cylinder.

In the apparatus, the actuator may include inflatable and deflatable bladder, the first and second portions of the actuator being opposing sides of the bladder.

The apparatus may further include a plurality of electrical components mounted on the contactor support structure.

In the apparatus, the electrical components may be mounted on a side on the contactor support structure opposing the terminals held by the contactor support structure.

The apparatus may further include a force distribution substrate, the electrical components being located between the force distribution substrate and the force distribution substrate and the contactor support structure, and a stand-off component between the force distribution substrate and the contactor substrate to transfer force from the contactor substrate to the force distribution substrate.

The apparatus may further include a subassembly having the contactor support structure, the terminals and a compensating piece with a profiled surface that improves planarity of a surface of the subassembly other than the profiled surface of the compensating piece.

In the apparatus, the contactor support structure may include a distribution board substrate and a contactor substrate mounted to the distribution board substrate.

The apparatus may further include at least a first connecting arrangement that connects the contactor substrate to the distribution board substrate, the first connecting arrangement including first and second connecting pieces with complementary interengaging formations that allow for movement of the contactor substrate relative to the distribution board substrate in a first radial direction and restricts movement of the contactor substrate relative to the distribution board substrate in a first tangential direction transverse to the first radial direction.

In the apparatus, the distribution board may have a plurality of layers having a plurality of different stiffnesses, one of the layers in a half of the distribution board substrate opposing the terminals held by the contactor support structure being stiffer than a majority of the layers.

The apparatus may further include cartridge including a cartridge frame that may be removably mountable to the apparatus frame, the contactor board forming part of the cartridge, a contactor interface on the contactor support structure, and a connector interface having a surface for connecting to a surface of the contactor interface.

In the apparatus, the cartridge may include a common subassembly and a first unique contactor subassembly that may be replaceable with a second unique contactor subassembly.

The apparatus may further include a pressure reduction passage in communication with an area between the common subassembly and the second unique contactor subassembly and having an outlet on an external side of the cartridge, and a pump connected to the outlet of the pressure reduction passage so as to reduce a pressure in the area between the common subassembly and the second unique contactor subassembly.

The invention further provides a cartridge, including a cartridge frame, formations on the cartridge frame for mounting the cartridge frame in a fixed position to an apparatus frame, a contactor support structure, a contactor interface on the contactor support structure, a plurality of terminals, held by the contactor support structure, for contacting contacts on a device, and a plurality of conductors, held by the contactor support structure, connecting the interface to the terminals.

The cartridge may further include an actuator connected between the cartridge frame and the contactor support structure, having first and second portions that may be movable relative to one another to move the contactor support structure relative to the cartridge frame and toward the surface of the holder so that the terminals may be urged against contacts of the device.

In the cartridge, the actuator may have a volume defined between the first and second components and a fluid line connected to the volume to allow air through the volume and thereby modify a size of the volume and move the contactor support structure relative to the apparatus frame.

The cartridge may further include a pressure relief valve connected to the fluid line to automatically release air from the fluid line though the pressure relief valve when a pressure of the air in the fluid line reaches a predetermined value.

In the cartridge, the device may be a first device, further including a processor, a memory connected to the processor, and a computer program stored in the memory and executable by the processor to carry out a method including reducing a pressure in the internal volume while maintaining the terminals in contact with the contacts, moving the holder relative to the apparatus frame to disengage the terminals from the contacts while maintaining the first and second components of the actuator in a substantially stationary relationship with one another, replacing the first device with a second device by removing the first device from the holder and holding the second device against the surface of the holder, moving the holder relative to the frame to bring the terminals into contact with contacts of the second device while the first and second components of the actuator remain in substantially in the stationary relationship relative to one another, increasing the pressure in the volume to urge the terminals against the contacts on the second device, and providing signals through the terminals and the contacts of the second device to an integrated circuit of the second device.

In the cartridge, the first and second portions of the actuator may be a cylinder and a piston, respectively, the piston being located in the cylinder so that the cylinder and the piston jointly define a volume, further including, the fluid line being connected to the volume to modify a pressure of the volume and move the piston relative to the cylinder.

The cartridge may further include a spring, and a spring adjustment mechanism having a first portion secured to the piston and a second portion connected to the spring, the spring adjustment mechanism being adjustable to adjust a force of the spring and level the piston relative to the cylinder.

In the cartridge, the actuator may include inflatable and deflatable bladder, the first and second portions of the actuator being opposing sides of the bladder.

The cartridge may further include a plurality of electrical components mounted on the contactor support structure.

In the cartridge, the electrical components may be mounted on a side on the contactor support structure opposing the terminals held by the contactor support structure.

The cartridge may further include a force distribution substrate, the electrical components being located between the force distribution substrate and the force distribution substrate and the contactor support structure, and a stand-off component between the force distribution substrate and the contactor substrate to transfer force from the contactor substrate to the force distribution substrate.

The cartridge may further include a subassembly having the contactor support structure, the terminals and a compensating piece with a profiled surface that improves planarity of a surface of the subassembly other than the profiled surface of the compensating piece.

In the cartridge, the contactor support structure may include a distribution board substrate and a contactor substrate mounted to the distribution board substrate.

The cartridge may further include at least a first connecting arrangement that connects the contactor substrate to the distribution board substrate, the first connecting arrangement including first and second connecting pieces with complementary interengaging formations that allow for movement of the contactor substrate relative to the distribution board substrate in a first radial direction and restricts movement of the contactor substrate relative to the distribution board substrate in a first tangential direction transverse to the first radial direction.

In the cartridge, the distribution board may have a plurality of layers having a plurality of different stiffnesses, one of the layers in a half of the distribution board substrate opposing the terminals held by the contactor support structure being stiffer than a majority of the layers.

In the cartridge, the cartridge may include a common subassembly and a first unique contactor subassembly that may be replaceable with a second unique contactor subassembly.

The cartridge may further include a pressure reduction passage in communication with an area between the common subassembly and the second unique contactor subassembly and having an outlet on an external side of the cartridge.

BRIEF DESCRIPTION OF THE DRAWINGS

The invention is further described by way of example with reference to the accompanying drawings wherein.

DETAILED DESCRIPTION OF THE INVENTION

Figure 1:
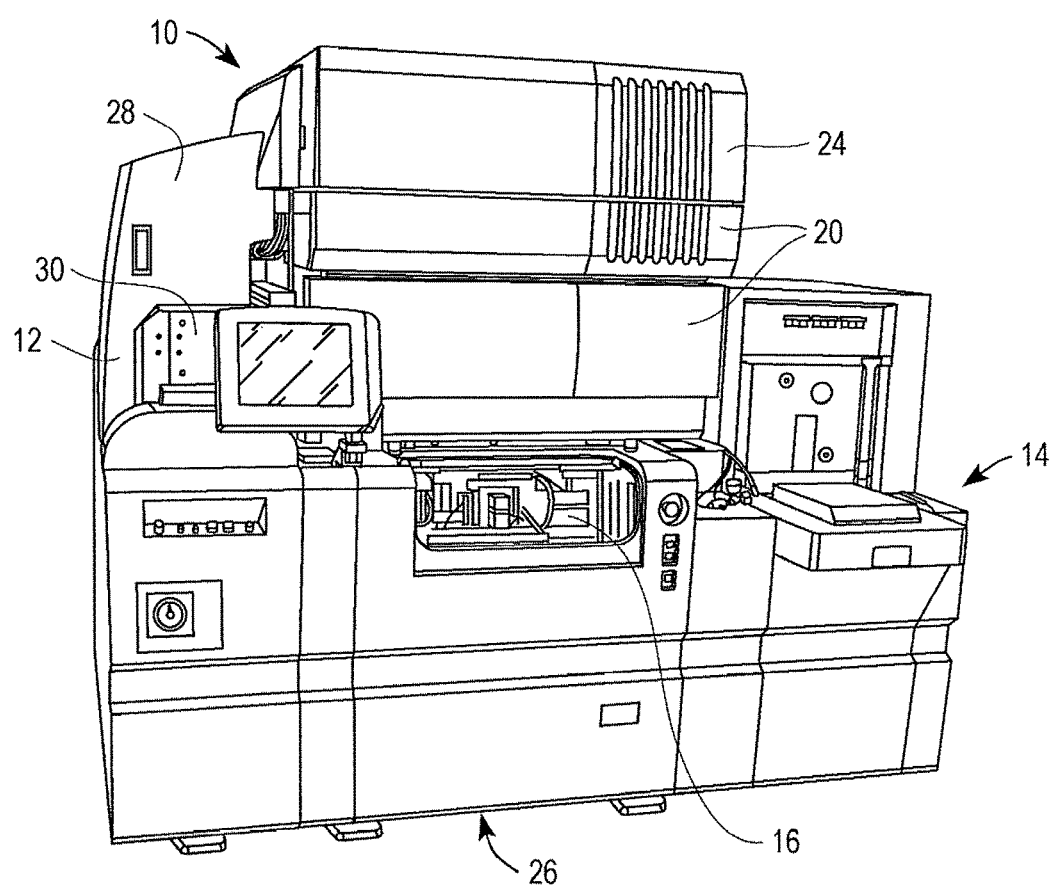
FIG. 1 is a perspective view of an apparatus, according to an embodiment of the invention, which can be used for full-wafer testing and/or burn-in and/or built-in self-testing.
Figure 2:
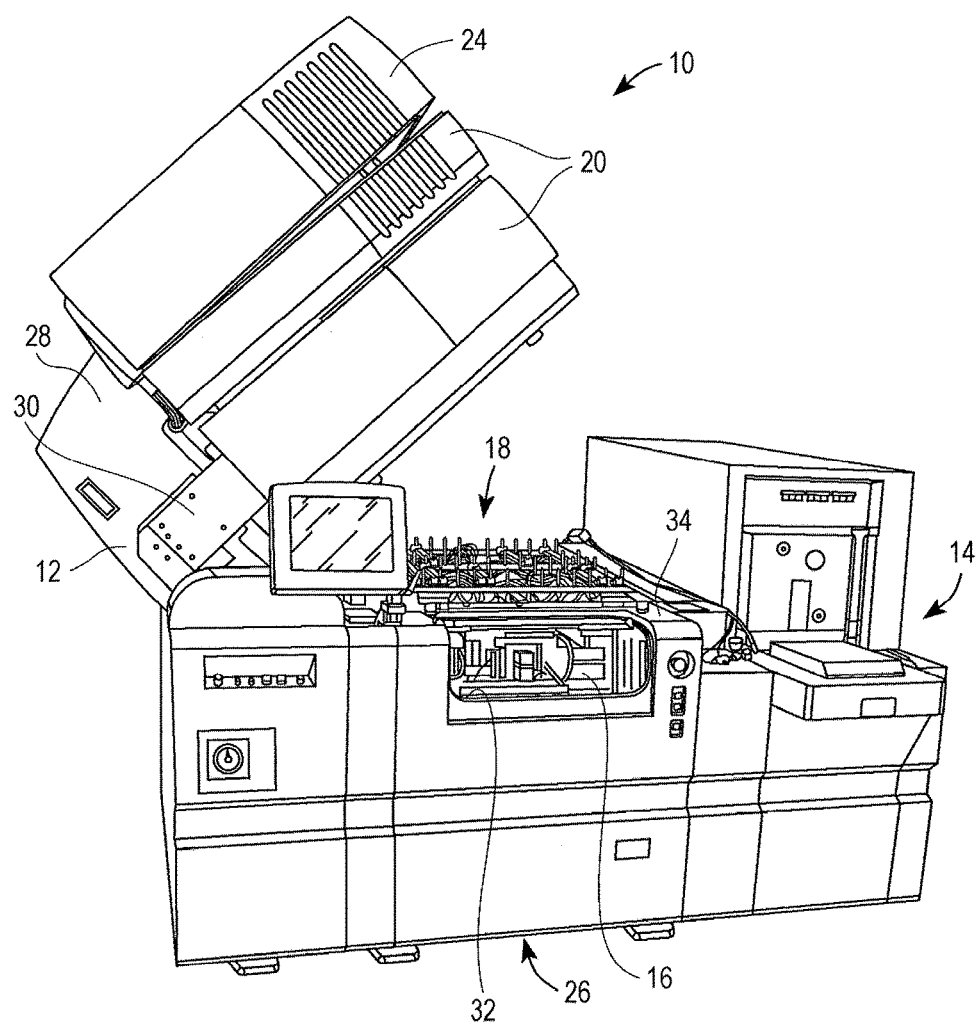
FIG. 2 is a view similar to FIG. 1, wherein a thermal system frame portion is rotated approximately 45 degrees counterclockwise.

FIGS. 1 and 2 of the accompanying drawings illustrate an apparatus 10, which is particularly suitable for full-wafer testing of microelectronic circuits of unsingulated wafers and/or burn-in testing of unsingulated wafers and/or built-in self-testing of unsingulated wafers. The apparatus 10 includes a frame 12 and a number of modules mounted to the frame 12 including a wafer loader 14, a probing subassembly 16, a cartridge 18, a test head 20, and a thermal system 24.

The frame 12 has a prober base portion 26, a thermal system frame portion 28, and a test head frame portion 30. The thermal system frame portion 28 is pivotally mounted to the prober base portion 26. The test head frame portion 30 is pivotally mounted to the thermal system frame portion 28. The probing subassembly 16 and the cartridge 18 are mounted to lower and upper portions 32 and 34 respectively of the prober base portion 26, and the test head 20 and the thermal system 24 are mounted to the test head frame portion 30 and the thermal system frame portion 28 respectively.

The thermal system frame portion 28 can, for example, be pivoted between a position as shown in FIG. 1 wherein the thermal system frame portion 28 is over the prober base portion 26, and a position as shown in FIG. 2 wherein the pivot arm portion is pivoted approximately 45 degrees counterclockwise to the left. Pivoting of the thermal system frame portion 28 into the position shown in FIG. 2 moves the test head 20 away from the cartridge 18. Access is thereby gained to the cartridge 18 for purposes of maintenance to or replacement of the cartridge 18.

Figure 3:
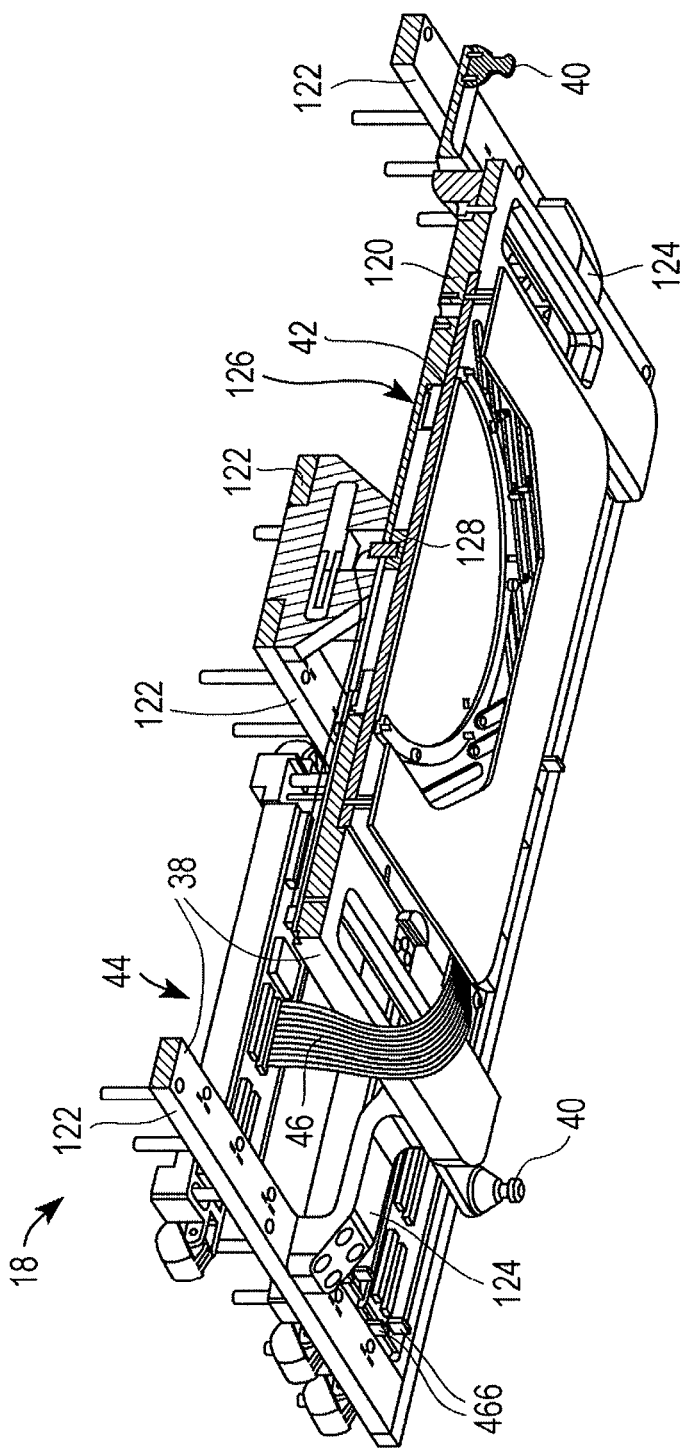
FIG. 3 is a sectioned perspective view from below, illustrating a replaceable cartridge forming part of the apparatus of FIGS. 1 and 2.

As illustrated in FIG. 3, the cartridge 18 includes a cartridge frame 38, alignment pins 40 for aligning and locking the cartridge frame 38 in a fixed position, a contactor assembly 42, a plurality of first connector sets 44, and a plurality of flexible attachments 46 connecting the contactor assembly 42 to the first connector sets 44.

Figure 4:
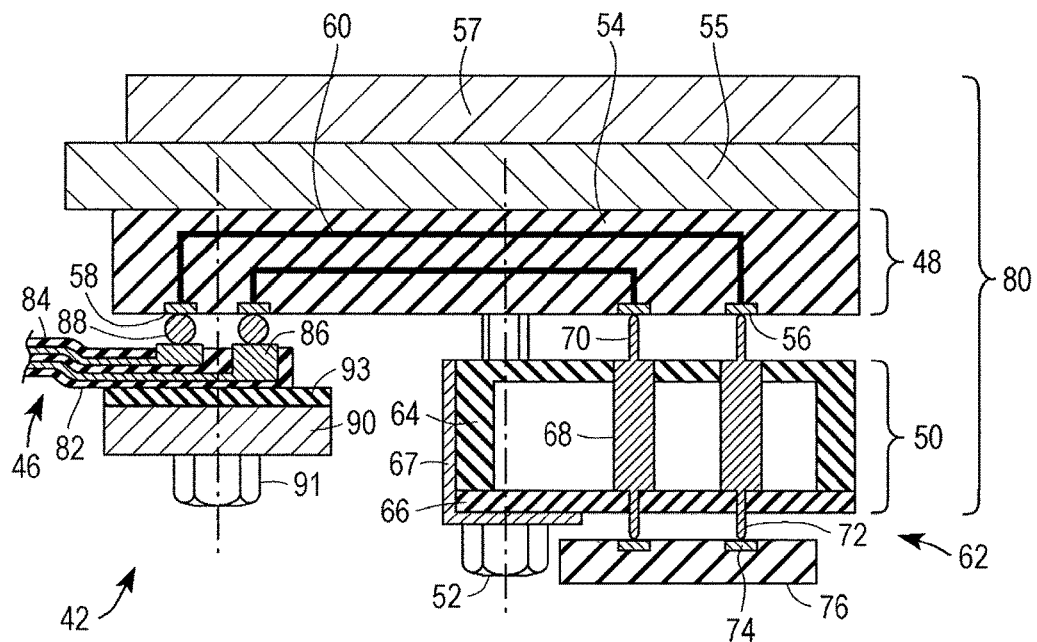
FIG. 4 is a cross-sectional side view, illustrating a contactor assembly forming a lower part of the cartridge of FIG. 3.

As shown in FIG. 4, the contactor assembly 42 includes a distribution board 48, a contactor board 50, and fasteners 52 that secure the contactor board 50 to the distribution board 48.

Distribution board 48 has a force distribution substrate 55, a thermal expansion equalization substrate 57, and an electrical distribution substrate 54, a plurality of terminals 56 formed on the electrical distribution substrate 54, a plurality of contacts 58 formed on the electrical distribution substrate 54, and a plurality of conductors 60 carried within the electrical distribution substrate 54. The terminals 56 and the contacts 58 are formed on the same side but on different areas of the electrical distribution substrate 54. Each conductor 60 interconnects a respective one of the terminals 56 with a respective one of the contacts 58.

The contactor board 50 includes a contactor substrate 62 having first and second pieces 64 and 66, a collar 67, and a plurality of pins 68. One end of each pin 68 is inserted through an opening in the first piece 64, and then inserted through an opening in the second piece 66. Each pin 68 has a central body that is larger than its ends so that it is held in place by the opening in the second piece 66. The collar 67 is used to align the first and second pieces 64 and 66 relative to one another. One end of each pin 68 forms a contact 70 that is placed against a respective terminal 56 of the distribution board 48. An opposing end of each pin 68 forms a terminal 72 that can touch a contact 74 on a wafer 76. The fasteners 52 may, for example, be bolts, each having a shank that is inserted though an opening in the contactor substrate 62, and thread on the shank is then screwed into a threaded opening in the electrical distribution substrate 54. The electrical distribution substrate 54, the contactor substrate 62, force distribution substrate 55, expansion equalization substrate 57, and the fasteners 52 jointly form a support structure 80 with the terminals 72 extending from the support structure 80. The pins 68, terminals 56, conductors 60, and contacts 58 form conductive links to and from the terminals 72.

Each one of the flexible attachments 46 has a flexible nonconductive outer layer 82, a plurality of conductors 84 held within the outer layer 82 and separated from one another by the material of the outer layer 82, a plurality of open terminals 86 at ends of the respective conductors 84, and a plurality of electrically conductive bumps 88, each on a respective one of the terminals 86. Each one of the conductive bumps 88 is placed against a respective one of the contacts 58 of the distribution board 48. A clamp piece 90 is placed over an end of the flexible attachment 46. Fasteners 91 are used to secure the clamp piece 90 to the electrical distribution substrate 54, and provide a force that clamps the end of the flexible attachment 46 between the clamp piece 90 and the electrical distribution substrate 54.

Figure 5:
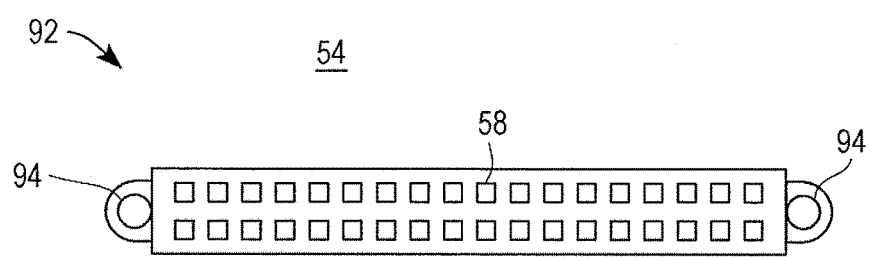
FIG. 5 is a bottom plan view of one interface of contacts on a distribution board of the contactor assembly of FIG. 5.

As further shown in FIG. 5, the contacts 58 form an interface 92. The interface 92 has two parallel rows of the contacts 58. Two of the contacts 58g are ground contacts that extend from one of the rows to the other and are located at opposing ends of the rows. Threaded openings 94 are formed on opposing ends of the interface 92 into the electrical distribution substrate 54. Each one of the fasteners 91 in FIG. 4 has a respective head and a respective threaded shank extending from the head. The head rests on the clamp piece 90 and the shank is screwed into one of the threaded openings 94 in FIG. 5. A compliant member 93 is located between the clamp piece 90 and the flexible nonconductive outer layer 82 to distribute a force created by the clamp piece 90 to ensure uniform contact by the electrically conductive bumps 88.

Figure 6:
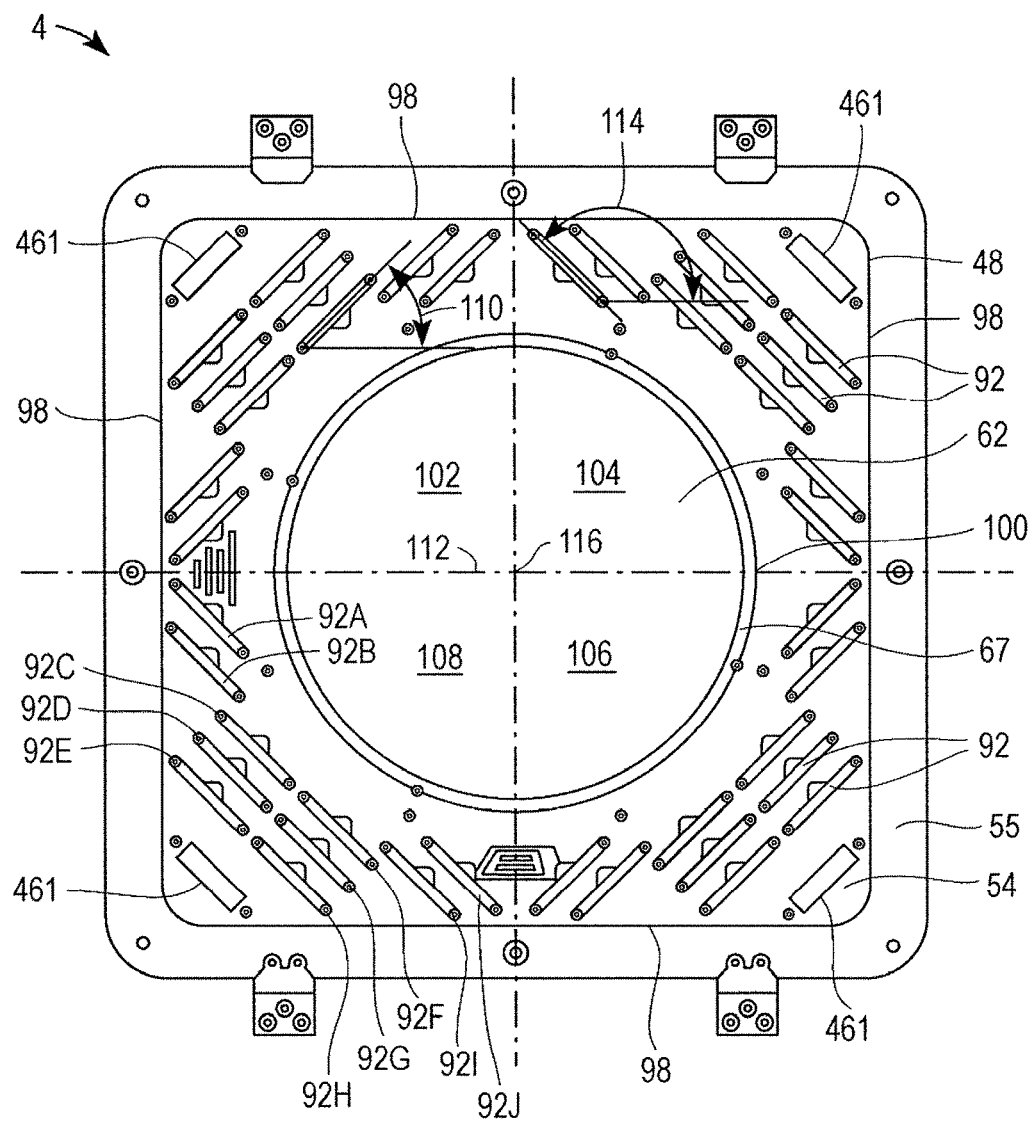
FIG. 6 is a bottom plan view of the contactor assembly of FIG. 5, particularly illustrating a layout of a plurality of interfaces of FIG. 5.

Referring to FIG. 6, the electrical distribution substrate 54 is square and has a periphery formed by four sides 98. The contactor substrate 62 has a circular periphery 100 within the four sides 98. A plurality of interfaces 92 such as the interface 92 of FIG. 5 are provided on an area of the electrical distribution substrate 54 outside the circular periphery 100. The locations and orientations of the interfaces 92 are selected to provide a relatively dense configuration. The combined length of all the interfaces 92 is more than the length of the circular periphery 100. The combined length of the interfaces 92 is also more than the combined length of the four sides 98. The interfaces 92 in each respective quarter 102, 104, 106, and 108 are all aligned in the same direction.

The interfaces 92 of the juxtaposed quarters 102 and 106 are each at an angle 110 of 45 degrees relative to a centerline 112 through the distribution substrate 54. The interfaces of the juxtaposed quarters 104 and 108 are each at an angle 114 of 135 degrees relative to the centerline 112 as measured in the same direction as the angle 110.

Each one of the quarters 102, 104, 106, or 108 has ten of the interfaces 92A to 92J. The interfaces 92C, 92D, and 92E are parallel to one another but at different distances from a center point 116 of the contactor substrate 62. The interfaces 92F, 92G, and 92H are parallel to one another but at different distances from the center point 116. The interfaces 92C and 92F are in line with one another, as are the interfaces 92D and 92G and the interfaces 92E and 92H. The interfaces 92B and 92I are in line with one another but form a row that is closer to the center point 116 than the row formed by the interfaces 92C and 92F. The interfaces 92B and 92I are also spaced further from one another than the interfaces 92C and 92F. The interfaces 92A and 92J also form a row that is closer to the center point 116 than the row formed by the interfaces 92B and 92I.

Each one of the quarters 102, 104, 106, and 108 has an arrangement of ten of the interfaces 92 that is similar to the arrangement of interfaces 92A to 92J. The arrangement is rotated through 90 degrees about the center point 116 when moving from the quarter 108 to the quarter 102. Similarly, the arrangement is rotated through another 90 degrees when moving from the quarter 102 to the quarter 104, etc.

A respective flexible attachment 46 is connected to each respective one of the interfaces 92. The arrangement of the interfaces 92 allows for "fanning-in" or "fanning-out" of a large number of electrical paths to or from a relatively dense arrangement of the terminals 72 of the contactor board 50.

Referring again to FIG. 3, the cartridge frame 38 includes a lower backing plate 120, upper support pieces 122, and connecting pieces 124 that mount the upper support pieces 122 to the backing plate 120. The cartridge 18 further includes an actuator mechanism 126 for moving the contactor assembly 42 relatively with respect to the cartridge frame 38, and a travel sensor 128.

Figure 7:
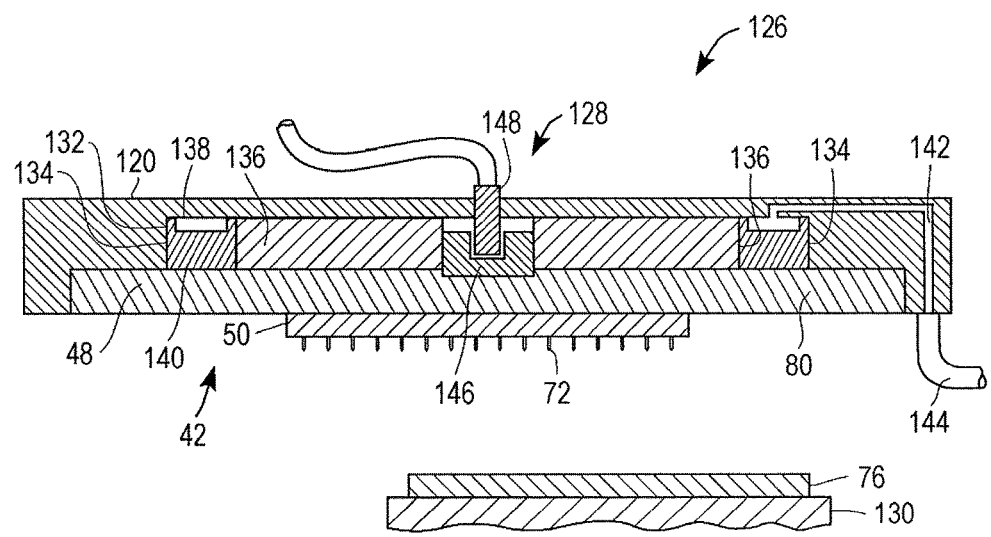
FIG. 7 is a cross-sectional side view of a portion of the cartridge of FIG. 3, particularly illustrating an actuator mechanism that is used to move the contactor assembly relative to a backing plate of a cartridge frame, and further illustrating a wafer holder in the form of a wafer chuck that holds a wafer.

FIG. 7 illustrates the actuator mechanism 126, travel sensor 128, and a wafer chuck 130 holding a wafer 76. A cylinder 132 is manufactured in the backing plate 120. The cylinder 132 has an outer surface 134 and an upper surface 138. A ring-shaped sliding piston 140 is inserted into the cylinder 132. A lower surface of the piston 140 is attached to the support structure 80. A fixed ring-shaped piston 136 is inserted into the center of the piston 140. An upper surface of the fixed ring-shaped piston 136 is attached to the backing plate 120. The support structure 80 is thus connected through the piston 140, fixed ring-shaped piston 136, and cylinder 132 of the actuator mechanism 126 to the backing plate 120. By locating the actuator mechanism 126 between the backing plate 120 and the support structure 80, the actuator mechanism 126 can move the contactor assembly 42 relatively with respect to the backing plate 120. A fluid passage 142 is manufactured in the backing plate 120. The fluid passage 142 extends from an external surface of the backing plate 120 to a location above an upper surface of the piston 140. A fluid line 144 is connected to the fluid passage 142. Pressurized air or a vacuum pressure can be provided through the fluid line 144 and fluid passage 142 to an upper surface of the piston 140.

The travel sensor 128 has an outer portion 146 attached to the support structure 80, and an inner portion 148 attached to the backing plate 120. Relative movement between the outer portion 146 and the inner portion 148 results in a change of inductance (or capacitance) between the outer portion 146 and the inner portion 148. The inductance (or capacitance) can be measured to provide an indication of how far the outer portion 146 travels with respect to the inner portion 148. The outer portion 146 fits within a circular opening in the backing plate, and the outer portion 146 additionally serves as a guide for movement of the contactor assembly 42 relative to the backing plate 120.

The wafer chuck 130 forms part of the probing subassembly 16 illustrated in FIGS. 1 and 2. The wafer chuck 130 is mounted for movement in horizontal x- and y-directions and movement in a vertical z-direction to the prober base portion 26 of FIGS. 1 and 2.

Figure 8:
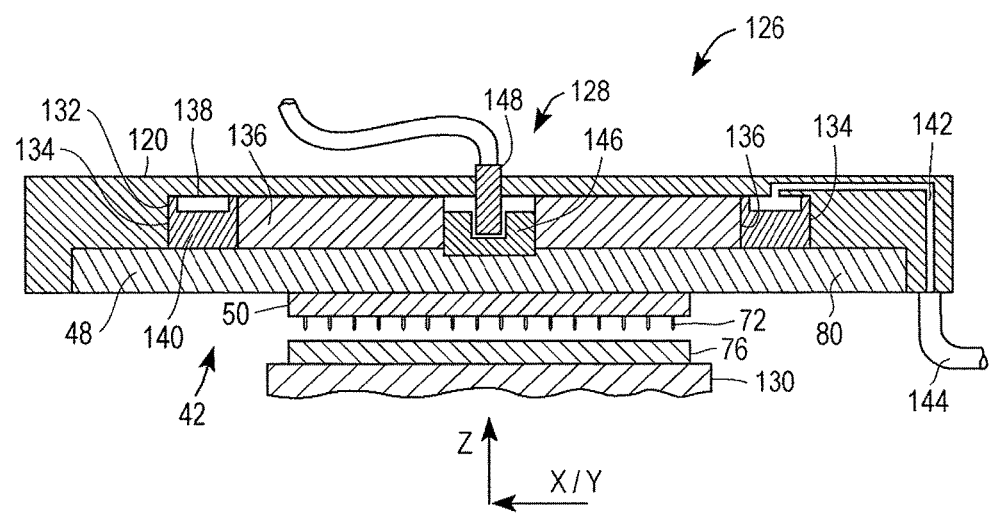
FIG. 8 is a view similar to FIG. 7, after the wafer chuck has moved the wafer into a position below terminals of the contactor assembly.

As illustrated in FIG. 8, the wafer chuck 130 with the wafer 76 thereon is moved in x- and y-directions until the wafer 76 is directly below the contactor board 50. The wafer chuck 130 is then moved vertically upwardly in a z-direction towards the contactor board 50. Each one of the terminals 72 is aligned with a respective one of the contacts on the wafer 76. The terminals 72, however, do not at this stage touch the contacts on the wafer 76.

Figure 9:
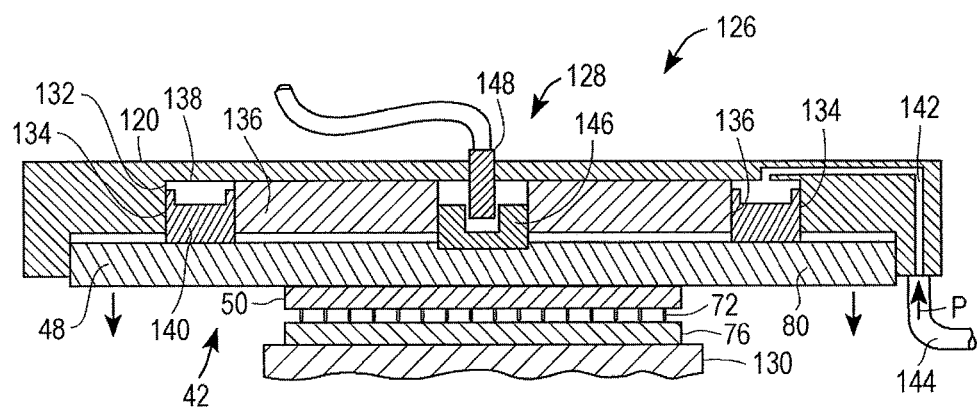
FIG. 9 is a view similar to FIG. 8, after the actuator mechanism is used to move the terminals into contact with contacts on the wafer.

As shown in FIG. 9, the actuator mechanism 126 is used to bring the terminals 72 into contact with the contacts on the wafer 76. Pressurized air is provided though the fluid line 144 and the fluid passage 142 into a volume defined by the surfaces 134 and 138 of the cylinder 132, an outer surface of the fixed ring-shaped piston 136, and an upper surface of the piston 140. The pressurized air acts on the upper surface of the piston 140 so that the piston 140 is moved downward relative to the backing plate 120. The piston 140 also moves the contactor assembly 42 downward until the terminals 72 come into contact with the contacts on the wafer 76. The terminals 72 are resiliently depressible against spring forces of the pins that they form part of. The spring forces jointly serve to counteract a force created by the pressure on the piston 140.

Figure 10:
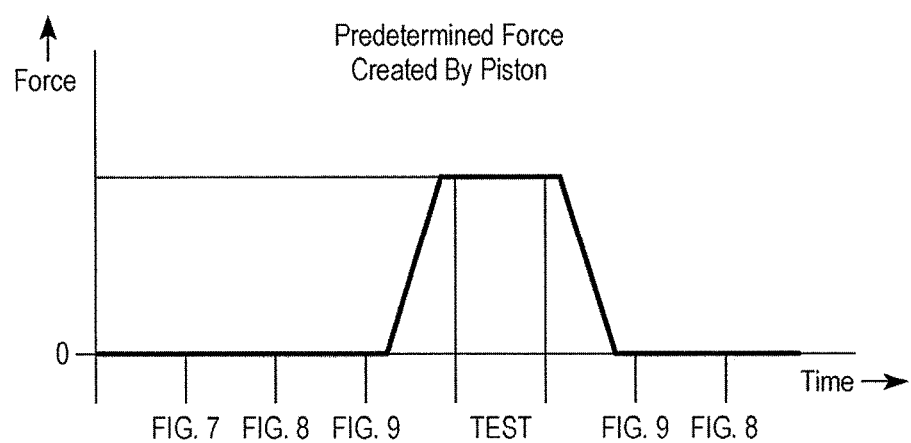
FIG. 10 is a time chart illustrating a force that is created by a piston of the actuator mechanism.

FIG. 10 shows the force that is created by the piston 140. No force acts on the terminals in FIGS. 7 and 8. In FIG. 9, the force is increased from zero to a predetermined force. This predetermined force can be calculated by multiplying the pressure and the area of the upper surface of the piston 140. The forces created by the terminals 72 are highly controllable because the pressure is highly controllable. The predetermined maximum force can easily be modified from one application to another. When the forces are applied by the terminals 72, electric signals, power, and ground are provided through the terminals 72 to and from the wafer 76. Integrated circuits on the wafer 76 are thereby tested. Once testing is completed, the pressure is relieved so that the forces exercised by the terminals 72 are again reduced to zero. A negative pressure is then applied, which moves the contactor assembly 42 away from the wafer 76 into the position shown in FIG. 8. The wafer 76 is then removed by the wafer chuck 130 and the wafer 76 is replaced with another wafer on the wafer chuck 130.

It will be appreciated that the order and speed of moving the wafer chuck 130 relative to the contactor board 50 actuating the actuator mechanism 126 to bring the terminals 72 into contact with the contacts of the wafer 76 can be varied. Differing contact algorithms can be used to move the wafer chuck 130 and actuate the actuator mechanism 126 to achieve optimal contact (e.g., good electrical contact, least pad damage, etc.) for different types of wafers.

The travel sensor 128 allows the pressure of the piston 140 to be set so that the piston 140 is roughly in the middle of its stroke when it contacts the wafer 76. Wafers having differing contactor technologies and/or numbers of contact points may be used with the apparatus 10. Different contact technologies often require a different force per pin to ensure wafer contact, and may also have different contactor heights. A different total force may be required to be applied to the contactor to make good contact with the wafer 76. The travel sensor 128 can be used to measure the distance the piston 140 has extended the contactor toward the wafer 76 under test. Thus, wafers having these varying types of contactors can be tested using the same apparatus 10.

Figure 11:
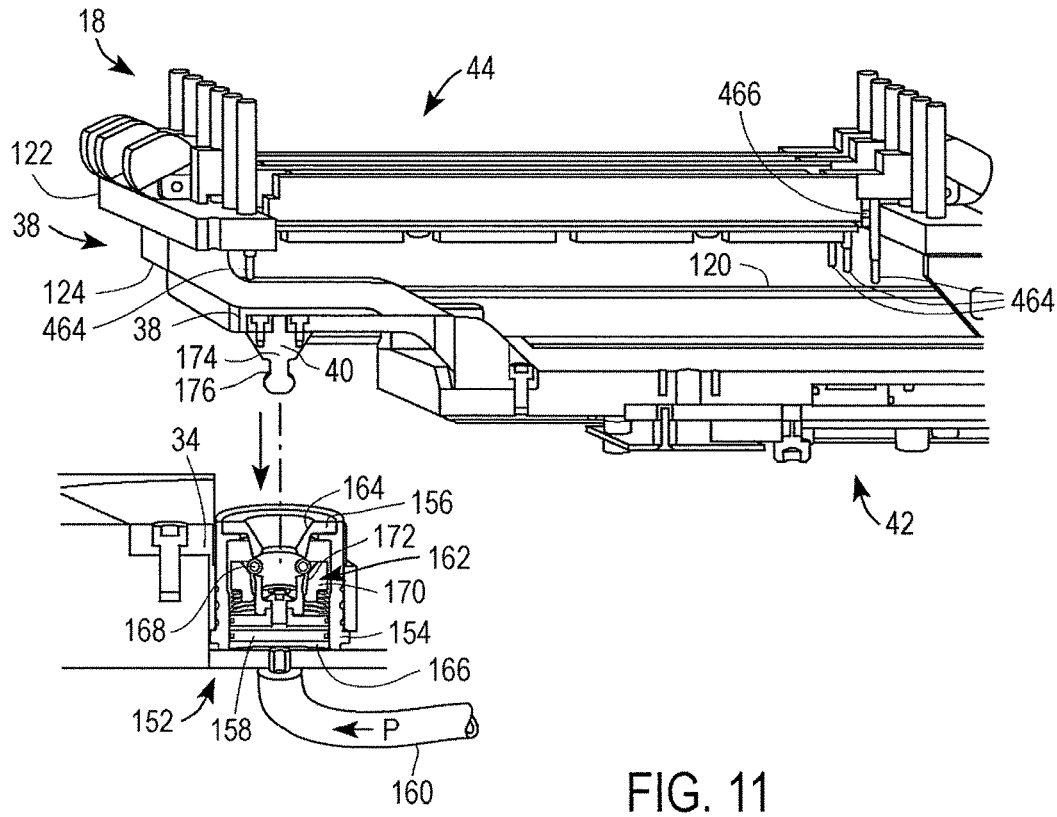
FIG. 11 is a cross-sectional side view, particularly illustrating one alignment and locking formation of the cartridge of FIG. 3 and one alignment and locking mechanism secured to an upper portion of a base of a frame of the apparatus shown in FIGS. 1 and 2.

FIG. 11 illustrates an alignment and locking mechanism 152 mounted to the upper portion 34 of the frame 12 in FIGS. 1 and 2, and one of the alignment pins 40 mounted to the cartridge frame 38.

The alignment and locking mechanism 152 includes an outer sleeve 154, an alignment piece 156, a piston 158, a fluid line 160, and a locking actuator 162.

The alignment piece 156 has an alignment opening 164 formed therein. The alignment opening 164 has a conical shape so that an upper horizontal cross-section thereof is larger than a lower cross-section thereof. The alignment piece 156 is mounted to an upper end of the outer sleeve 154 and extends downwardly into the outer sleeve 154.

The piston 158 is located within a lower portion of the outer sleeve 154 and can slide up and down within the outer sleeve 154. A cavity 166 is defined within the outer sleeve 154 and by a lower surface of the piston 158. The fluid line 160 is connected to the cavity 166. Positive and negative pressure can be provided through the fluid line 160 to the cavity 166. Positive pressure causes upward movement of the piston 158, and negative pressure causes the piston 158 to move down.

The locking actuator 162 has a plurality of spherical locking members 168 and a locking actuator 170. The locking actuator 170 is mounted to the piston 158 so that it can move vertically up and down together with the piston 158. The locking actuator 170 has an internal surface 172 that makes contact with the spherical locking members 168. The surface 172 is conical so that movement of the locking actuator 170 between raised and lowered positions causes corresponding movement of the spherical locking members 168 toward and away from one another.

The alignment pin 40 includes a positioning pin 174 with a recessed formation 176 formed at a location distant from an end of the positioning pin 174. The cartridge frame 38 is moved so that the positioning pin 174 is roughly located over the alignment opening 164. When the cartridge frame 38 is lowered into the position shown in FIG. 11, an end of the slightly misaligned positioning pin 174 can slide on a surface of the alignment opening 164 so that a center line of the positioning pin 174 moves towards a center line of the alignment opening 164. The piston 158 and the locking actuator 162 are in a lowered position to allow for movement of a larger end of the positioning pin 174 through an opening defined by the spherical locking members 168.

Figure 12:
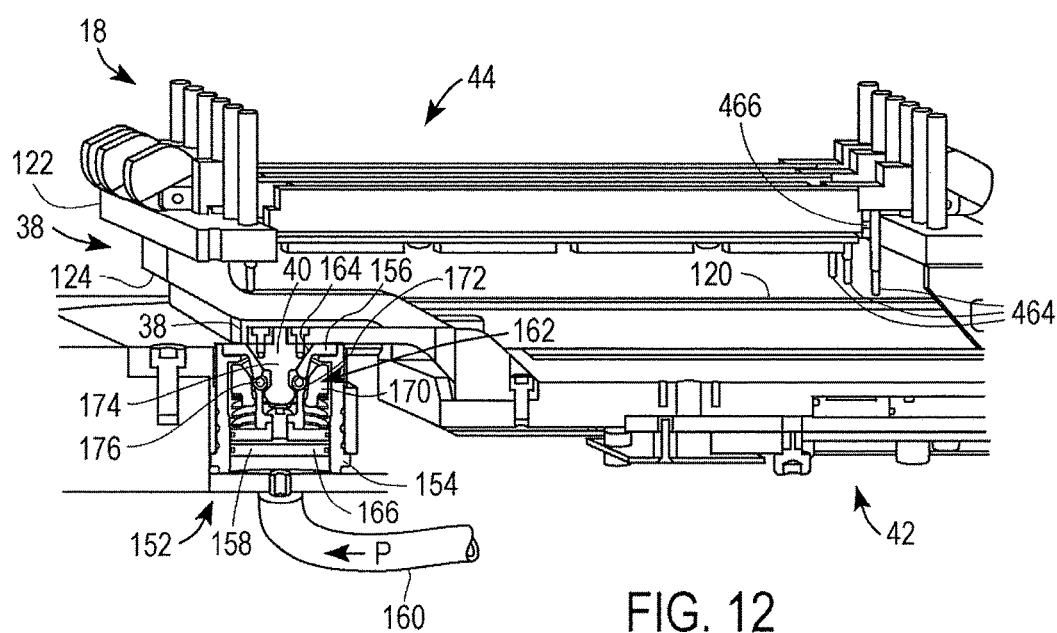
FIG. 12 is a view similar to FIG. 11, after the alignment and locking mechanism is used to align the formation, and the formation is removably engaged with the alignment and locking mechanism.

FIG. 12 illustrates the components of FIG. 11 after the alignment pin 40 is lowered all the way and engaged with the alignment and locking mechanism 152. A conical surface on the alignment pin 40 contacts the conical surface of the alignment opening 164, thereby further promoting correct alignment of the center lines of the positioning pin 174 and the alignment opening 164. The recessed formation 176 on the positioning pin 174 is now at the same elevation as the spherical locking members 168. The piston 158 and the locking actuator 170 are elevated so that the spherical locking members 168 engage with the recessed formation 176. The positioning pin 174 is thereby engaged with the spherical locking members 168 of the alignment and locking mechanism 152.

The positioning pin 174 can be released from the alignment and locking mechanism 152 by first lowering the piston 158 so that the spherical locking members 168 disengage from the recessed formation 176, and then lifting the cartridge frame 38 together with the positioning pin 174 out of the alignment opening 164. It may from time to time be required that a cartridge 18 be temporarily removed for purposes of maintenance or reconfiguration, or be replaced with another cartridge. The alignment pin 40 and the alignment and locking mechanism 152 allow for quick removal and replacement of cartridges.

FIG. 3 illustrates one and a piece of the alignment pins 40. Only a piece of the cartridge 18 is illustrated in FIG. 3, and the entire cartridge is in fact symmetrical about the section through one of the alignment pins 40. The other piece of the sectioned alignment pin and another one of the alignment pins are not shown. There are thus a total of three of the alignment pins 40 respectively at corners of a triangle. Each one of the alignment pins 40 engages with a corresponding alignment and locking mechanism 152. The three alignment and locking mechanisms 152 are all simultaneously and remotely actuable from a common pressure source connected to corresponding fluid lines 160, to cause simultaneous engagement or disengagement of all three locking alignment pins 40.

As previously mentioned with reference to FIGS. 1 and 2, the test head 20 can be moved to the position shown in FIG. 2 for purposes of maintenance to the cartridge 18. The cartridge 18 can also be replaced, as discussed with reference to FIGS. 11 and 12. Following maintenance and/or replacement of the cartridge 18, the test head 20 is pivoted onto the cartridge into the position shown in FIG. 1.

Figure 13:
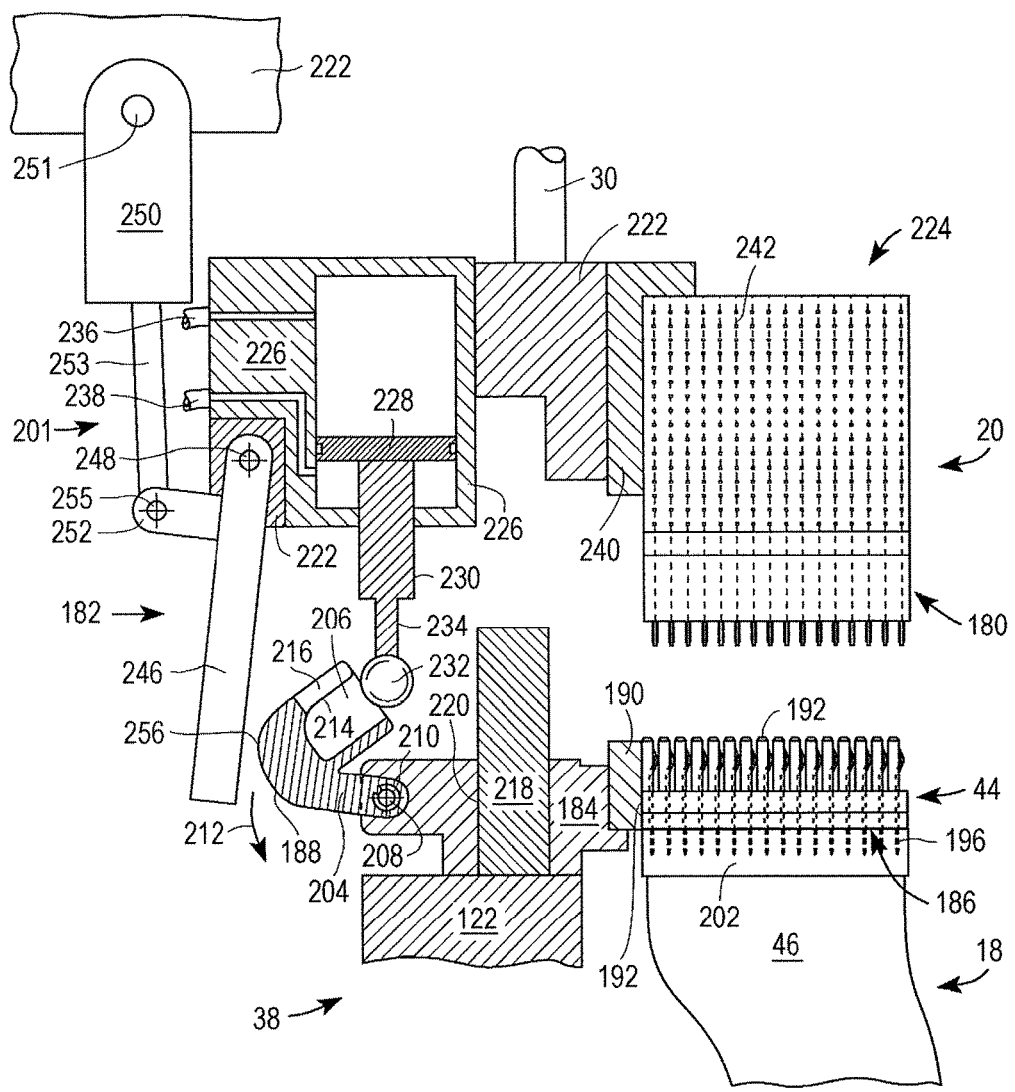
FIG. 13 is a cross-sectional side view, particularly illustrating one first connector set of the cartridge of FIG. 3, one second connector set secured to a hinge portion of the frame of the apparatus of FIGS. 1 and 2.

FIG. 13 illustrates portions of the test head and cartridge 18 after the test head 20 is moved down onto the cartridge 18, i.e., from the position shown in FIG. 2 into the position shown in FIG. 1. The test head 20 has a second connector set 180 and an engager 182 mounted to the test head frame portion 30 of the frame 12 of FIG. 1. The second connector set 180 is initially disengaged from one of the first connector sets 44 of the cartridge 18.

The first connector set 44 includes a connector block support piece 184, a first connector module 186, and a first engagement component 188.

Figure 14:
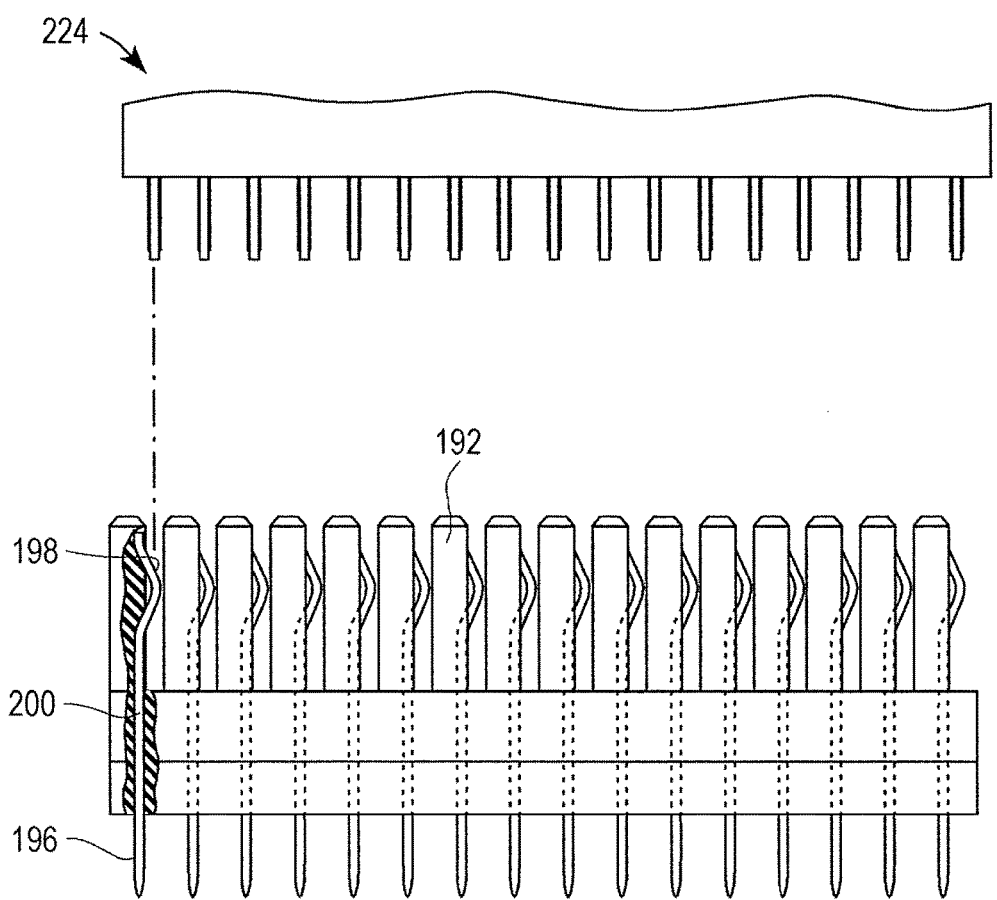
FIG. 14 is a partially cross-sectioned side view, illustrating a first connector module forming part of the first connector set of FIG. 13.

The first connector module 186 includes a first connector block 190 and a plurality of septa 192. The septa 192 are held in a side-by-side relationship by the first connector block 190. FIG. 14 illustrates one of the septa 192 in more detail. A plurality of conductors is formed behind one another into the paper against each septum 192. Each conductor includes a terminal 196 at a lower edge of the septum 192, a contact 198 at an upper edge of the septum 192, and an electrically conductive lead 200 interconnecting the terminal 196 with the contact 198.

Referring again to FIG. 13, a number of the flexible attachments 46 are attached through respective connectors 202 to the terminals 196 of FIG. 14. The septa 192 provide for a dense arrangement of the terminals 196 and contacts 198 held by the first connector block 190.

The first connector module 186 is inserted into the connector block support piece 184 with the first connector block 190 contacting an inner portion of the connector block support piece 184. The first connector module 186 is then secured to the connector block support piece 184 by releasable means so as to again allow for removal of the first connector module 186 from the connector block support piece 184.

The first engagement component 188 has inner and outer portions 204 and 206 respectively. The inner portion 204 is mounted to an outer portion of the connector block support piece 184 for pivotal movement about a horizontal axis 208. A spring 210 biases the first engagement component 188 in a counterclockwise direction 212. The outer portion 206 has a spherical inner engagement surface 214 and a groove 216 as formed into the engagement surface 214.

A slider pin 218 is secured to and extends vertically upwardly from one of the upper support pieces 122 of the cartridge frame 38. A complementary slider opening 220 is formed vertically through the connector block support piece 184. The slider opening 220 is positioned over the slider pin 218, and the first connector set 44 is moved down until the connector block support piece 184 rests on the upper support piece 122. The first connector set 44 is thereby held by the slider pin 218 of the cartridge frame 38 and prevented from movement in horizontal x- and y-directions. The first connector set 44 can still be removed from the cartridge frame 38 by lifting the first connector set 44 out of the slider pin 218, for purposes of maintenance or reconfiguration.

The second connector set 180 includes a subframe 222, a second connector module 224, a cylinder 226, a piston 228, a rod 230, a spherical engager 232, a connecting piece 234, and first and second supply lines 236 and 238, respectively.

The subframe 222 is mounted to the test head frame portion 30. The second connector set 180 is mounted through the subframe 222 to the test head frame portion 30. The second connector set 180 has a second connector block 240 and a plurality of printed circuit boards 242 mounted in a side-by-side relationship to the second connector block 240. Each one of the printed circuit boards 242 has a respective substrate, terminals on a lower edge of the substrate, contacts at an upper edge of the substrate, and electrically conductive traces, each connecting a respective terminal with a respective contact. The second connector block 240 is releasably held within the subframe 222 and secured to the subframe 222 with releasable means.

The cylinder 226 is secured to the subframe 222. The piston 228 is located within the cylinder 226 and is movable in vertically upward and downward directions within the cylinder 226. First and second cavities are defined within the cylinder 226 respectively above and below the piston 228, and the first and second supply lines 236 and 238 are connected to the first and second cavities, respectively.

An upper end of the rod 230 is secured to a piston 228. The rod 230 extends downwardly from the piston 228 through an opening in a base of the cylinder 226. The spherical engager 232 is secured via the connecting piece 234 to a lower end of the rod 230. The connecting piece 234 has a smaller diameter than either the rod 230 or the spherical engager 232.

The engager 182 includes a plate 246 that is mounted to the subframe 222 for pivotal movement about a horizontal axis 248, an actuator assembly 201, and a link mechanism 252 connecting the plate 246 to the actuator assembly 201. The actuator assembly 201 includes an actuator 250, a connecting rod 253, an actuator pivot 251, and a rod pivot 255.

As previously mentioned, the second connector set 180 is initially disengaged from the first connector set 44. The second connector module 224 is thus disengaged from the first connector module 186, and the spherical engager 232 is also disengaged from the first engagement component 188. Pressurized air is provided through the first supply line 236 while air is vented from the second supply line 238, so that the piston 228 moves in a downward direction within the cylinder 226. Downward movement of the piston 228 extends the rod 230 further out of the cylinder 226 and moves the spherical engager 232 closer to the cartridge 18.

Figure 15:
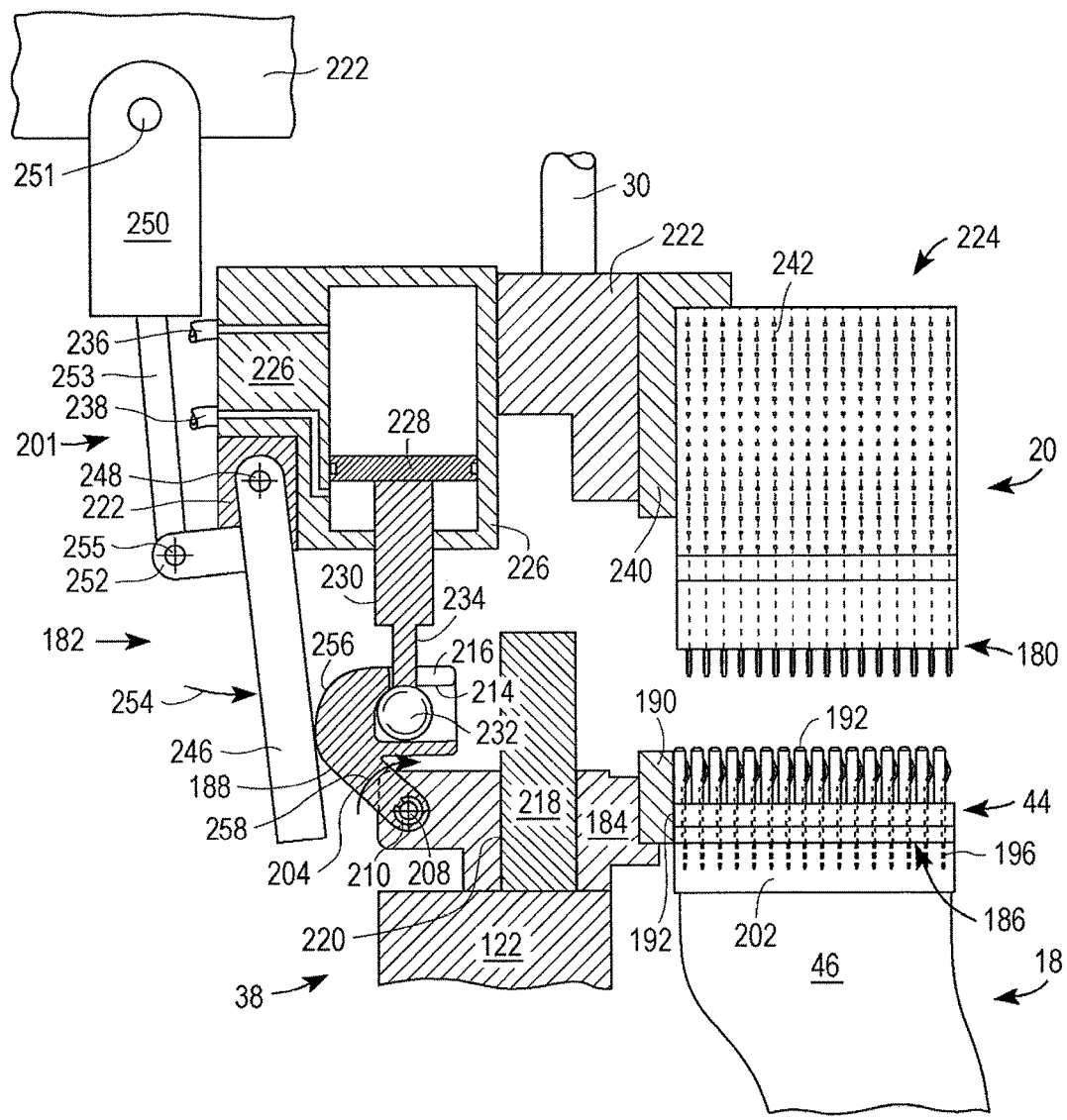
FIG. 15 is a view similar to FIG. 13, after an engager is used to rotate a spherical inner engagement surface of a first engagement component forming part of the first connector set over a spherical engager forming part of a second connector set.

As illustrated in FIG. 15, the actuator assembly 201 is operated so that the link mechanism 252 moves the plate 246 in a counterclockwise direction 254. The plate 246 comes into contact with an outer surface 256 of the first engagement component 188. Further movement of the plate 246 rotates the first engagement component 188 in a clockwise direction 258 and in a camming action. A fork defined by the groove 216 moves over the connecting piece 234, and the engagement surface 214 moves into a position over at the spherical engager 232.

Figure 16:
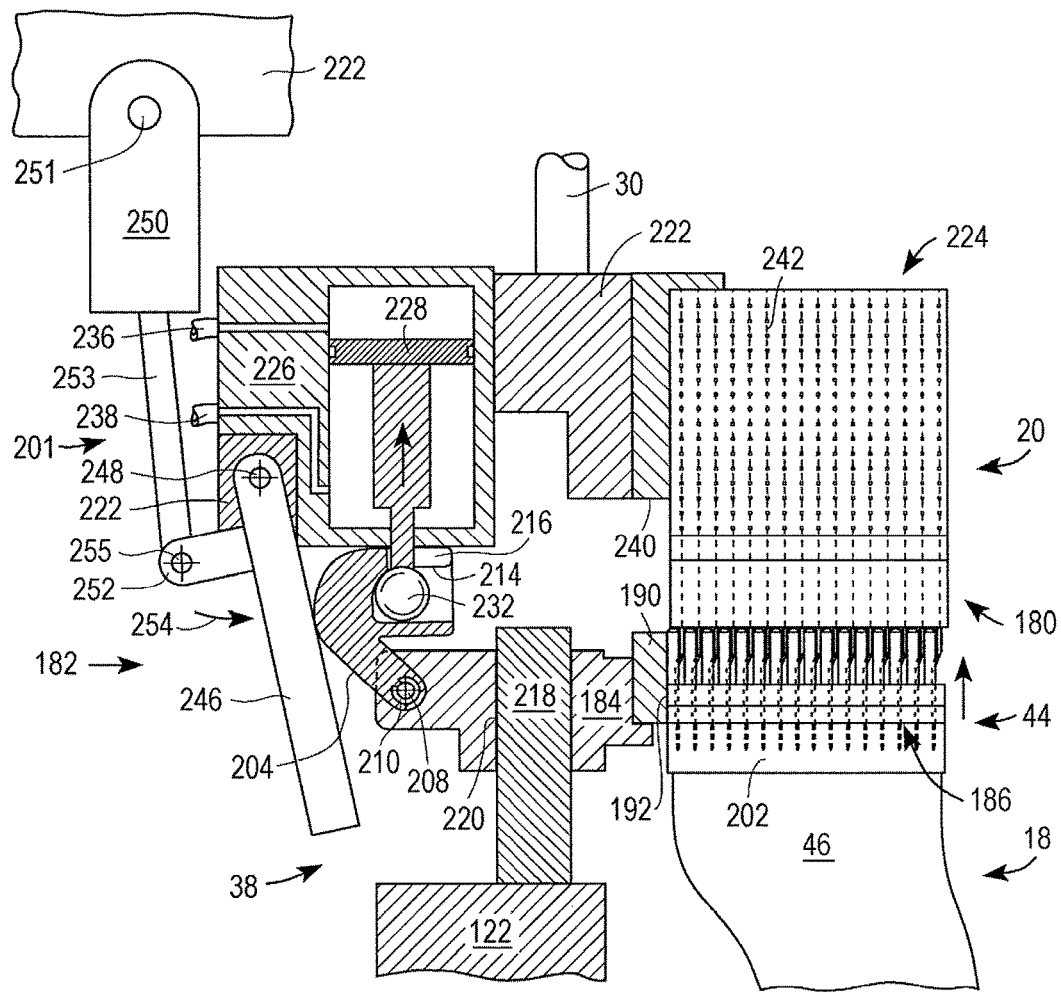
FIG. 16 is a view similar to FIG. 15, after engagement of the first connector set with the second connector set.

As illustrated in FIG. 16, pressurized air is provided through the second supply line 238, and air is vented through the first supply line 236 so that the piston 228 moves in a vertically upward direction. The rod 230 retracts in an upward direction into the cylinder 226. An upper surface of the spherical engager 232 engages with the engagement surface 214 and moves the first engagement component 188 towards the cylinder 226. The first connector set 44 lifts off the upper support piece 122 of the cartridge frame 38, and the connector block support piece 184 slides up the slider pin 218.

The pressurized air provided through the second supply line 238 also creates a force that is sufficiently large to overcome an insertion force required to mate the first connector module 186 with the second connector module 224. Each one of the septa 192 enters into a gap between two of the printed circuit boards 242. Gaps between the contacts 198 on the septa 192 and the gaps between the printed circuit boards 242 are sufficiently small so that an interference fit is required to insert the septa 192 between the printed circuit boards 242. Once the insertion force is overcome and the septa 192 are located between the printed circuit boards 242, each one of the contacts 198 is located against a corresponding terminal on a lower edge of one of the printed circuit boards 242.

The pressurized air provided through the second supply line 238 can be removed after the first and second connector modules 186 and 224 are mated. The first and second connector modules 186 and 224 can be disengaged from one another by providing pressurized air through the first supply line 236 so that the first connector set 44 moves into the position as shown in FIG. 15. The actuator assembly 201 is then operated and the plate 246 moves into the position shown in FIG. 13. The spring 210 biases the first engagement component 188 in the counterclockwise direction 212 away from the spherical engager 232. The rod 230 is then typically again retracted into the cylinder 226.

Figure 17:
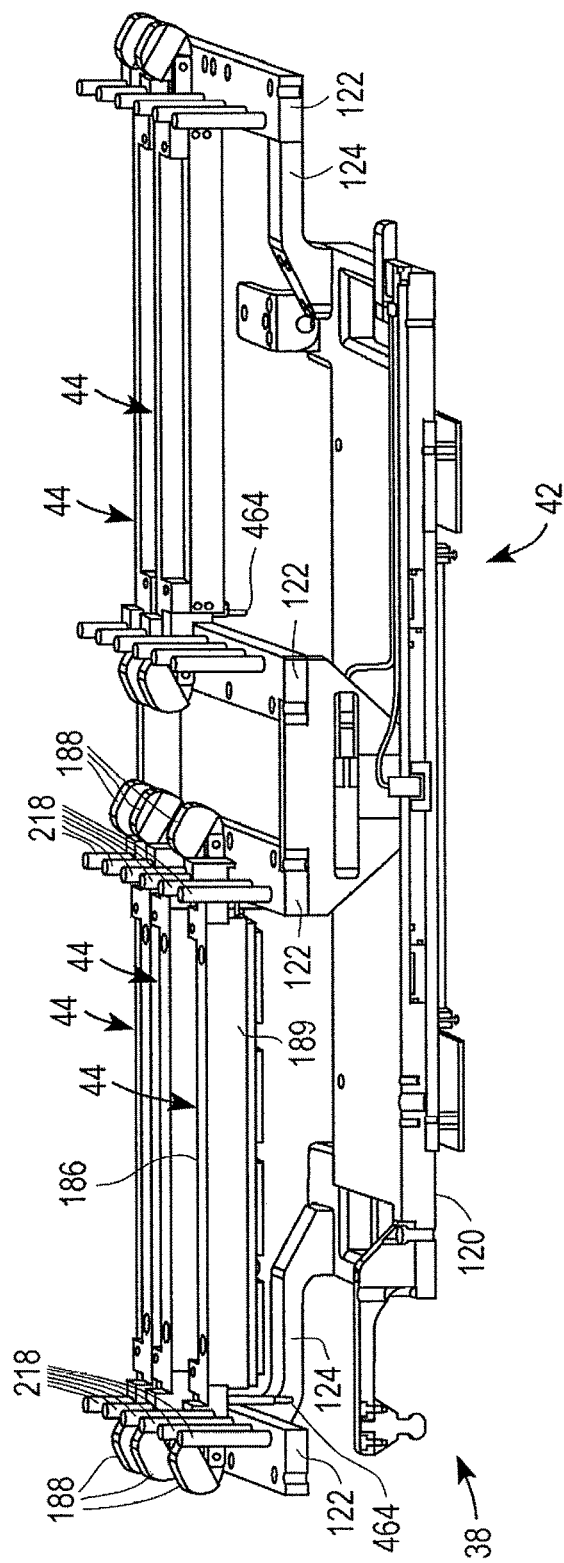
FIG. 17 is a perspective view of the cartridge of FIG. 3, specifically illustrating the layout and configuration of a plurality of first connector sets of FIG. 13.

As illustrated in FIG. 17, cartridge frame 38 has four of the upper support pieces 122, and a respective pair of the upper support pieces 122 carries a respective column of the first connector sets 44. The columns are located next to one another so that a respective pair of the first connector sets 44 is in a respective row. There can be a total of 16 rows in each of the two columns, thus potentially forming an array of 32 of the first connector sets 44.

Each one of the first connector sets 44 is symmetrical on the left and the right. The connector block support piece 184 entirely surrounds the first connector module 186, and two slider openings (220 in FIG. 13) are provided at opposing ends of the connector block support piece 184. Slider pins 218 are provided on all four of the upper support pieces 122, and each respective connector block support piece 184 has two slider openings 220 respectively located over two of the slider pins 218.

Figure 18:
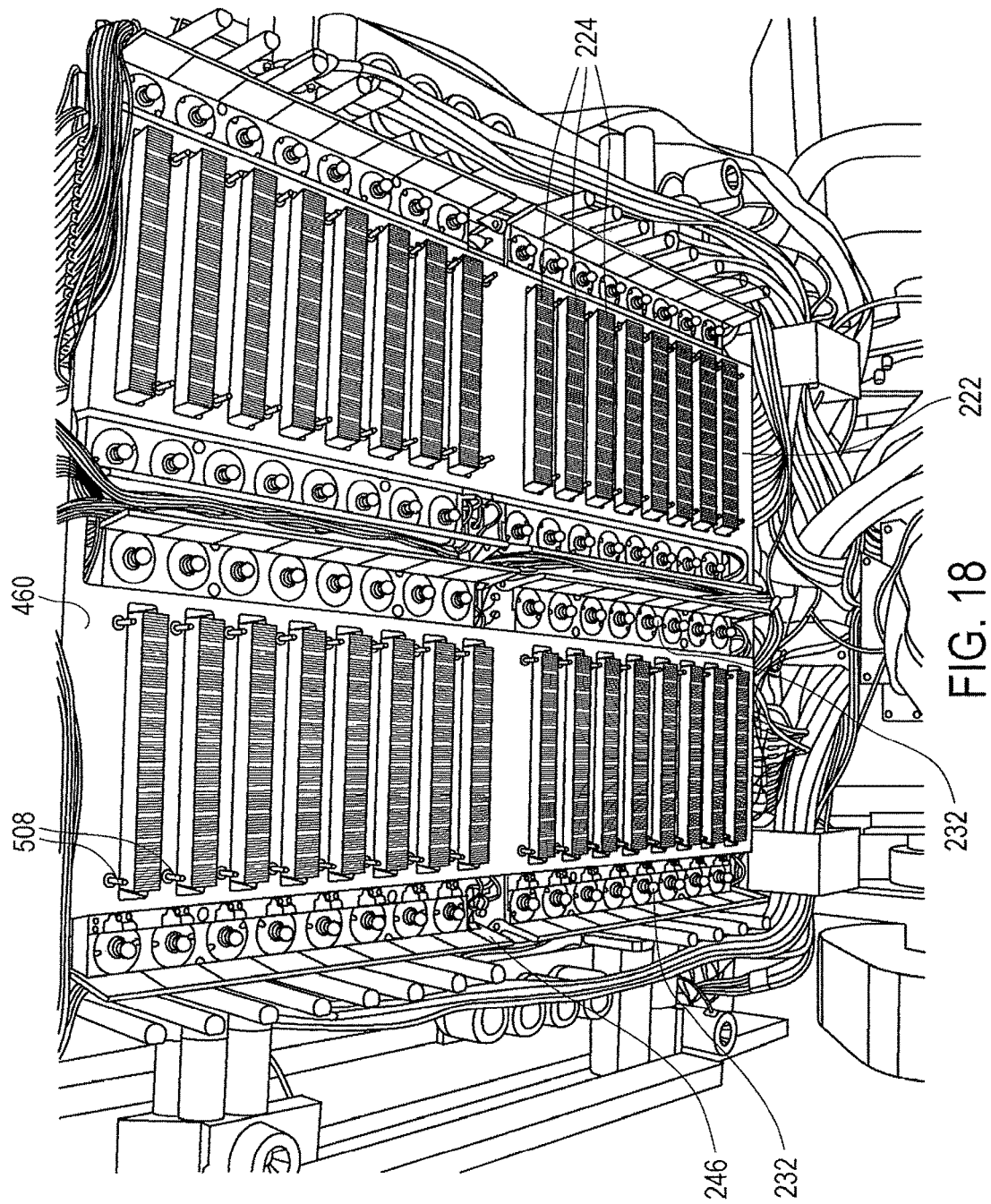
FIG. 18 is a perspective view from below, illustrating a layout of a plurality of second connector sets of FIG. 13.

As shown in FIG. 18, an array of second connector modules 224 is provided, matching the array of first connector modules 186 of FIG. 17. Two spherical engagers 232 are located on opposing sides of each one of the second connector modules 224. In use, a respective pair of spherical engagers 232 is used to engage one of the first connector modules 186 with one of the second connector modules 224, independently of the other connector modules. One of the first connector modules 186 is engaged with one of the second connector modules 224, whereafter another one of the first connector modules 186 is engaged with another one of the second connector modules 224, etc. By staggering the engagement of a respective first connector module 186 with a respective second connector module 224, forces on the subframe 222 and other pieces of the frame 12 of FIG. 1 can be kept within their design parameters.

Each one of the plates 246 is located adjacent a plurality of the spherical engagers 232. Movement of a respective one of the plates 246 causes the respective plate 246 to contact and simultaneously pivot a plurality of the first engagement components 188 of FIG. 13 over a plurality of respective ones of the spherical engagers 232.

Figure 19:
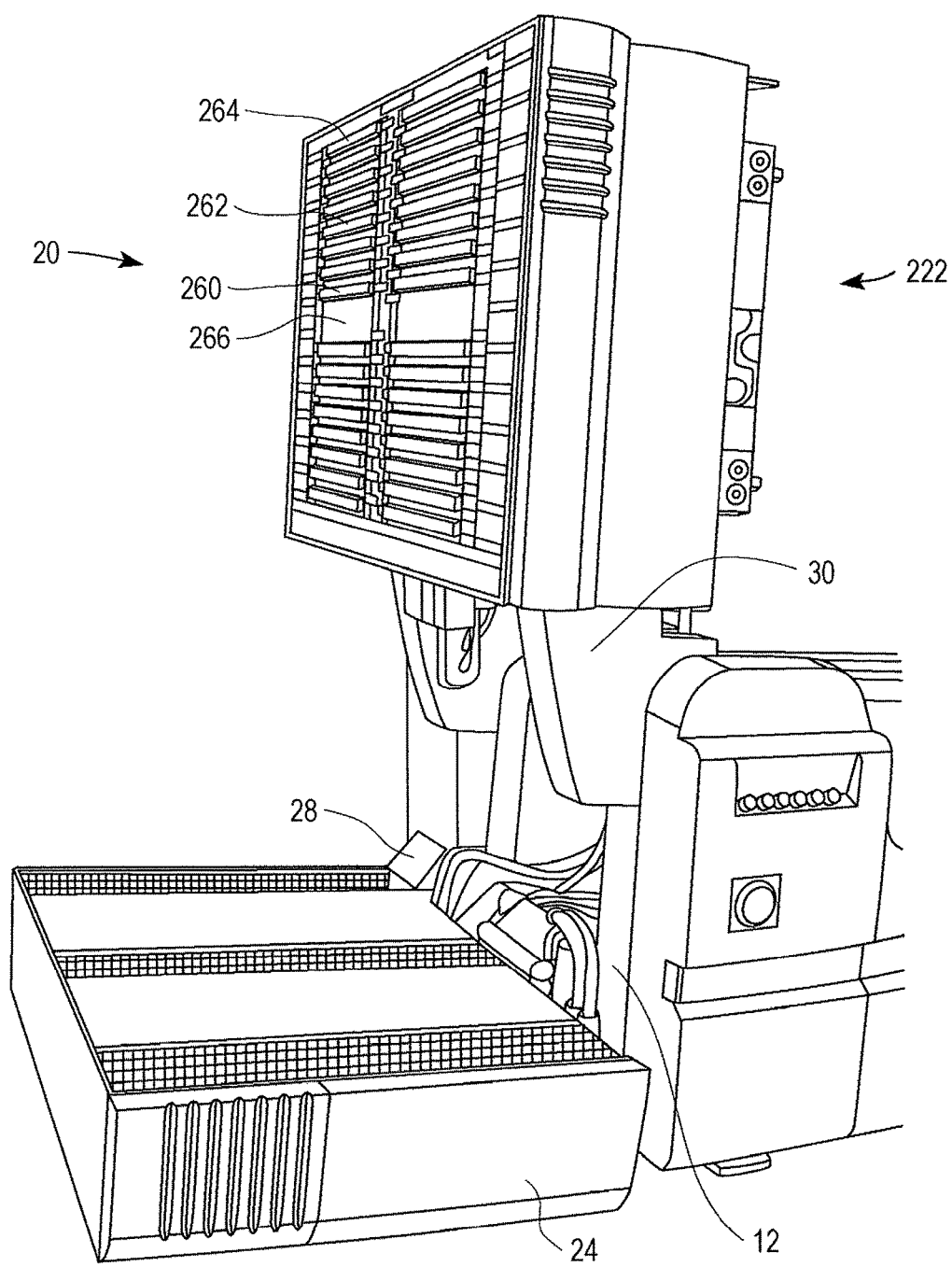
FIG. 19 is a perspective view of a portion of the apparatus shown in FIG. 2, wherein the thermal system frame portion is rotated approximately 135 degrees counterclockwise, and a test head frame portion is rotated approximately 90 degrees to the right.

Referring to FIGS. 18 and 19 in combination, each one of the second connector modules 224 is mounted to respective pattern generator, driver, and power boards, 260, 262, and 264 respectively, each residing in a respective slot of a base structure 266. As specifically shown in FIG. 19, access can be gained to the boards 260, 262, and 264 by rotating the thermal system frame portion 28 together with the test head frame portion 30 an additional 135 degrees counterclockwise to the left when compared to FIG. 2, and then rotating the test head frame portion 30 relative to the thermal system frame portion 28 90 degrees clockwise to the right. The thermal system 24 is then positioned on the ground and the test head 20 in a vertical orientation. The boards 260, 262, and 264 are all accessible from the left within the test head 20 because the test head 20 and the thermal system 24 have been separated from one another. The boards 260, 262, and 264 that reside in the slots of the base structure 266 are then removable and replaceable, and other boards can be added for purposes of reconfiguration.

Figure 20:
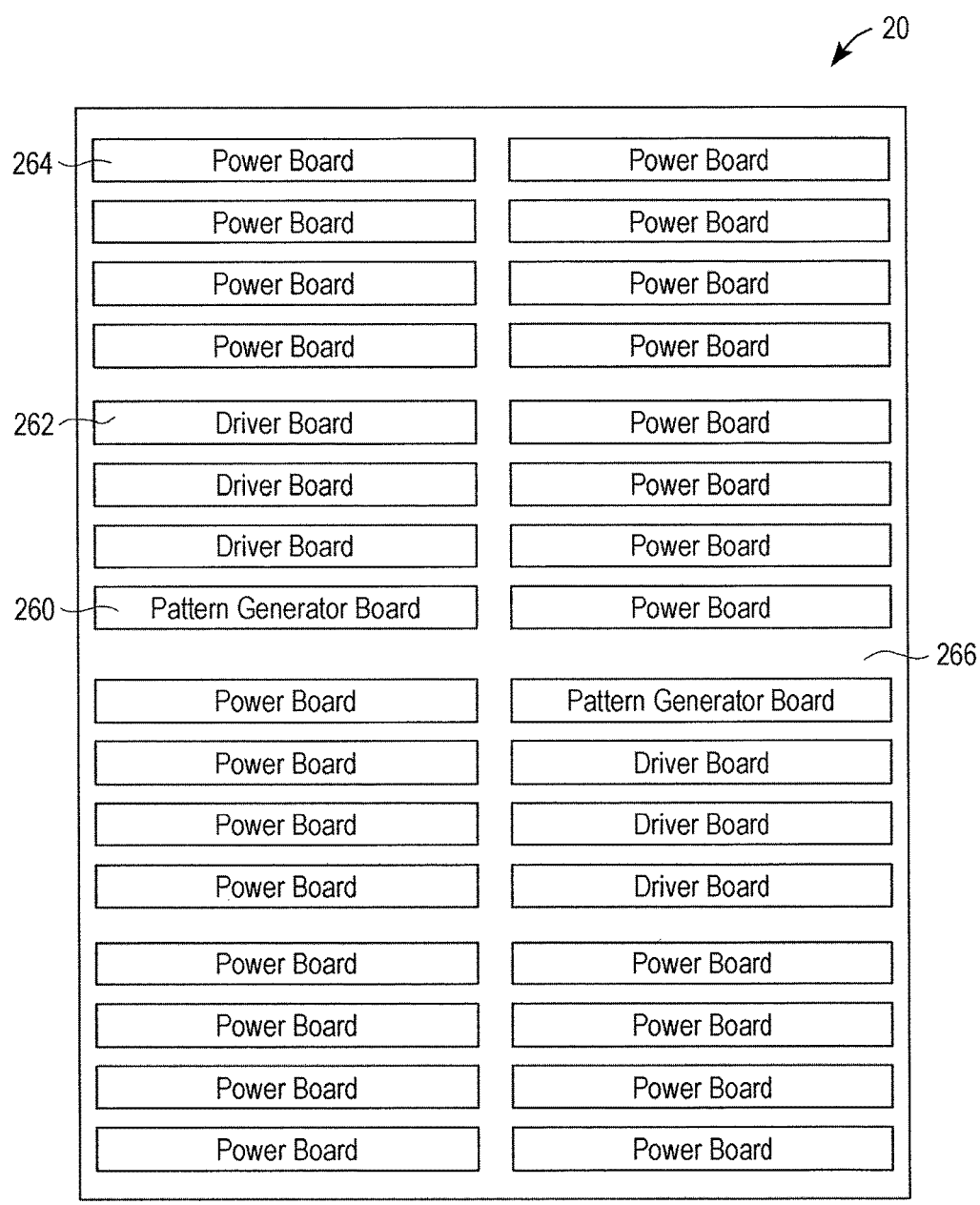
FIG. 20 is an end view, illustrating in block diagram form the layout of power, driver, and pattern generator boards when viewed from the left in FIG. 19.

Each one of the slots can only carry one particular type of board 260, 262, or 264. The base structure 266 is configurable so that slots are configurable to allow for more or fewer of a particular board, or to modify the locations of particular boards. Once the slots are inserted, they are typically not replaced over the life of the apparatus 10. The number of boards 260, 262, and 264 that are used can still be configured from one application to the next. FIG. 20 illustrates an example of a layout of slots in the test head 20. The particular layout of slots of FIG. 20 allows for the use of two pattern generator boards 260, one on the left and one on the right; six driver boards 262, three on the left and three on the right; and 24 power boards 264, twelve on the left and twelve on the right.

After the boards 260, 262, and 264 are inserted into the slots as discussed with reference to FIGS. 19 and 20, the apparatus is first moved into the configuration illustrated in FIG. 2 with the thermal system 24 above the test head 20, and then into the configuration illustrated in FIG. 1, with the components of the test head 20 electrically connected to the components of the cartridge 18 in FIG. 2.

Referring specifically to FIG. 1, what should be noted is that the thermal system 24 does not rest on the test head 20. Any vibrations caused by components of the thermal system 24 can thus not be directly transferred to the test head 20. The test head 20 and the thermal system 24 are held in the relative orientation shown in FIG. 1, with the thermal system 24 above the test head 20 by the thermal system frame portion 28 and the test head frame portion 30, respectively, of the frame 12. The frame 12 is relatively heavy and has a rigid construction, and effectively dampens any vibrations created by components of the thermal system 24. The vibrations substantially do not reach the components of the test head 20.

Figure 21:
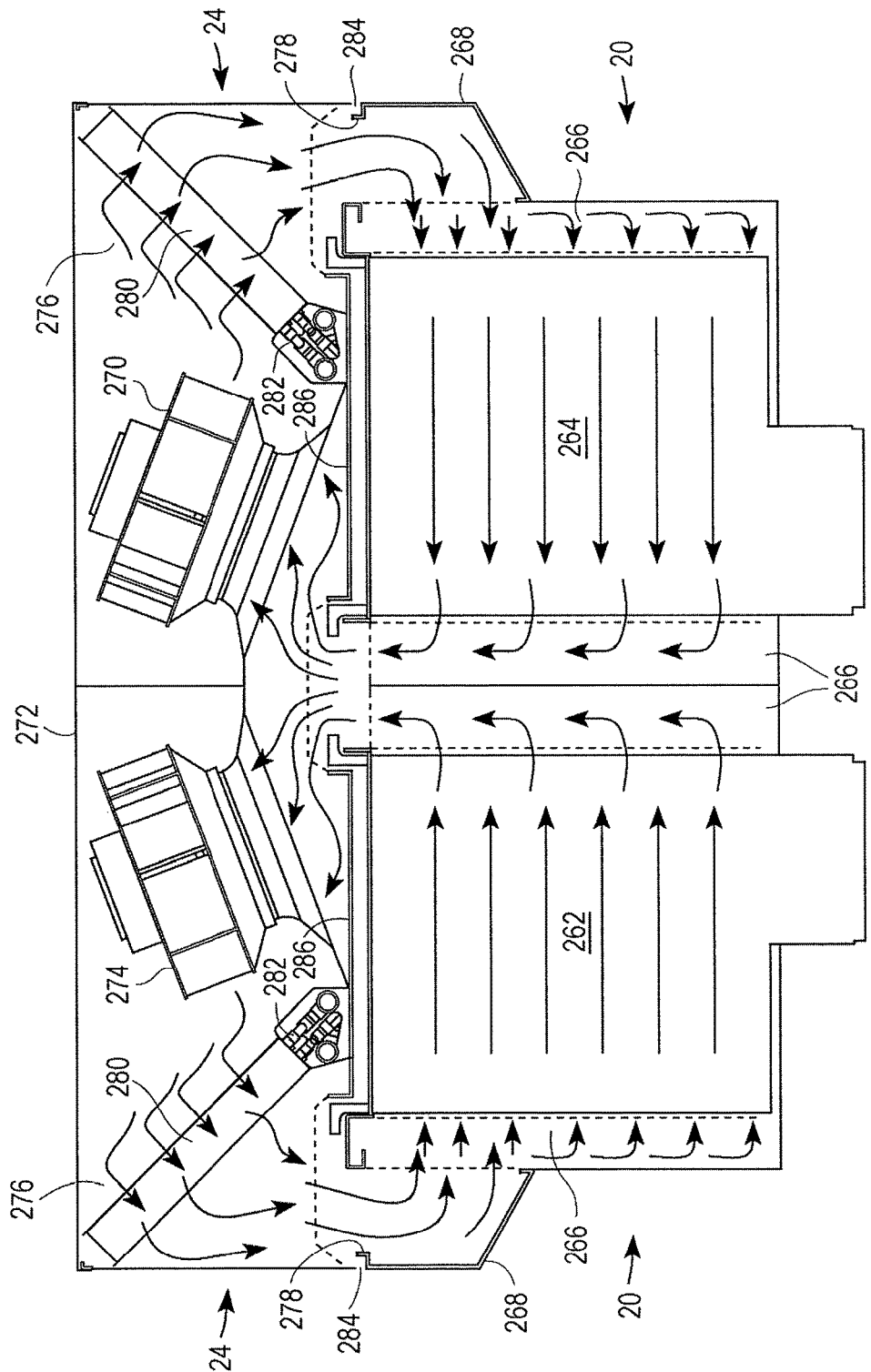
FIG. 21 is a cross-sectional side view parallel to two of the boards illustrated in FIG. 20, further illustrating a thermal system that is used to cool the boards.

FIG. 21 illustrates how the thermal system 24 cools components of the test head 20. FIG. 21 is a partial cross-sectional view parallel to a plane of one of the boards 260, 262, and 264 of FIG. 20, and shows one of the driver boards 262 and one of the power boards 264 inserted into their respective slots of the base structure 266 of the test head 20. The test head 20 further has two manifold panels 268 mounted on opposing sides and at upper portions of the base structure 266. The base structure 266 has openings between the slots that allow for air to flow from the manifold panels 268 inward to the boards 262 and 264, and then from the boards 262 and 264 to an upper end exhaust 270.

The thermal system 24 includes an outer shell 272, four recirculation fans 274 (only two of the recirculation fans 274 are shown in FIG. 21; the other two recirculation fans are located behind the recirculation fans 274 that are shown in FIG. 21), and two heat exchangers 276. The air leaving the upper end exhaust 270 is sucked through the recirculation fans 274 into the outer shell 272. Recirculation fans 274 then force the air through the heat exchangers 276, whereafter the air enters through upper end inlets 278 defined by the manifold panels 268. By recirculating the air, heat convects from the boards 262 and 264 to the heat exchangers 276. As is commonly known, each heat exchanger 276 includes a plurality of fins 280 and tubing 282 connecting the fins 280 to one another. A cooling fluid such as liquid water is pumped through the tubing 282. The heat convects to the fins 280. The heat conducts from the fins 280 to the tubing 282. The heat then convects from the tubing 282 to the water and is pumped away.

What should be noted is that there is no physical contact between any components of the thermal system 24 and any components of the test head 20. Only a small gap 284 is defined between the outer shell 272 and the manifold panel 268. A seal is typically located in the gap 284, and is made of a compliant material so that any vibrations transferred by the recirculation fan 274 to the outer shell 272 do not transfer to the manifold panels 268. Guide panels 286 form part of the thermal system 24, and serve to prevent the air from entering the test head 20 before first passing through the recirculation fans 274 and the heat exchangers 276.

Figure 22:
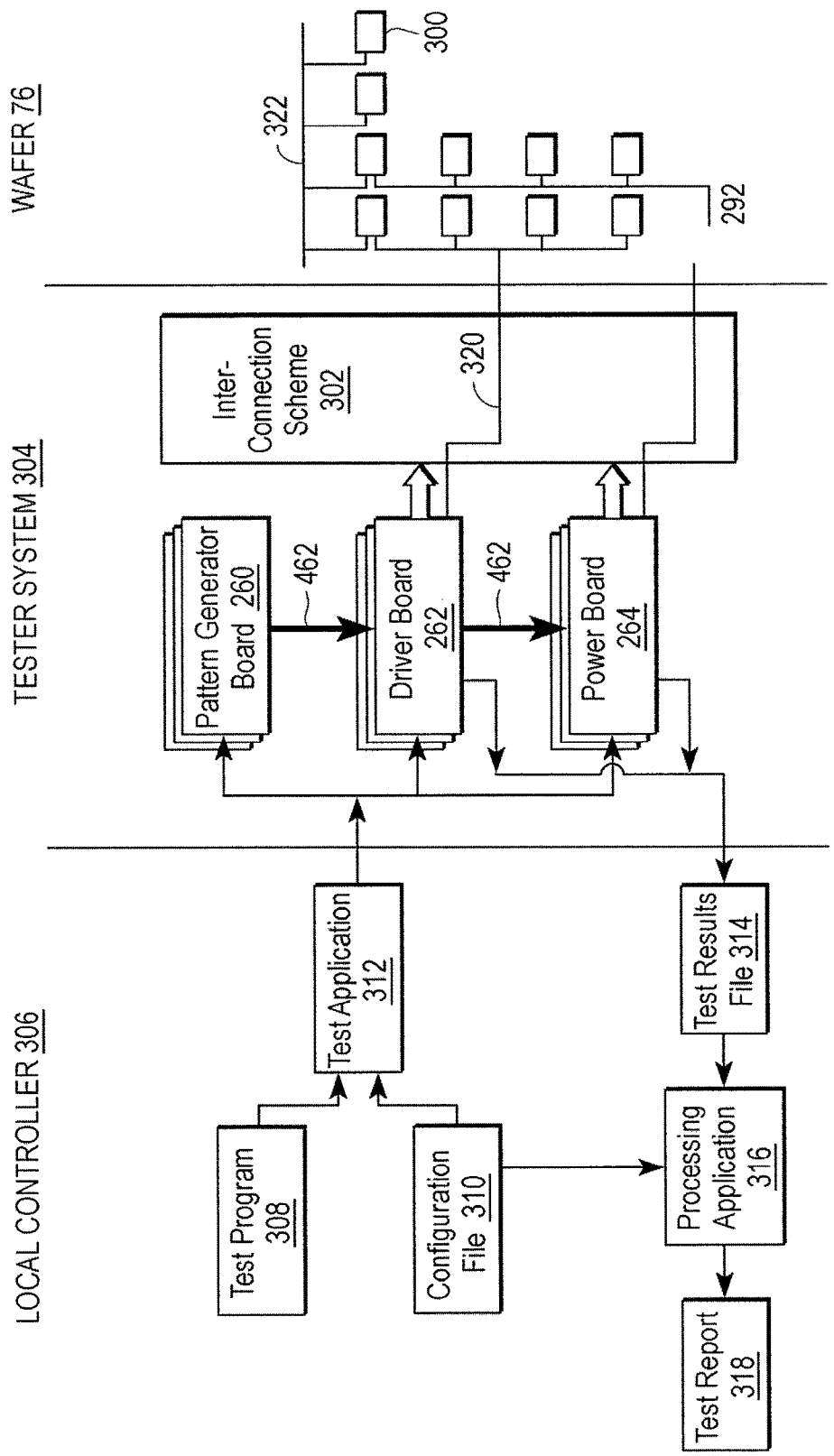
FIG. 22 is a block diagram of components of the apparatus of FIG. 1, further illustrating a computer system of the apparatus, the computer system holding a configuration file representing a configuration of a tester system of the apparatus.

FIG. 22 illustrates software and hardware components of the apparatus 10 of FIG. 1 that cooperate and that are matched to one another for fanning-out and fanning-in of electric signals, power, and ground. Zones are defined, wherein each zone includes one pattern generator board 260, one or more driver boards 262, and one or more power boards 264 connected to one another. Each board 260, 262, and 264 has a number of resources or channels. In particular, a driver board 262 has a number of input/output channels, and the power board 264 has a number of power channels. The number of boards 260, 262, and 264 and the way that they are connected to one another are configurable, depending on the requirements of integrated circuits of devices 300 and the layout of the devices 300 of the wafer 76.

An interconnection scheme 302 connects the driver and power boards 262 and 264 to contacts on the devices 300. The interconnection scheme 302 includes the electrical paths formed by conductors within the cartridge 18 of FIG. 3. The interconnection scheme 302 is also configurable, as will be appreciated from the foregoing description of the cartridge 18. The boards 260, 262, and 264 and the interconnection scheme 302 are hereinafter jointly referred to as a tester system 304.

A local controller 306 is used to provide test instructions to the tester system 304, and is then used to upload and process test results from the tester system 304. The local controller 306 has memory, and stored in the memory are a test program 308, a configuration file 310, a test application 312, a test results file 314, a processing application 316, and a test report 318.

Figure 23:
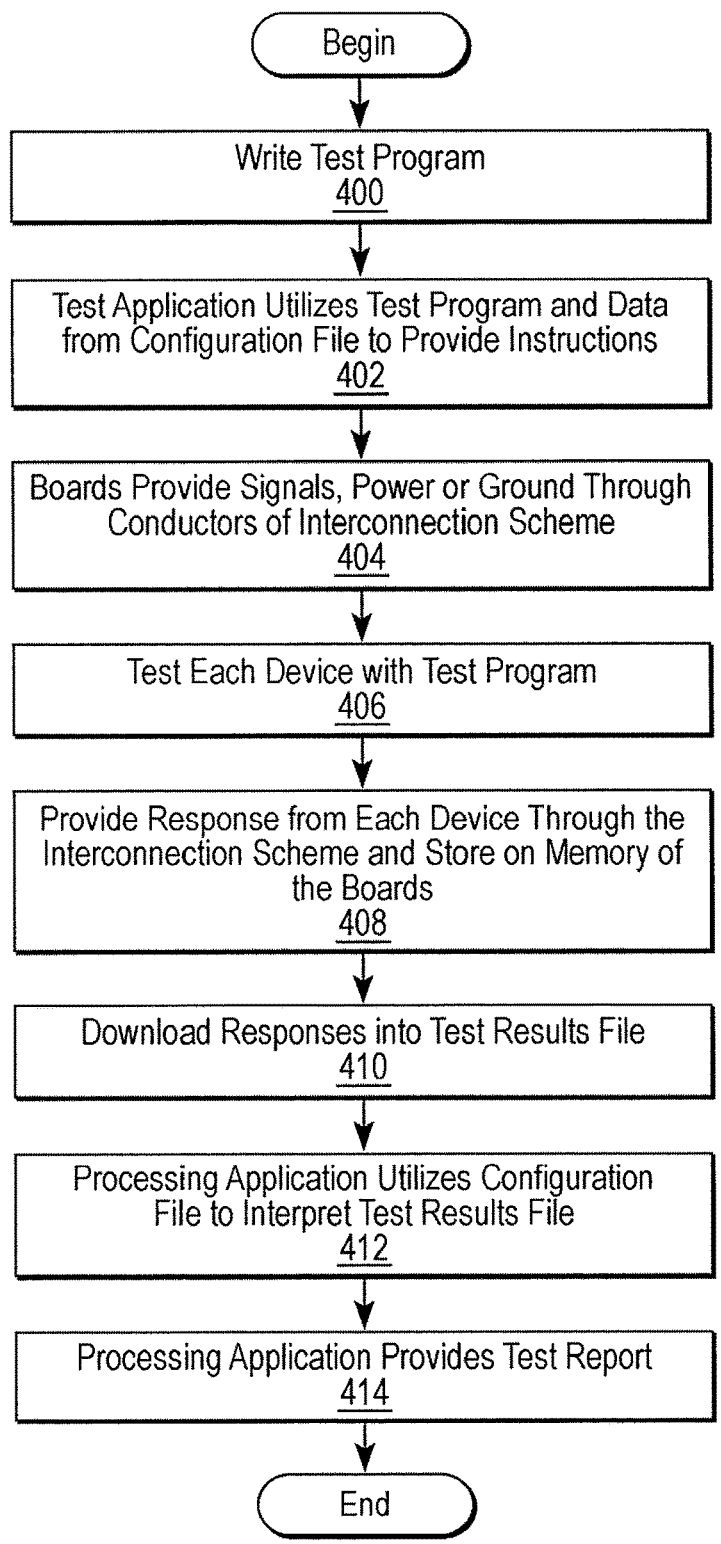
FIG. 23 is a flow chart of how the apparatus of FIG. 19 is used.

Reference should now be made to FIGS. 22 and 23 in combination. The test program 308 has a series of instructions written by a test programmer to test one of the devices 300 (step 400). The following is an extract of such a program:

setdps ("v NORMAL 1", "Vcc", 3.0 V, 0.0 V, 11.0 V);
setdps ("v NORMAL 1", "Vcd", 4 V, 0.0 V, 11.0 V);
setsps ("v NORMAL 1", "Vio", 0 V, 3.3 V);
setsps ("v NORMAL 1", "Vclk", 0 V, 3.3 V);
setsps ("v NORMAL 1", "Vcs", 0 V, 3.3 V);
setpps ("v NORMAL 1", "Term 1", 1.0);
settps ("v NORMAL 1", "Term 2", 1.0);
setthps ("v NORMAL 1", "CompH", 1.5);
setthps ("v NORMAL 1", "CompL", 0.9).

The test application 312 utilizes the test program 308 and data from the configuration file 310 and data from the test results file 314 to provide instructions to the boards 260, 262, and 264 (step 402). The boards 260, 262, and 264 then provide electric signals, power, or ground through respective conductors of the interconnection scheme 302 (step 404). The configuration file 310 has data representing a relationship between the channels of the boards 260, 262, and 264 and the contacts of the devices 300. The configuration file 310 will be different from one configuration assembly to another configuration assembly of the tester system 304. The configuration file 310 thus represents how the instructions of the test program 308 are fanned out through the tester system 304 to the devices 300. Each device 300 is tested with the same test program 308 (step 406), although the voltage and signal levels may be modified based upon the test results file 314.

The following table is an extract of the configuration file 310 with field names listed at the top of each column:

| ZONE NUMBER | SLOT NUMBER | CHANNEL TYPE | RAB NUMBER | PWR MODULE NUMBER | CHANNEL NUMBER | COLUMN | ROW | CONN TYPE | PAD LABEL | TERM LABEL | COMMON KEY | MASK |
|---|---|---|---|---|---|---|---|---|---|---|---|---|
| 2 | 29 | HVOL | 1 | 1 | 0 | 5 | 16 | D | CE | 0 | 0 | 0 |
| 2 | 22 | DRV_CS | -1 | -1 | 0 | 1 | 20 | D | OE | CS_0 | 0 | 0 |
| 1 | 6 | DRV_CS | -1 | -1 | 0 | 37 | 15 | D | OE | CS_0 | 0 | 0 |
| 1 | 6 | DRV_UCLK | -1 | -1 | 0 | 35 | 15 | D | DQ1 | A_0 | 0 | 0 |
| 2 | 22 | DRV_UCLK | -1 | -1 | 0 | 7 | 20 | D | DQ1 | A_0 | 0 | 0 |
| 2 | 22 | DRV_UCLK | -1 | -1 | 1 | 20 | 25 | D | DQ1 | B_1 | 0 | 0 |
| 2 | 22 | DRV_IO | -1 | -1 | 1 | 2 | 21 | D | DQ7 | I/O_1 | 0 | 0 |
| 1 | 6 | DRV_UCLK | -1 | -1 | 1 | 15 | 10 | D | DQ1 | B_1 | 0 | 0 |
| 2 | 22 | DRV_CS | -1 | -1 | 1 | 3 | 21 | D | OE | CS_1 | 0 | 0 |
| 1 | 6 | DRV_CS | -1 | -1 | 1 | 32 | 14 | D | OE | CS_1 | 0 | 0 |
| 1 | 6 | DRV_UCLK | -1 | -1 | 1 | 15 | 2 | D | DQ1 | B_1 | 0 | 0 |
| 1 | 6 | DRV_UCLK | -1 | -1 | 1 | 17 | 14 | D | DQ1 | B_1 | 0 | 0 |
| 1 | 6 | DRV_IO | -1 | -1 | 1 | 37 | 13 | D | DQ7 | I/O_1 | 0 | 0 |
| 1 | 6 | DRV_CS | -1 | -1 | 1 | 28 | 6 | D | OE | CS_1 | 0 | 0 |
| 1 | 6 | DRV_UCLK | -1 | -1 | 1 | 16 | 14 | D | DQ1 | B_1 | 0 | 0 |
| 2 | 22 | DRV_UCLK | -1 | -1 | 1 | 6 | 25 | D | DQ1 | A_1 | 0 | 0 |
| 2 | 22 | DRV_CS | -1 | -1 | 1 | 10 | 17 | D | OE | CS_1 | 0 | 0 |
| 2 | 22 | DRV_CS | -1 | -1 | 1 | 11 | 21 | D | OE | CS_1 | 0 | 0 |
| 2 | 22 | DRV_UCLK | -1 | -1 | 1 | 21 | 21 | D | DQ1 | B_1 | 0 | 0 |
| 1 | 6 | DRV_UCLK | -1 | -1 | 1 | 16 | 10 | D | DQ1 | B_1 | 0 | 0 |
| 2 | 22 | DRV_CS | -1 | -1 | 1 | 2 | 21 | D | OE | CS_1 | 0 | 0 |
| 2 | 22 | DRV_UCLK | -1 | -1 | 1 | 23 | 17 | D | DQ1 | B_1 | 0 | 0 |
| 2 | 22 | DRV_CS | -1 | -1 | 1 | 1 | 21 | D | OE | CS_1 | 0 | 0 |
| 2 | 22 | DRV_CS | -1 | -1 | 1 | 9 | 17 | D | OE | CS_1 | 0 | 0 |
| 1 | 6 | DRV_UCLK | -1 | -1 | 1 | 16 | 2 | D | DQ1 | B_1 | 0 | 0 |
| 1 | 6 | DRV_CS | -1 | -1 | 1 | 27 | 3 | D | OE | CS_1 | 0 | 0 |
| 1 | 6 | DRV_UCLK | -1 | -1 | 1 | 36 | 14 | D | DQ1 | A_1 | 0 | 0 |
| 2 | 22 | DRV_CS | -1 | -1 | 1 | 16 | 32 | D | OE | CS_1 | 0 | 0 |
| 1 | 6 | DRV_UCLK | -1 | -1 | 1 | 18 | 6 | D | DQ1 | B_1 | 0 | 0 |
| 1 | 6 | DRV_CS | -1 | -1 | 1 | 34 | 10 | D | OE | CS_1 | 0 | 0 |
| 2 | 22 | DRV_UCLK | -1 | -1 | 1 | 6 | 21 | D | DQ1 | A_1 | 0 | 0 |
| 1 | 6 | DRV_CS | -1 | -1 | 1 | 31 | 14 | D | OE | CS_1 | 0 | 0 |
| 1 | 6 | DRV_UCLK | -1 | -1 | 1 | 32 | 6 | D | DQ1 | A_1 | 0 | 0 |
| 2 | 22 | DRV_UCLK | -1 | -1 | 1 | 8 | 25 | D | DQ1 | A_1 | 0 | 0 |

The fields at the top of the columns of the table above stand for the following:

ZONE NUMBER: index to indicate membership to a pattern zone, determined by pattern generator board 260.

SLOT NUMBER: location of a driver or power board 262 or 264.

CHANNEL TYPE: type of hardware resource to be used.

RAB NUMBER: index of reference and acquisition module on the power board 264, or −1 if not applicable.

PWR MODULE NUMBER: power module on power board 264.

CHANNEL NUMBER: resource index of given board 262 or 264.

COLUMN, ROW: position of the base structure 266 on the wafer (or testboard).

CONN TYPE: connection type; D for device, or T for termination; whether a resource influences a device directly, or provides auxiliary electrical characteristics to the test assembly.

PAD LABEL: designator for the terminal 72 or pin 68 that the resource is connected to; this label is then used for programming purposes.

TERM LABEL: option label for a termination pin.

COMMON KEY: option sort key.

MASK: field to determine whether a device should be tested or not.

Some resources are provided separately to each of the devices 300. For example, there may be a total of 600 of the devices 300, and each device may require a separate input/output line connected through the interconnection scheme 302. Other resources may be shared in order to reduce the number of electrical paths that are provided through the interconnection scheme 302. For example, a single input/output line 320 can be provided through the interconnection scheme 302, and at the last level within the interconnection scheme 302 be fanned to a set (or all) of the devices 300. An input/output signal is thus provided to all the devices 300 of the set. A chip select line 322 can be accessed to select a subset of the devices of the set to which the input/output line 320 is connected. Unique chip select line combinations are then grouped into chip select states.

Figure 24A:
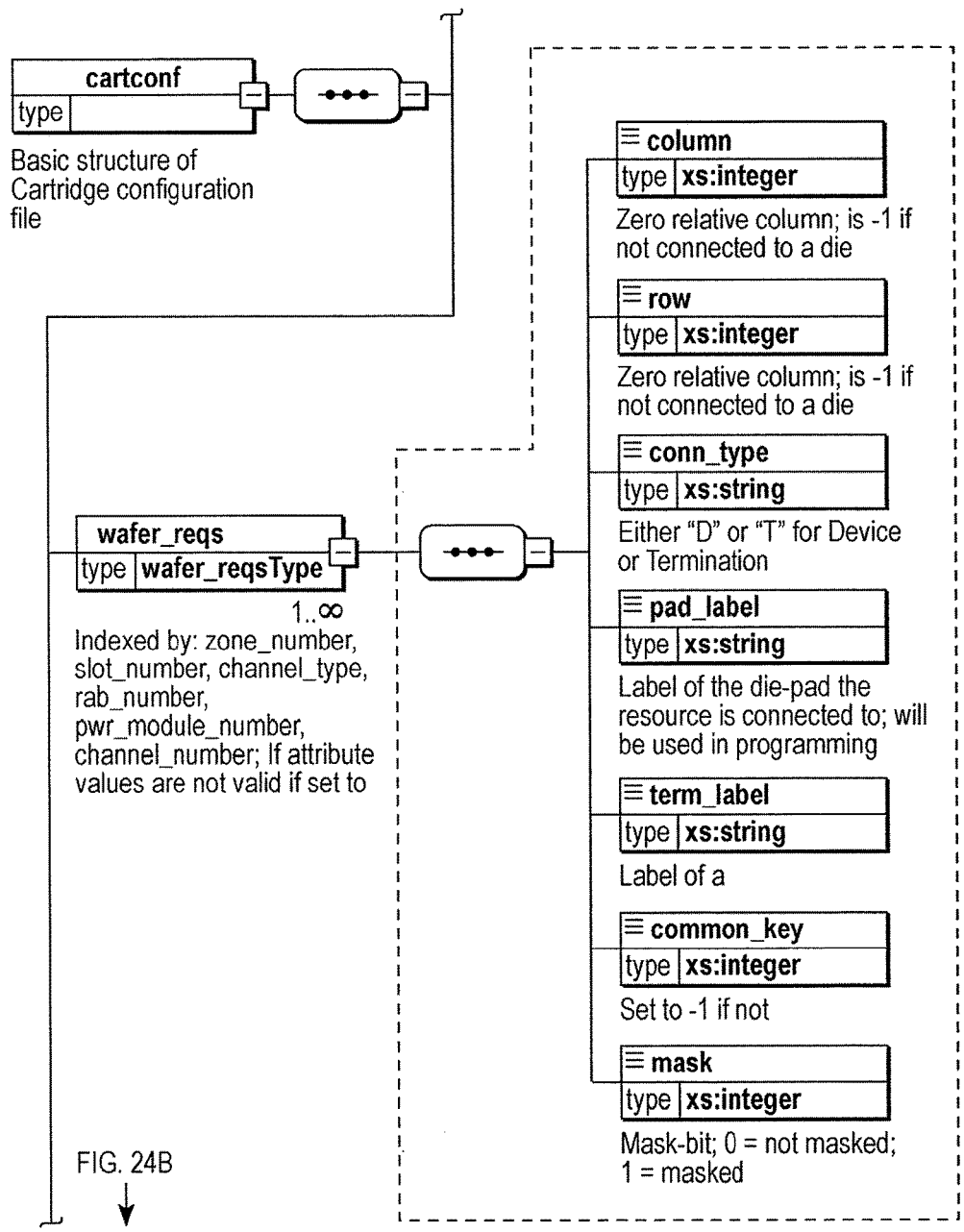
FIGS. 24A and 24B show a block diagram illustrating a database structure of the configuration file.
Figure 24B:
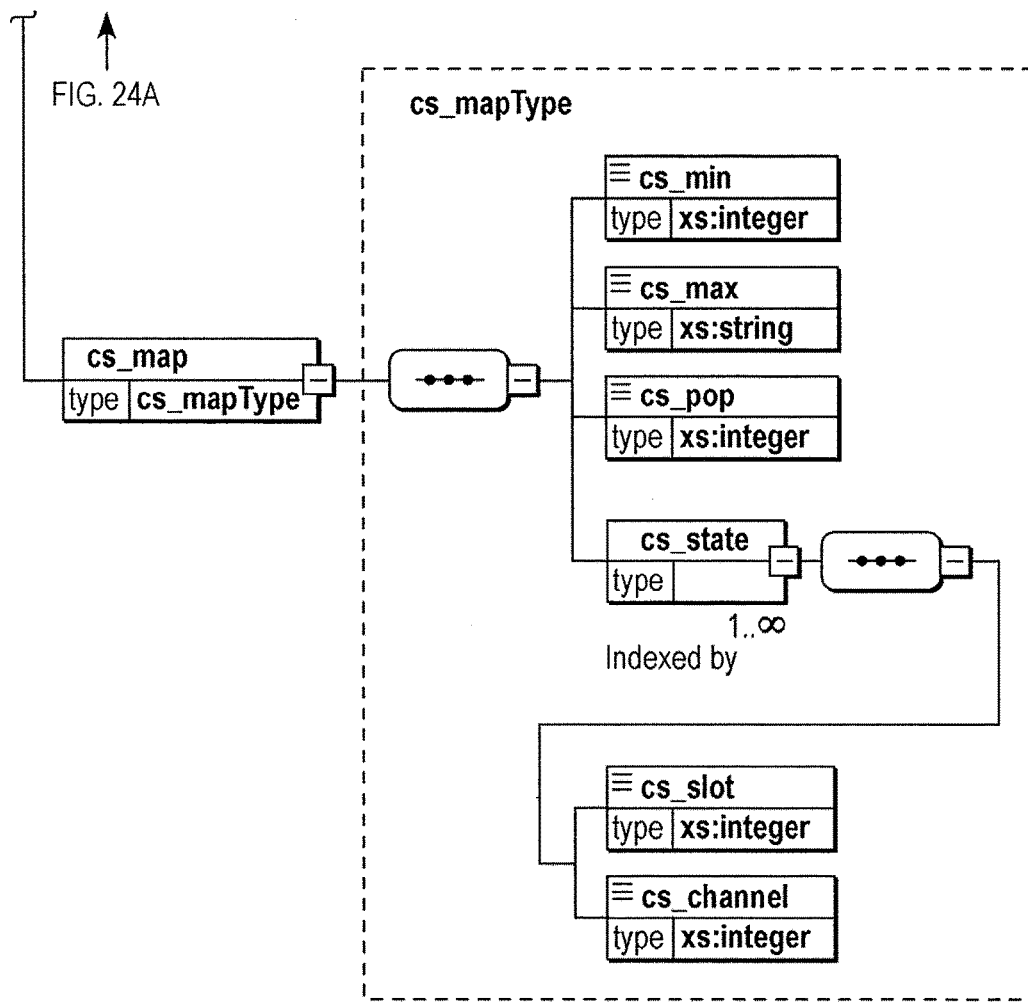

FIGS. 24A and 24B illustrate the data structure of the configuration file 310 ("cartconf"). The configuration file 310 includes both a wafer requirement data structure (wafer_reqs) and a shared resources map (cs_map) representing the chip select states. Descriptions of the respective fields and what the fields represent are described in FIGS. 24A and 24B.

Again referring to FIGS. 22 and 23, a response from each one of the devices 300 is provided through the interconnection scheme 302 and stored in the memory of the driver and power boards 262 and 264 (step 408). The system software uploads the responses from the driver and power boards 262 and 264 into the test results file 314 (step 410). The test results file 314 has raw data wherein the test results of all the devices 300 are collated. The test results file 314 is provided to a processing application 316. The processing application 316 utilizes the configuration file 310 to interpret the test results file 314 in such a manner that the test results of individual ones of the devices 300 are extracted from the test results file 314 (step 412). The processing application 316 then publishes the test report 318 (step 414). The test report 318 is typically a two-dimensional map on a computer screen with cells representing the devices 300, wherein functioning and defective devices are shown in different colors. The test results file 314 is also to be used by the test application 312 to modify the instructions provided to boards 260, 262, and 264.

Figure 25:
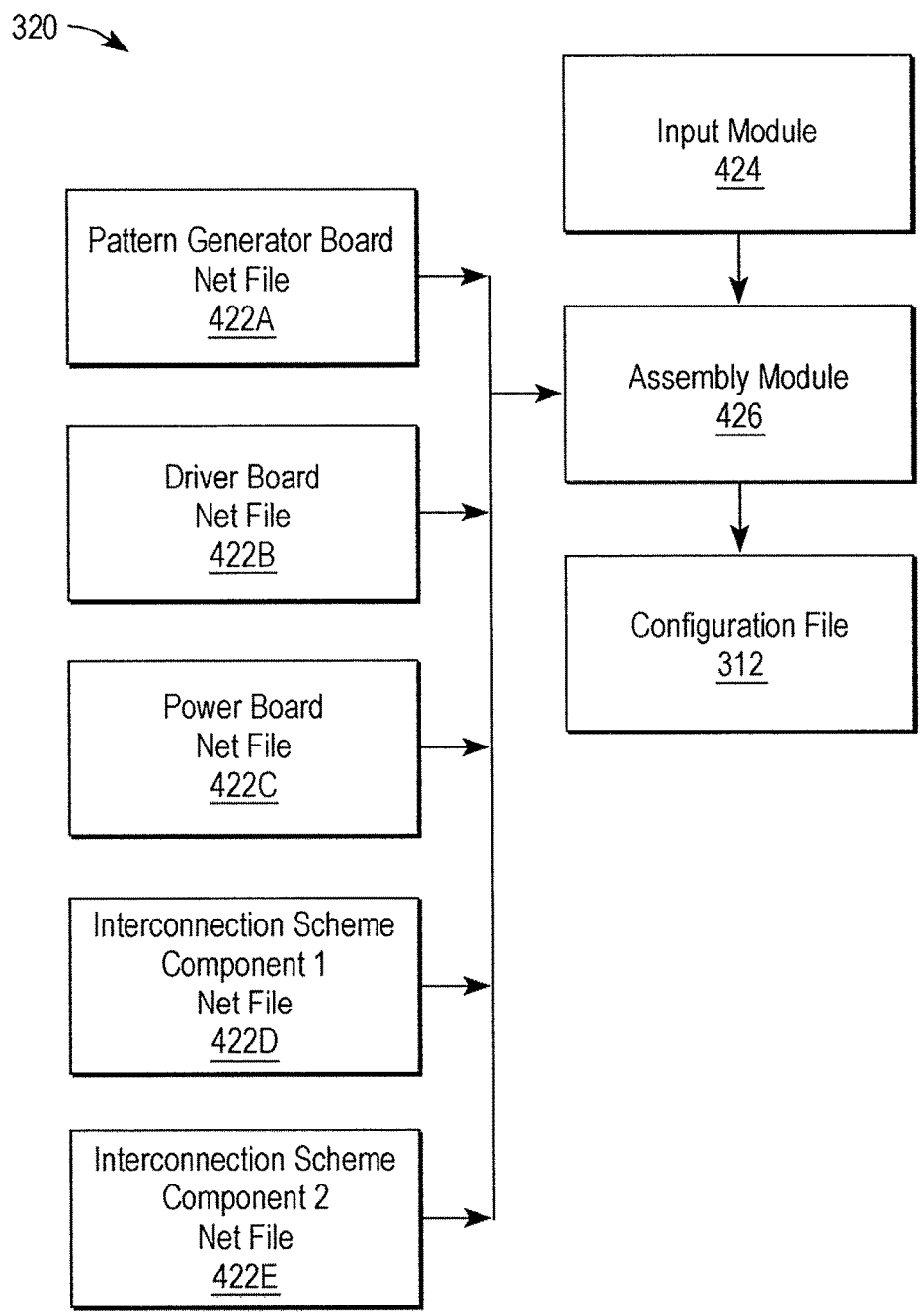
FIG. 25 is a block diagram of a software assembly application that is used to construct the configuration file from a plurality of net files.

FIG. 25 illustrates a software assembly application 420 that is used for constructing the configuration file 312 of FIG. 19. The application 420 includes a plurality of net files 422, an input module 424, and an assembly module 426. The net files 422 each represent a scheme of current passing through conductors of a respective electrical subassembly. For example, the net file 422A is a pattern generator board net file representing the flow of current through one of the pattern generator boards 260 of FIG. 19. Similarly, the driver board net file 422B and power board net file 422C respectively represent flow of current through conductors through one of the driver boards 262 and one of the power boards 264. The interconnection scheme 302 also has multiple components, and a respective net file 422D or 422E represents flow of current through a respective component of the interconnection scheme 302.

Figure 26:
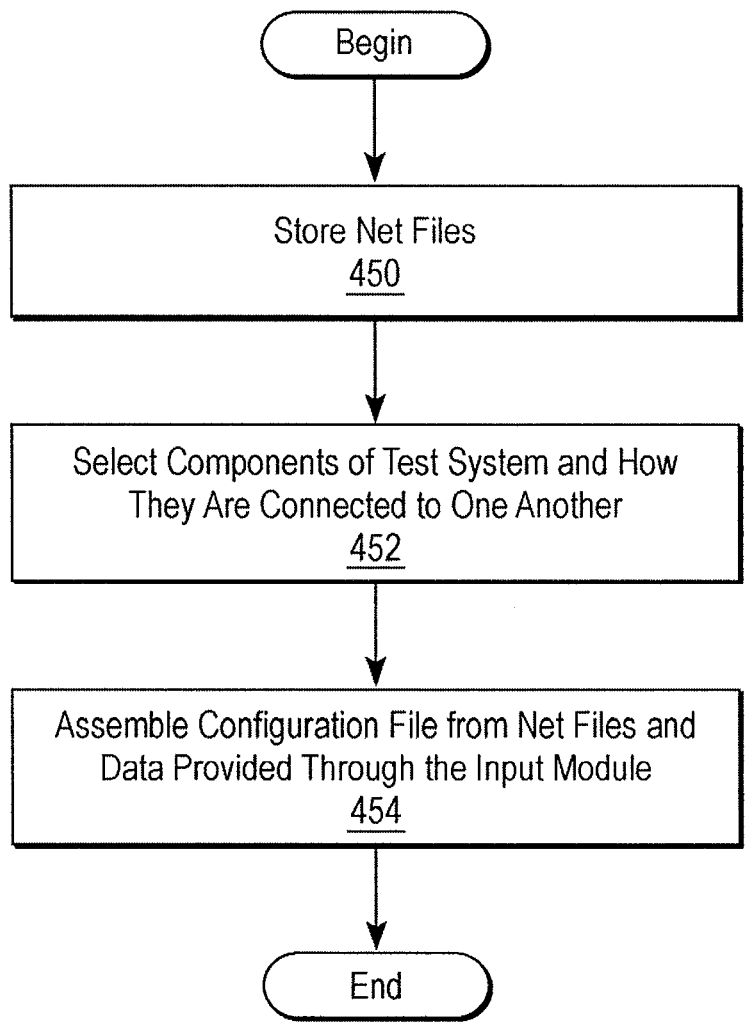
FIG. 26 is a flowchart of how the software assembly application of FIG. 22 assembles the configuration file.

Referring now to FIGS. 25 and 26 in combination, the net files 422 are first stored in the memory of a computer system on which the software assembly application 418 resides (step 450). The input module 424 has an interface with a list of the components that can make up the tester system 304. The list includes one pattern generator board, one driver board, one power board, and one type of each component that can make up the interconnection scheme 302. The input module 424 also allows an operator to select how many of the components on the list are used to assemble the tester system 304, and how the components are connected to one another. For example, the operator can select two pattern generator boards and three driver boards, one of the driver boards being connected to one of the pattern generator boards and the other two driver boards being connected to the other pattern generator board (step 452).

The assembly module 426 then uses the input provided by the operator via the input module 424 and the net files 422 to assemble the configuration file 310. In the given example, the assembly module 426 will construct the configuration file 310 so that it has data representing two pattern generator net files 422A and three driver board net files 422B, with one driver board net file 422B being associated with one pattern generator board net file 422A and the other two pattern generator net files 422B being associated with the other pattern generator board net file 422A (step 454). The configuration file 310 can then be transferred from the computer system on which the software assembly application 420 resides to the local controller 306 of FIG. 22.

Figure 27:
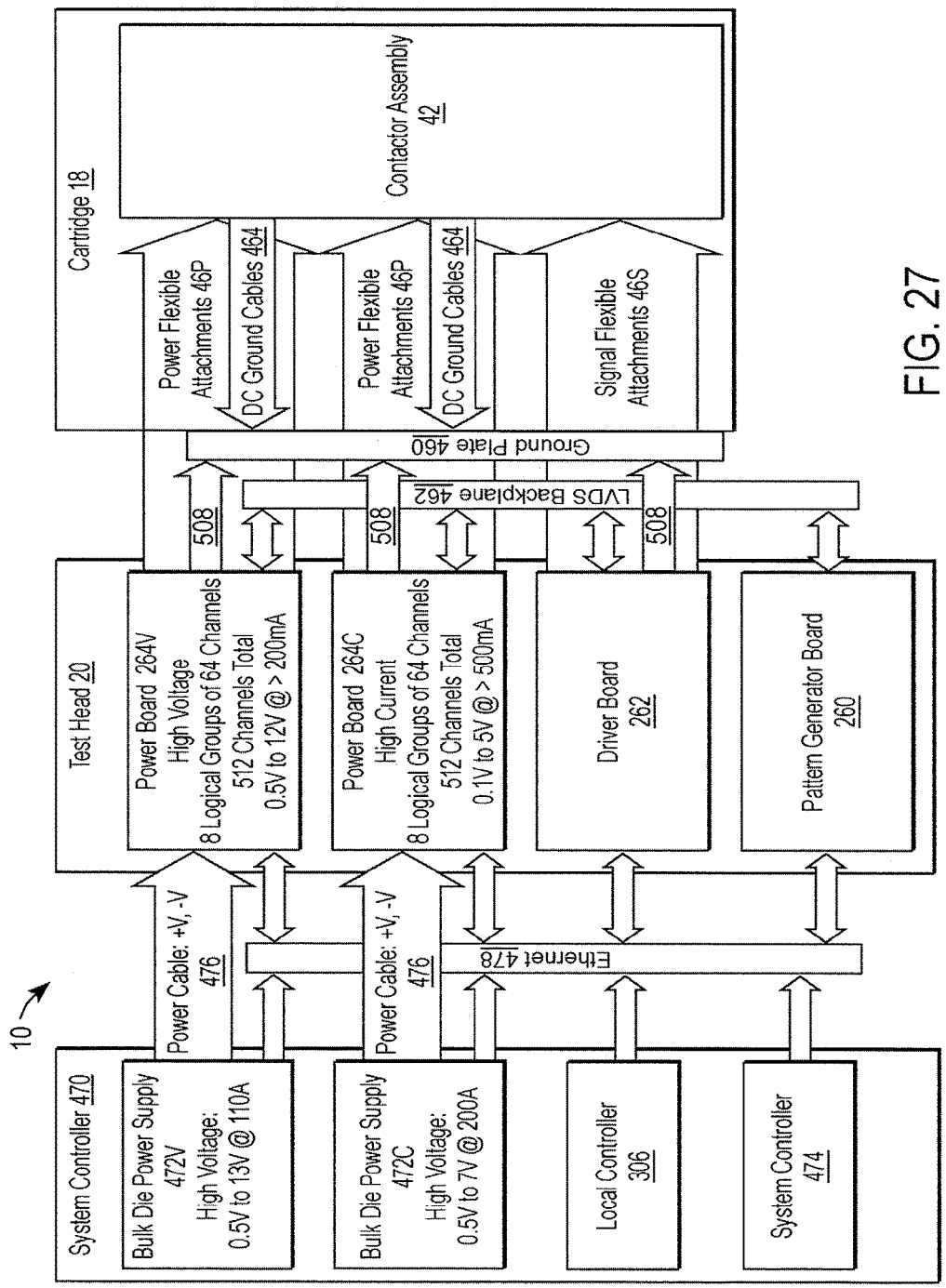
FIG. 27 is a block diagram of electrical components of the apparatus of FIG. 1.

FIG. 27 illustrates some of the components hereinbefore described and some additional components of the apparatus 10. The components hereinbefore described include the cartridge 18 that has the contactor assembly 42, the flexible attachments 46, two of the power boards 264, one of the driver boards 262, one of the pattern generator boards 260, and the local controller 306. Two types of power boards 264V and 264C are used, for high voltage and high current respectively. Each power board 264V or 264C has eight logical groups of 64 channels, and therefore 512 channels in total. The high-voltage power board 264V can provide a voltage output of 0.5 V to 12 V at a current of at least 200 mA for each channel. The high-current power board 264C can provide an output of 0.1 V to 5 V at a current of at least 500 mA. The locations of the boards 260, 262, and 264 have been described with reference to FIG. 20.

Each one of the power boards 264V or 264C is connected to the contactor assembly 42 through four dedicated power flexible attachments 46P. The driver board 262 is connected to the contactor assembly 42 through dedicated signal flexible attachments 46S. The flexible attachments 46 have been described with reference to FIG. 3. The flexible attachments 46 connecting at interface 92 at the distribution board 48 also provide alternating current (AC) ground from the contactor assembly 42 to the boards 262 and 264.

The apparatus 10 further includes a ground plate 460 and a Bussed low-voltage differential signaling (LVDS) backplane 462 mounted within the test head 20. The power boards 264V and 264C and the driver board 262 each have two direct current (DC) connection pins 508, as illustrated in FIG. 18, that connect to the ground plate 460. The DC pins 508 also pass through the ground plate 460 and connect to the connector block support piece 184, shown in FIG. 17. DC ground cables 464 connect the connector block support piece 184 to the signal distributor board 48, shown in FIG. 4, at the DC connection site 461, illustrated in FIG. 6, and thereby provide a DC ground path from the boards 262 and 264, the contactor assembly 42, and the wafer 76. FIG. 3 illustrates connectors 466 to which the DC ground cables 464 are attached at the connector block support piece 184 of the cartridge 18.

The boards 260, 262, 264C, and 264V each have a connection that connects a respective board to the Bussed LVDS backplane 462. A logical link is thereby provided between the boards 260, 262, 264C, and 264V, allowing the boards to communicate with one another. It is also the Bussed LVDS backplane 462 that provides the logical link between the boards 260, 262, and 264 illustrated in FIG. 22.

The apparatus 10 further has a system control bay 470 that includes a die bulk power supply 472V for high voltage, a die bulk power supply 472C for high current, the local controller 306 described with reference to FIG. 22, and a system controller 474. The die bulk power supply 472V can provide a voltage of 0.5 V to 13 V at 110 A, and the die bulk power supply 472C can provide a voltage of 0.5 V to 7 V at 200 A. The die bulk power supply 472V is connected through respective power cables 476 to power board(s) 264V. Similarly, the die bulk power supply 472C is connected through respective power cables 476 to power board(s) 264C.

An Ethernet link 478 connects and networks the die bulk power supplies 472V and 472C, the local controller 306, the system controller 474, and the boards 260, 262, 264C, and 264V with one another. The local controller 306 controls the boards 260, 262, 264C, 264V, and 474 through the Ethernet link 478 and peripheral components of the apparatus 10.

Figure 28:
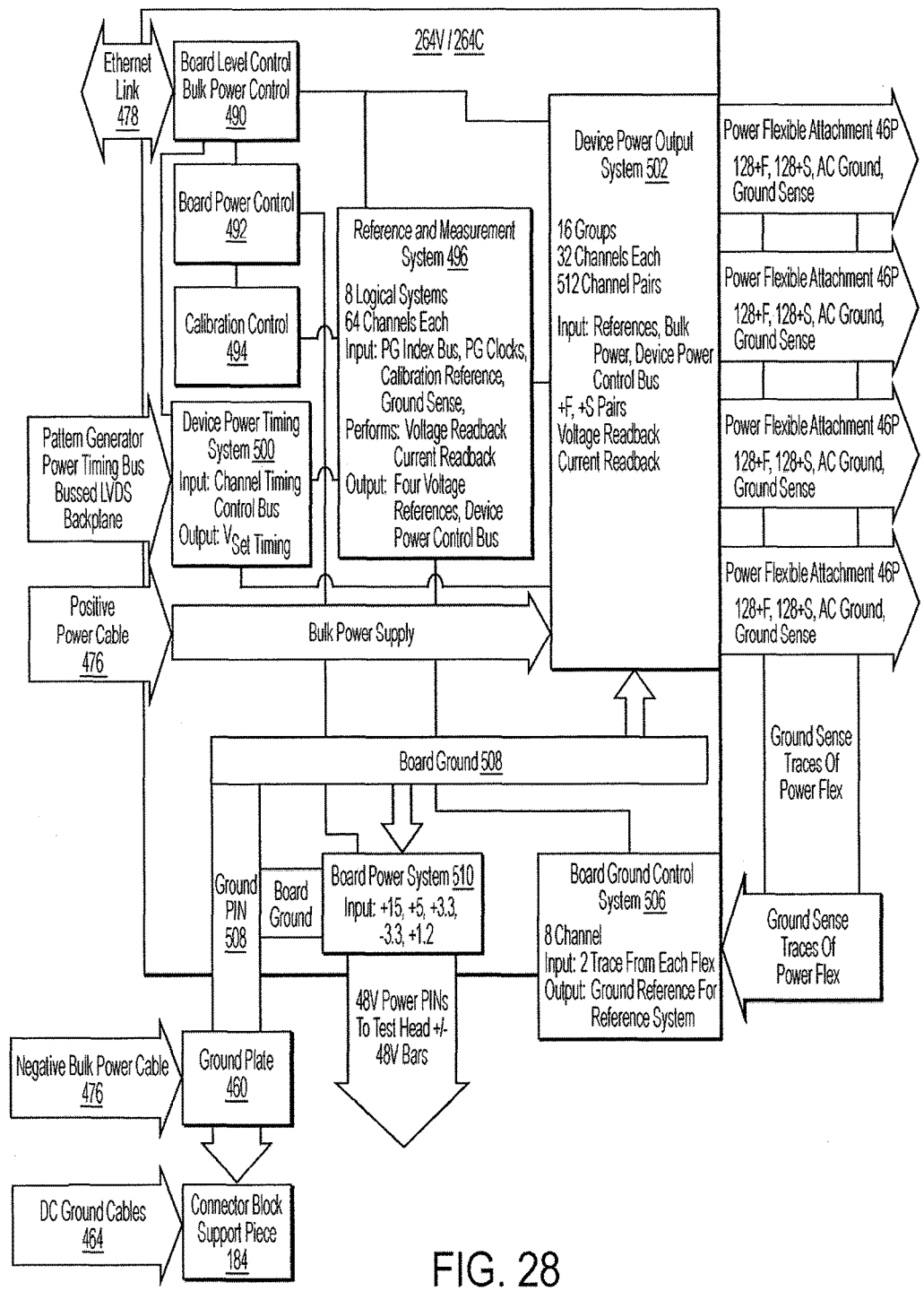
FIG. 28 is a block diagram of components of a power board illustrated in FIGS. 22 and 27, and connections made to the power board.

FIG. 28 illustrates one of the power boards 264V or 264C and its connections to the ground plate 460 and power flexible attachments 46P. A board-level control and bulk power control 490 is connected to the Ethernet link 478. A board power control 492 and calibration control 494 are connected to the board-level control and bulk power control 490. The board-level control and bulk power control 490, device power timing system 500, and the calibration control 494 are connected to a reference and measurement system 496 and provide a series of instructions to the reference and measurement system 496. The instructions have been described with reference to FIG. 22 (the instructions that are provided by the board-level control and bulk power control 490, the device power timing system 500, and calibration control 494 to the reference and measurement system 496 have, for purposes of explanation, been equated to chords in a music score).

The pattern generator board 260 has a pattern generator power timing bus that is connected through the Bussed LVDS backplane to a device power timing system 500. The device power timing system 500 is connected to the reference and measurement system 496. The device power timing system 500 provides both timing and instructions to the reference and measurement system 496 for purposes of carrying out the instructions that are provided from the board-level control and bulk power control 490 and calibration control 494 (the functioning of the device power timing system 500 has, for purposes of explanation, been equated to an orchestra conductor that provides both timing and instructions of which chords are to be played). The reference and measurement system 496 includes eight logical systems of 64 channels each, thus totaling 512 channels. Inputs into the reference and measurement system include signals from the pattern generator index bus, pattern generator clocks, calibration reference, and ground sense. The reference and measurement system 496 performs voltage readback and current readback. Output from the reference and measurement system 496 includes four voltage references and device power control through a device power control bus. Output from the reference and measurement system 496 thus includes logic for purposes of controlling power.

The reference and measurement system 496 and board-level control and bulk power control 490 are connected to a device power output system 502. A positive side of the die bulk power supply 472V or 472C is also connected to the device power output system 502 through power cable 476. The device power output system 502 regulates the power from the die bulk power supply 472V or 472C, utilizing the signal from the reference and measurement system 496 (the power provided by the die bulk power supply 472V or 472C has, for purposes of explanation, been equated to power or air that is provided simultaneously to a number of music instruments in an orchestra). The device power output system 502 includes 16 sections of 32 channels, grouped into 8 logical groups, thus totaling 512 channels. Each channel includes a Kelvin sense system, each system including one force (+F) and one sense (+S) line, so that there are a total of 1,024 pins and circuits. Input into the device power output system 502 includes references, bulk power, control parameters from board-level control and bulk power control 490, and device power control through the device power control bus. The device power output system 502 also provides voltage and current readback to the reference and measurement system 496 and channel status information to the board-level control and bulk power control 490.

Four of the power flexible attachments 46P are connected to the device power output system 502. Each power flexible attachment 46P includes 128 +F lines, 128 +S lines, AC ground, and ground sense.

Two ground sense traces from each power flexible attachment 46P, thus totaling eight traces, are connected to a board ground control system 506. The board ground control system 506 averages eight measurements from the ground sense traces, and provides the averaged result as an output to the reference and measurement system 496.

A ground pin 508 is connected to the ground plate 460 and the first connector sets 44. The ground pin 508 is connected to both the device power output system 502 and to a board power system 510. The board power system 510 has a separate 48 V input, and can provide, for example, outputs of 15 V, 5 V, 3.3 V, −3.3 V, and 1.2 V. The DC ground cables 464 are connected to the connector block support piece 184. The negative side of the die bulk power supply 472V or 472C is also connected through the power cable 476 to the ground plate 460.

What should be noted is that separate paths are provided for AC ground and for DC ground. AC ground is provided through the flexible attachments 46P that also deliver the power. The physical space between F+ power provision, the S+ line, and AC power ground in a power flexible attachment 46P is extremely small, typically on the order of between 0.002 and 0.010 inches. Such a small space allows for a substantial reduction in noise and an increase in speed, which is particularly important for accurate measurement through the 512 sense lines and clean power delivery through the F+ lines. DC ground is provided through the DC ground cables 464. The AC and DC grounds have, for example, respective resistances of between 0.5 and 1.5 ohms and 0.003 and 0.015 ohms.

Figure 29:
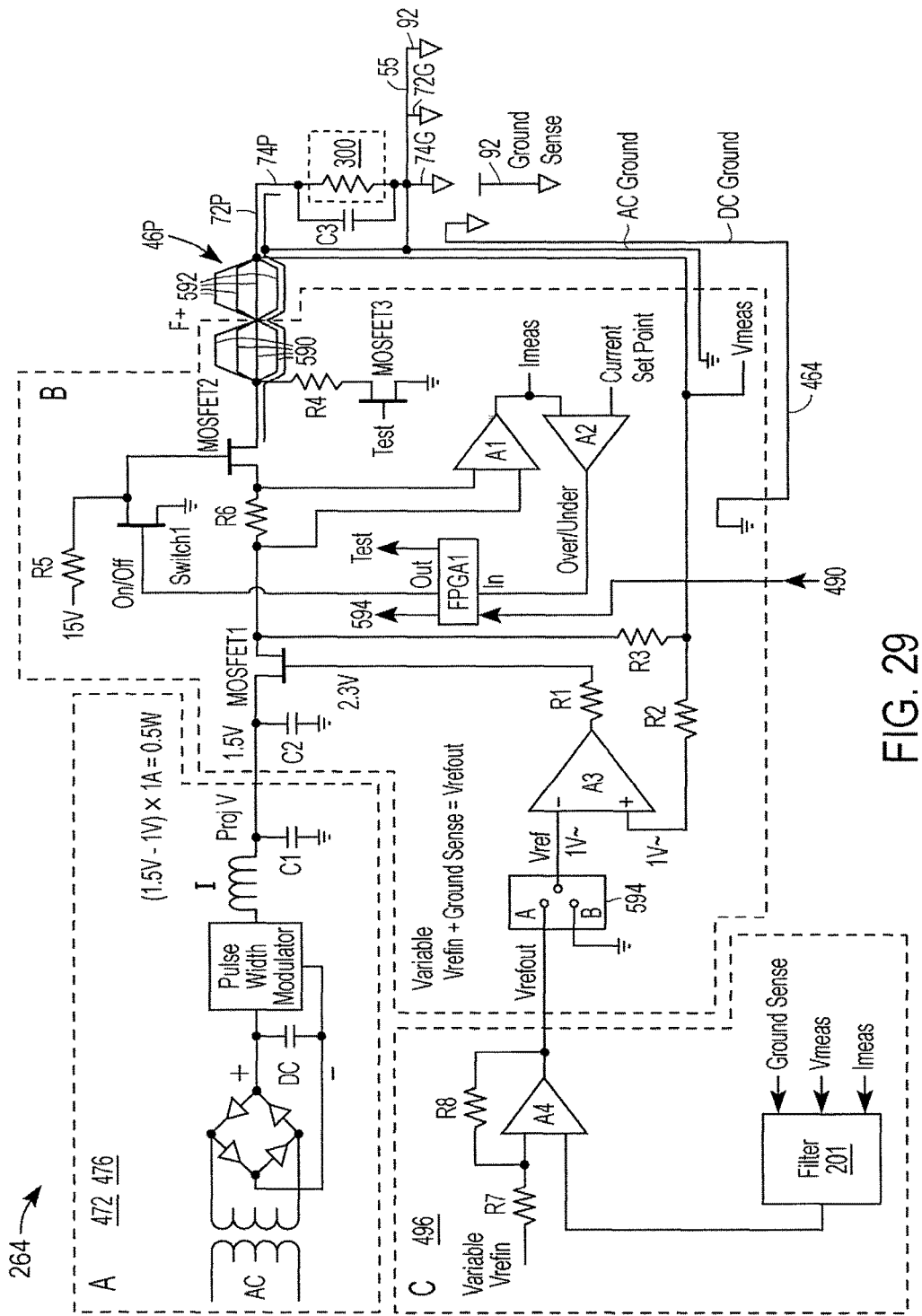
FIG. 29 is a circuit diagram illustrating components that are replicated on the power board of FIG. 28.

FIG. 29 illustrates components of the device power output system 502 in more detail. The device power output system 502 includes only a single one of subsystem A. The subsystem B is replicated 512 times and is in eight groups of 64, and the 512 subsystems B are connected in parallel to the subsystem A. The subsystem C is replicated eight times, and the eight subsystems C are connected in parallel to the subsystem B.

Subsystem A includes die bulk power supply 472 and power cables 476 which include an AC-to-DC conversion circuit comprising an inductor I and a capacitor C1 connecting an output terminal of the inductor I to ground and is controlled by board-level control and bulk power control 490 and local controller 306 through Ethernet link 478. An input terminal of the inductor I is connected to the die bulk power supply 472V or 472C in FIG. 27. A stepped voltage cycle is provided to an input terminal of the inductor I. An amplitude and a period of the stepped voltage cycle always remain constant, but an amount of time that the voltage is high during a particular period can be modulated. The total amount of time that the voltage is high can thus be modulated from a small percentage of the total time to a large percentage of the total time. The inductor I and capacitor C1 convert the voltage step to a DC voltage. The DC voltage can thus also be modulated, depending on the percentage of time that the voltage provided to the input terminal of the inductor I is high. The die bulk power supply 472V or 472C allows for a variable voltage to be created per power board 264. The DC voltage can thus be modulated, depending on the need to control power dissipation in the device power output system 502. The reference and measurement system 496 allows for 16 different voltages to be created per group of 64 channels. Different voltages can be provided to different groups of 64 channels at a particular moment in time.

The DC voltage created by the subsystem B is provided through a force F+ line through a power terminal 72P to a power contact 74P of a respective device 300 (see also reference numerals 72 and 74 in FIG. 4). A sense line S+ is connected to the power terminal 72 or 56 and detects a voltage at the power terminal 72. The voltage detected by the sense line S+ is provided through a resistor R2, an amplifier A3, and a resistor R1 to control a MOSFET 1 located in the force line F+. The amplifier A3 also receives at its positive terminal an input (Vref) through a switch 594. The amplifier A3 is set so that the voltages provided at its positive and negative terminals are combined to provide an output voltage to the MOSFET 1. The voltage Vrefout provides an input voltage, which is the desired voltage provided to the power terminal 72P, and the sense line S+ provides a feedback through the amplifier A3 to keep the voltage provided to the MOSFET 1, and therefore the power terminal 72P, at a steady state. The amplifier A3 provides a voltage (Vrefout+$V_{GS}$), in this case 2.3 V, to the MOSFET 1 if the voltage provided by the subsystem A is 1.5 V and the power terminal 72P requires a voltage of 1 V. The MOSFET 1 dissipates heat equivalent to a difference between the voltage provided by the subsystem A and the voltage on the force line F+, multiplied by the current. For example, the voltage provided by the subsystem A can be 1.5 V, and the force line F+ can provide a voltage of 1 V. If the current is 1 A, the power dissipated by the MOSFET 1 is 0.5 W. Should the voltage provided by the subsystem A always be a maximum of, for example, 12 V, the MOSFET 1 would have to dissipate 11 W. The variable power provided by the die bulk power supplies 472V and 472C in FIG. 27 thus substantially assists in reducing the amount of energy, and therefore heat, dissipated by the MOSFET 1.

A resistor R3 is connected between the force and sense lines F+ and S+ and resistively connects the F+ to the S+ of the amplifier A3. The resistor R3 serves to control the amplifier A3 in case of a failure by holding the force and sense lines F+ and S+ to similar voltages. The resistor R3 is thus just a safety device in case of contact failure.

The subsystem B also includes a circuit that automatically switches power to the device 300 off upon the detection of an overcurrent, among other things. The overcurrent detection and switching circuit includes a resistor R6 located after the MOSFET 1 in the force line F+. A voltage over the resistor R6 is linearly related to a current through the force line F+. An amplifier A1 amplifies the voltage detected over the resistor R6. A comparitor A2 compares an output from the amplifier A1 to a current set point supplied by reference and measurement system 496. An output from the comparitor A2 would be zero if the output from the amplifier A1 is the same as, or greater than, the current set point.

The output from the comparitor A2 provides an indication of an overcurrent or undercurrent through the resistor R6. The output from the comparitor A2 is provided to a field programmable gate array (FPGA) 1. The FPGA 1 has logic that determines whether the over- or undercurrent is sufficient to switch subsystem B off. The FPGA 1 also provides for a timing delay before switching the current off, to allow for brief surges in current without switching the current off. An output of the FPGA 1 is provided to a switch 1 594 and a switch 2 594.

During normal operating conditions, i.e., when the current should continue to flow, the switch 1 is switched into its "off" position and the switch 2 in its "A" position. A voltage of 15 V is provided through a resistor R5 to one terminal of the switch and to a MOSFET 2 located after the resistor R6 in the force F+ line. During normal operating conditions, the voltage provided through the resistor R5 maintains the MOSFET 2 in an "on" position, thereby allowing current to flow through the force line F+. Should an overcurrent be detected, the FPGA 1 switches the switch 1 to its "on" position, thereby grounding the voltage provided through the resistor R5, the MOSFET 2 will switch into its "off" position and disconnect the current, and switch 2 is set to the "B" position, shutting down the amplifier A3.

What should be noted is that each one of the 512 subsystems B has its own overcurrent detection and switching circuit. The 512 overcurrent and switching circuits allow for currents to one or more of the 512 individual devices to be switched off, while current to the other devices continues to flow. Current measurement and voltage measurement can also be done on a per-device level, because each one of the subsystems B has a respective current measurement line (Imeas), and a respective voltage measurement line (Vmeas). The current measurement line Imeas is connected to an output of the amplifier A1, and the voltage measurement line Vmeas is connected to the sense line S+. The current and voltage measurement lines Imeas and Vmeas allow for real-time measurement of current and voltage provided to the power terminal 72P. The subsystem B also includes a switching circuit having a resistor R4 and a MOSFET 3. The resistor R4 is connected to the force line F+ after the MOSFET 2, and the MOSFET 3 is connected in series after the resistor R4. A test signal (Test) can be provided to the MOSFET 3, thereby drawing current through the force line F+ for self-testing.

A high-frequency response is required for the circuit that includes the resistors R1, R2, and the amplifier A3. For this purpose, a capacitor C3 is provided in parallel with the integrated circuit of the device 300. The capacitor C3 is built into the support structure 80 shown in FIG. 4. The force line F+ should have a relatively low inductance to allow for proper functioning of the capacitor C3 and high-frequency response of the circuit, including the resistors R1 and R2 and the amplifier A3. For this purpose, the force line F+ includes two sets of parallel power conductors 590 and 592, respectively. The subsystems A and B are connected to a single substrate with the conductors 590 of the first set being traces that are formed on the substrate. The conductors 590 all have first ends that are connected to one another and second ends that are connected to one another, so that middle sections of the conductors 590 conduct current in parallel. The second ends of the conductors 590 are connected to a common pin. The conductors 592 are in the form of individual electric lines in a respective power flexible attachment 46P. First ends of the conductors 592 are connected to one another and second ends of the conductors 592 are connected to one another, so that middle sections of the conductors 592 conduct the current received from the conductors 590 in parallel. The second ends of the conductors 592 are all connected to one power terminal 72P.

The distribution board 48 has two ground sense contacts at each interface 92. Ground sense terminals at each interface 92 connect to the ground sense contacts 74G. Eight ground sense lines are provided to a grounding modulation circuit, including an amplifier A4 and a filter 201. The voltage detected at the ground sense contact 74G is added by the ground modulation circuit to a variable input voltage (Vrefin). Ideally, the voltage detected at the ground sense contact 74G is 0 V, in which case the voltage variable Vrefin would be equal to the voltage Vrefout. If the voltage detected at the ground sense contact 74G is not zero, for example, it is 0.1 V, then Vrefout would be driven to 1.1 V (Vrefin+0.1 V). The voltage provided to the negative terminal of the amplifier A3 would then also be 1.1 V, and the voltage provided to the power terminal 74P would be 1.1 V.

Figures 30, 31:
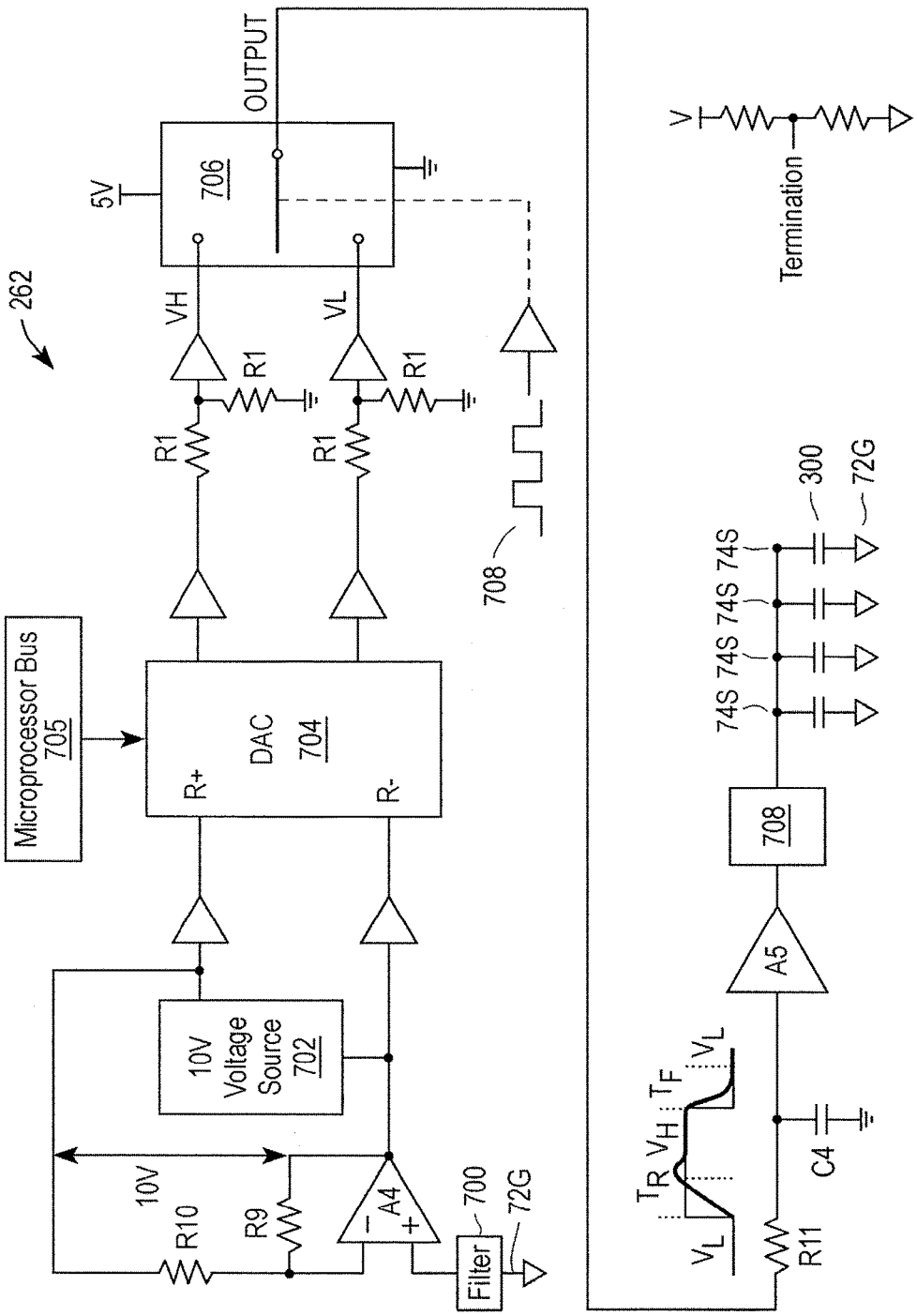
FIG. 30 is a circuit diagram illustrating components that are replicated on a driver board illustrated in FIGS. 22 and 27.
FIG. 31 is a circuit diagram illustrating a termination that is used in conventional design for purposes of damping a test signal.

FIG. 30 illustrates one channel of the driver board 262 shown in FIGS. 22 and 27. The same signal illustrated in FIG. 30 is replicated for each of multiple channels of the driver board 262.

Also illustrated in FIG. 30 are multiple ones of the devices 300 and their respective ground sense contacts 72G. Voltages detected by respective ground sense terminals on the ground sense contacts 74G (or 72G) are averaged and provided to a filter 700. Under normal operating conditions, the voltage provided to the filter 700 would be 0 V. There may sometimes be a small deviation from 0 V, for example, 0.1 V. The 0.1 V is provided by the filter 700 to a positive terminal of an amplifier A4. A negative terminal of the amplifier A4 is then also driven to 0.1 V. One resistor R9 is connected between the negative terminal and an output of the amplifier A4. A resistor R10, having the same resistance as the resistor R9, is also connected to the negative terminal of the amplifier A4. A 10 V voltage source 702 is connected over the resistors R9 and R10. Two terminals of the voltage source 702 are then 5 V above and 5 V below the voltage at the negative terminal of the amplifier A4, and thus at −4.9 V and 5.1 V, respectively.

The terminals of the 10 V voltage source 702 are connected to respective terminals R+ and R− of a digital-to-analog converter (DAC) 704. The DAC 704 also has output terminals, and has the ability to switch each output terminal to a voltage between −4.9 V and 5.1 V.

A microprocessor bus 705 is connected to the DAC 704. Information representing desired high and low voltages can be loaded from the microprocessor bus 705 into the DAC 704. The DAC 704 can, for example, be programmed with a high voltage of 3 V and a low voltage of 2 V. Because the voltage provided to the positive terminal of the amplifier A4 is at 0.1 V, the output terminals of the DAC are, in this example, held at 3.1 V and 2.1 V, respectively.

The output terminals of the DAC are connected to high-voltage and low-voltage (VH and VL) terminals of a voltage switch 706. The pattern generator board 260 illustrated in FIGS. 22 and 27 provides a signal source 708 to a signal terminal of the switch 706. The voltage switch is a bus switch in the present example, having a 5 V power supply voltage. The signal source 708 switches between alternating true and false states. In a true state, a first terminal of the switch 706 connected to the high-voltage VH is connected to an output of the switch 706, and in a false state, the terminal connected to the low-voltage VL is connected to the output of the switch 706. The output of the switch 706 thus switches between 3.1 V and 2.1 V in response to the signal source 708.

A damping circuit, including a resistor R11 and a capacitor C4, has an input connected to the output of the switch 706. The resistor R11 has one terminal connected to the switch 706, and an opposing terminal of the resistor R11 is connected through the capacitor C4 to ground. An effect of the damping circuit represented by the resistor R11 and capacitor C4 is that a slew rate of a signal provided on the output of the switch 706 is reduced. The switch 706 provides a square wave at its output, and the damping circuit has an output that responds to the square wave in a non-square fashion. Specifically, the voltage on the output of the damping circuit increases more slowly than the voltage provided to the input of the damping circuit.

The response voltage of the damping circuit is provided to an amplifier A5 with a gain of two, and then through a switch 708 to respective signal contacts 74S (see also reference numeral 74 in FIG. 4) of the devices 300. Because the signal provided to the devices 300 is dampened, ringing can be reduced or be eliminated.

FIG. 31 illustrates a prior art solution, wherein a termination damping circuit is provided at a termination of one device. The termination damping circuit provides a dampening effect at the device that is being tested. However, the functioning of the termination depends to a large extent on the length of a line connected to the device that is being tested. As illustrated in FIG. 30, the signal contacts 74S can be at different distances from the damping circuit, as measured along a length that current flows in the circuit, and can be used without a termination damping circuit. Furthermore, the signal contacts 74S can be spaced differently from one application to another, for example, by 10 inches in one application and 18 inches in another application, and the same damping circuit will reduce ringing in each application.

Figure 32:
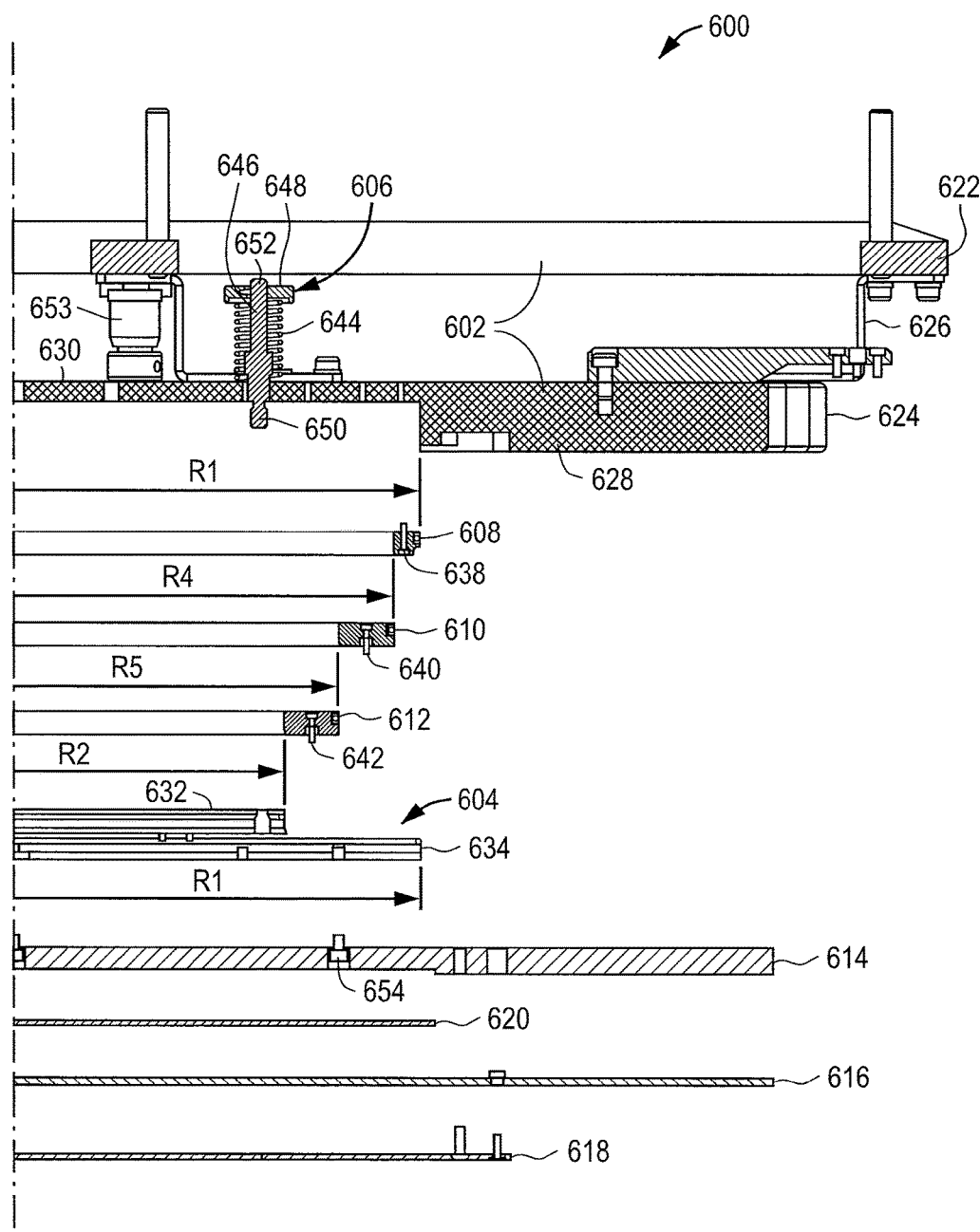
FIG. 32 is a cross-sectional side view illustrating components of a right half of a replaceable cartridge, according to an alternative embodiment of the invention, in exploded form.

FIG. 32 illustrates components of a cartridge 600, according to another embodiment of the invention, including a cartridge frame 602, a piston 604, a piston adjustment system 606, first, second and third volume-defining rings 608, 610, and 612, a stiffener substrate 614, a distribution board 616, a contactor board 618, and a stand-off layer 620.

The cartridge frame 602 includes upper support pieces 622, a lower backing plate 624, and connecting pieces 626 that connect the lower backing plates 624 to the upper support pieces 622. The lower backing plate 624 defines a side portion 628 and a rear portion 630 of a cylinder having an internal radius R1.

The piston 604 has an internal portion 632 and an external portion 634. The internal portion 632 has an outside radius R2 that is substantially smaller than the radius R1. The external portion 634 is mounted on a lower side of the internal portion 632 and also has an outside radius R1.

The first volume-defining ring 608 has an outer radius R1, which is the same as the internal radius of the cylinder defined by the side portion 628. The first and second volume-defining rings 608 and 610 have the same internal and external radii R4 respectively and the second and third volume-defining rings 610 and 612 have the same internal and external radii R5 respectively. The third volume-defining ring 612 has an internal radius R2, which is the same as the external radius R2 of the internal portion 632 of the piston 604.

A fastener 638 is inserted from below through the first volume-defining ring 608. Fasteners 640 and 642 are inserted from above into the second and third volume-defining rings 610 and 612 respectively.

Figure 33:
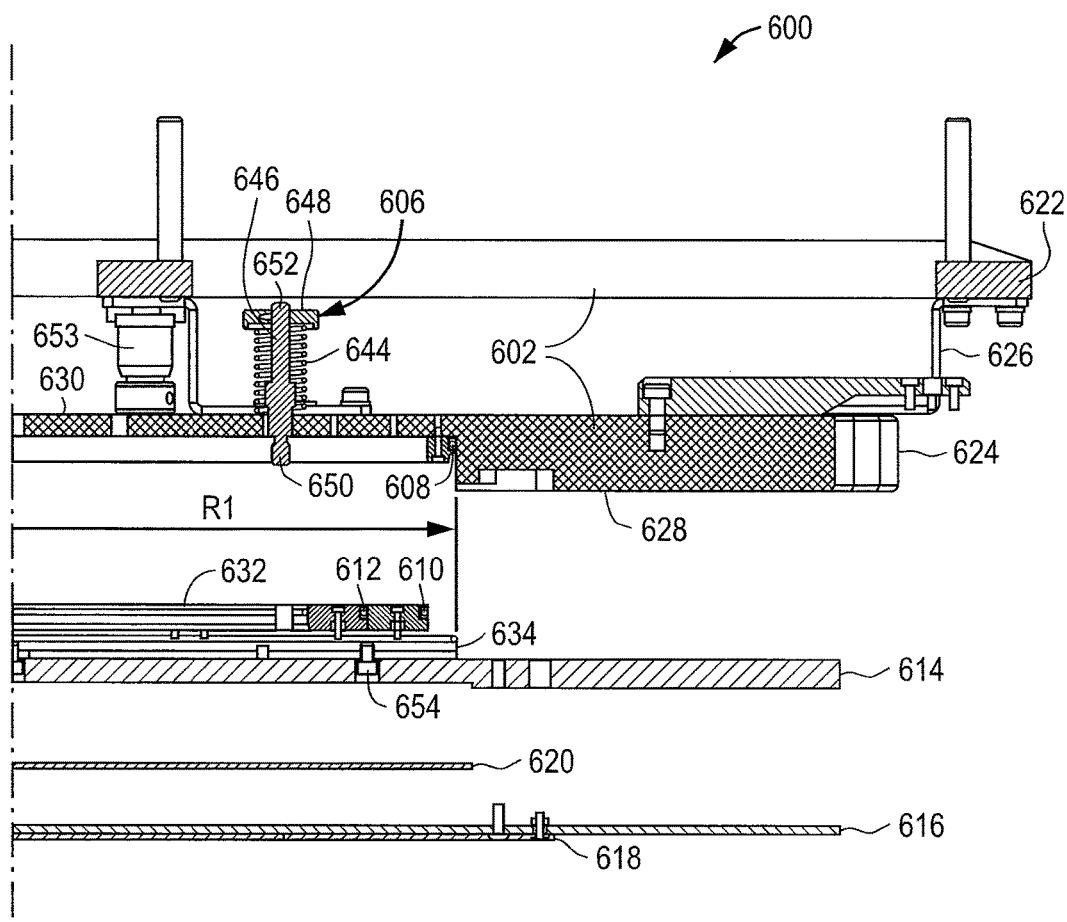
FIG. 33 is a view similar to FIG. 32, after a distribution board and a contactor board are secured to one another and volume-defining rings are secured to a lower backing plate of a piston and a force distribution substrate is secured to the piston.

As shown in FIG. 33, the first volume-defining ring 608 is inserted into the cylinder defined in the lower backing plate 624 and the fastener 638 is used to secure the first volume-defining ring 608 to the rear portion 630 of the cylinder. The lower backing plate 624 and the first volume-defining ring 608 thereby form a structural unit.

The third volume-defining ring 612 is positioned over the internal portion 632 and the second volume defining ring 610 is positioned over the third volume-defining ring on an upper surface of the external portion 634. The second and third volume-defining rings 610 and 612 are then secured to the external portion 634 with the fasteners 640 and 642 respectively. The third volume-defining ring 612 effectively increases the radius of the internal portion 632 of a main piston from the radius R2 to the radius R5 and the second volume-defining ring 610 effectively increases the radius from R5 to R4. The second and third volume-defining rings 610 and 612 thus increase the upper surface of the internal portion 632 of the piston 604 proportional to the square of the radius.

The stiffener substrate 614 is made of a metal and is thicker than the distribution board 616, contactor board 618 and stand-off layer 620 alone or in combination. The stiffener substrate 614 also has a larger surface area than the external portion 634 of the piston 604. The stiffener substrate 614 is positioned against a lower surface of the external portion 634 of the piston 604 and fasteners 642 are used to secure the stiffener substrate 614 to the piston 604.

The distribution board 616 and the contactor board are secured to one another and may be of the kind herein before described with reference to FIG. 4. A primary difference between the distribution board 616 and the distribution board 48 in FIG. 4 is that the distribution board 48 of FIG. 4 has an interface of contacts 58 on a lower surface thereof, whereas the distribution board 616 of FIG. 32 has an interface of contacts on an upper surface thereof.

The piston adjustment system 606 includes a spring 644 and a spring adjustment mechanism formed by an elongate member 646 and a nut 648. The elongate member 646 has a first end 650 and a second, opposing end 652. Both ends 650 and 652 are threaded. The first end 650 is inserted through an opening in the rear portion 630 of the cylinder so that the first end 650 is located within the cylinder and the second end 652 is located outside the cylinder. The spring 644 is a coil spring that is positioned over the elongate member 646. The nut 648 has an internal thread that is screwed onto the external thread of the second end 652 of the elongate member 646.

Figures 34, 35:
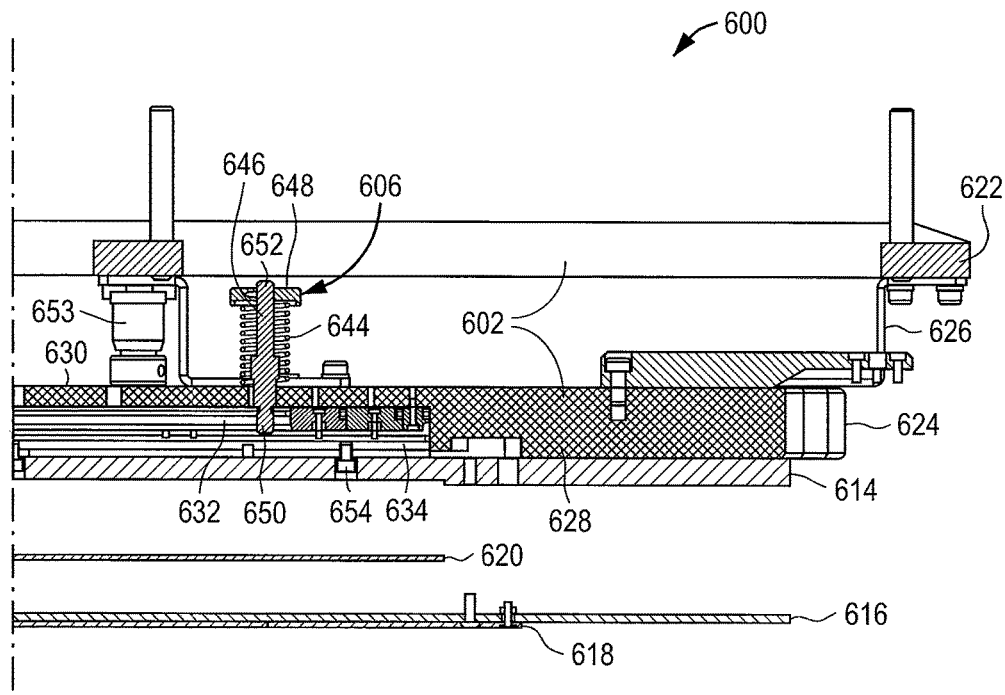
FIG. 34 is a view similar to FIG. 33, showing assembly of common and unique subassemblies of the cartridge.
FIG. 35 is a top plan view, illustrating springs that are used to level the piston.

As shown in FIG. 34, the internal portion 632 and the second and third volume-defining rings 610 and 612 are inserted into the cylinder and the first end 650 of the elongate member 646 is screwed into a threaded opening in the internal portion 632. The nut 648 is tightened so that the spring 644 compresses. The spring 644 is thus connected through the nut 648 and elongate member 646 to the piston 604.

FIG. 35 illustrates that three springs 644 are connected to the piston 604. Although not shown in detail, each one of the springs 644 forms part of a respective piston adjustment system. The forces created by the springs 644 are combined to overcome a gravitational force of the piston 604 and all components that are eventually mounted to the piston 604 so that the piston is initially seated against the rear portion 630 of the cylinder. When a pressure is applied on an upper surface of the piston 604, the piston will move downward away from the rear portion 630 of the cylinder and the springs 644 will further compress. Certain areas of the piston 604 may be heavier than other portions thereof so that the piston 604 may have a tendency to droop in certain areas relative to the cylinder. The nuts holding respective ones of the springs 644 can be independently tightened to level the piston 604 relative to the cylinder.

FIG. 35 further illustrates the positioning of three micrometers 653. The springs 644 are located at 0°, 120°, and 240° about a center point of the piston 604. The micrometers 653 are located at 60°, 180°, and 300° about a center point of the piston 604. Referring again to FIG. 34, bodies of the micrometers 653 are mounted on an upper surface of the rear portion 630 defining the cylinder. Adjustable tips of the micrometers 653 extend through the rear portion 630 past a lower surface of the rear portion 630 into the cylinder. The tips are used as mechanical stops for the piston 604 when the piston 604 is retracted into its uppermost position in the cylinder. The tips can be adjusted in a controlled manner to level the piston 604 and adjust the positioning of the piston 604 when it reaches its uppermost position in the cylinder. Precise positioning of the piston 604 is important, so that a camera forming part of the probing assembly 16 in FIG. 1 can find an accurate reference position for the piston 604 when imaging the contactor 618.

Figure 36:
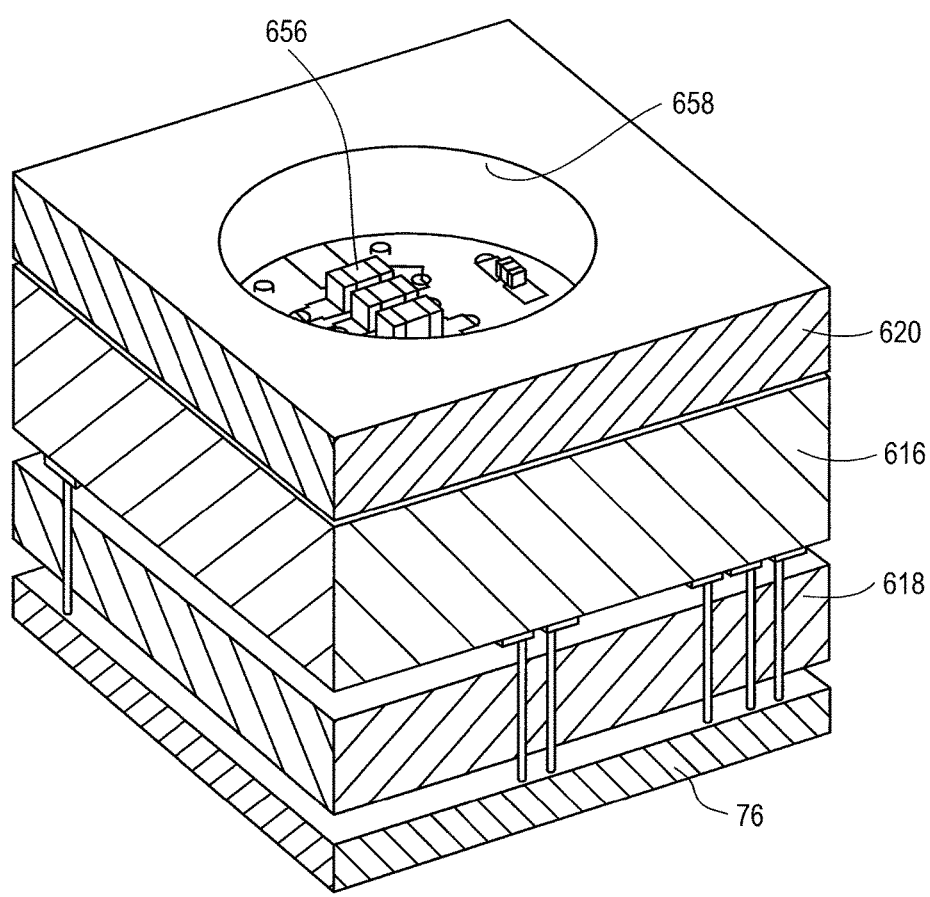
FIG. 36 is a perspective view, illustrating the use of stand-off layer with openings over electric components.

FIG. 36 shows a portion of the distribution board 616, contactor board 618, stand-off layer 620, and a wafer 76. A contactor board assembly jointly formed by the distribution board 616, contactor board 618 and the stand-off layer 620 further includes a plurality of components 656 that are mounted on and stand above an upper surface of the distribution board 616. The components 656 may, for example, include resistors, capacitors, diodes, or other electrical components.

The stand-off layer 620 has an opening 658 formed therein and is positioned on top of the distribution board 616 with the components 656 in the opening 658. The stand-off layer 620 is not attached to an upper surface of the distribution board 616 and can be removed from the distribution board 616. Alternatively, a separate stand-off layer may be located against and be attached to the distribution board 616.

Figure 37:
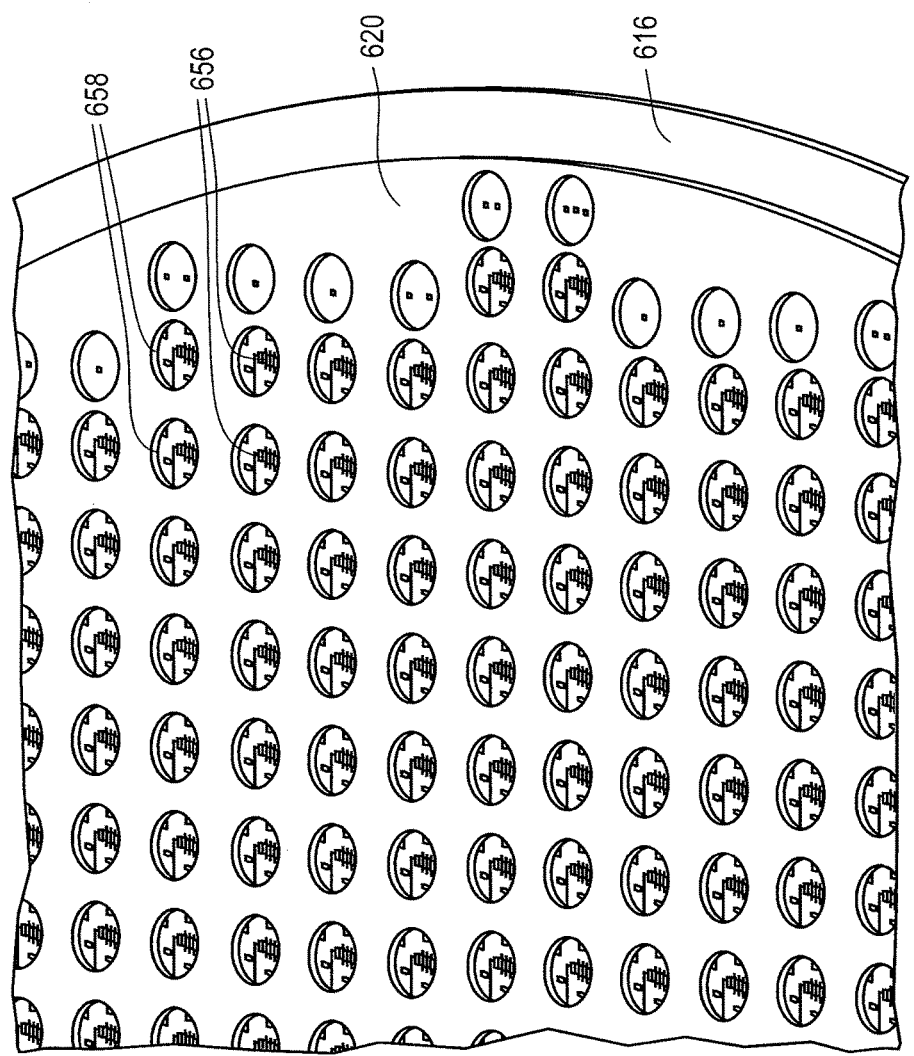
FIG. 37 is a perspective view similar to FIG. 36, illustrating more openings in the stand-off layer.

As shown in FIG. 37, the stand-off layer 620 has a plurality of openings 658 formed therethrough, and the electrical components 656 are located within each one of the openings 658. The openings 658 are primarily located in an array of rows and columns. A circuit layout of the components 656 is in the form of an array that is repeated from one opening 658 to the next.

The location of the components 656 on top of the distribution board 616 saves space that would be taken up should the component 656, for example, be mounted between the distribution board 616 and the contactor board 618. The stand-off layer 620 forms a component through which a force can be transferred from the stiffener substrate 614 in FIG. 34 through an upper surface of the stand-off layer 620 to an upper surface of the distribution board 616 without damaging the components 656.

Figure 38:
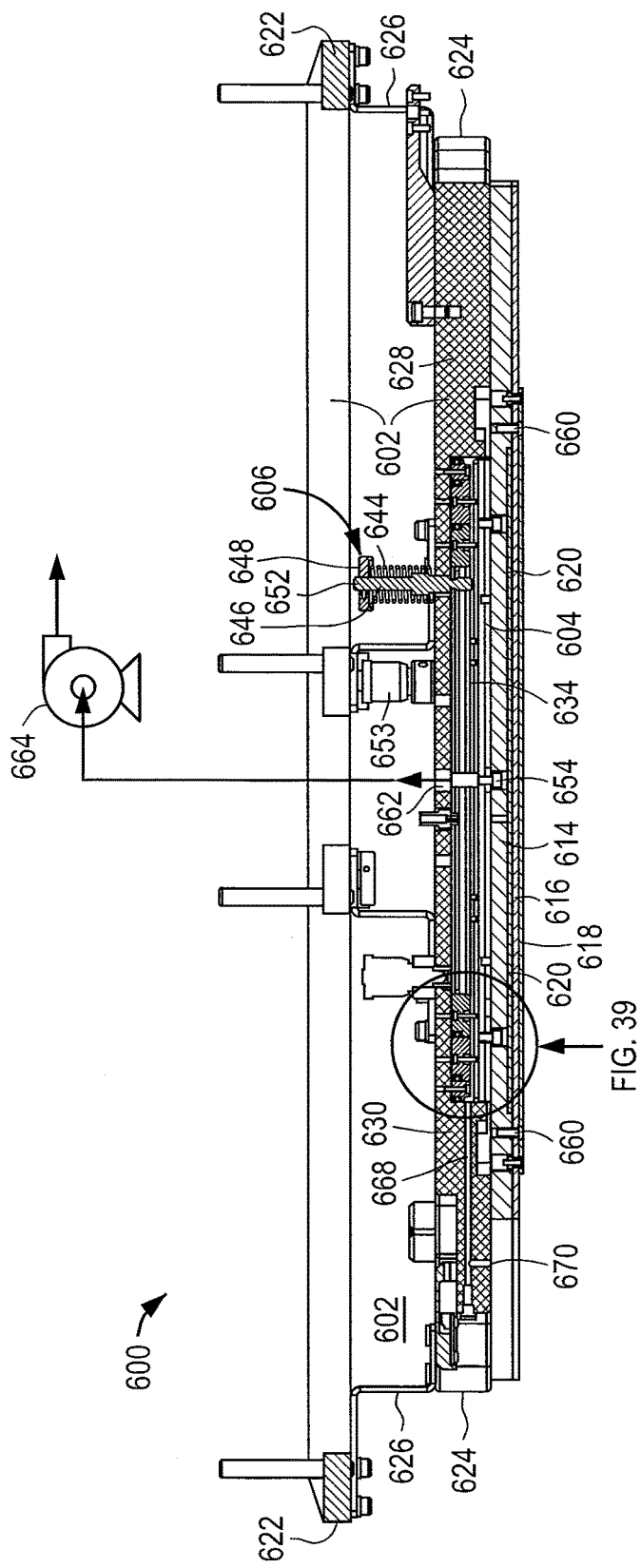
FIG. 38 is a view similar to FIG. 34, showing right and left halves of the cartridge after final assembly and with a pump connected to the cartridge.

As shown in FIG. 38, the distribution board 616 is subsequently mounted to the stiffener substrate 614 with the stand-off layer 620 between the distribution board 616 and the stiffener substrate 614. Fasteners 660 are used to mount the distribution board 616 to the stiffener substrate 614. The top portion of the cartridge 600 down to the stiffener substrate 614 form an assembly that will be common to all applications, although the components of the common subassembly may be connected to one another differently, depending on the application. The lower portion of the cartridge 600 from the stand-off layer 620 down to the contactor 618 form a subassembly that will be uniquely designed depending on application. The uniquely designed portion of the cartridge 600 can be removed by loosening the fasteners 660, and can be replaced with another uniquely designed subassembly, to again complete a cartridge such as the cartridge 600. The cartridge 600 is first removed from the apparatus frame to facilitate replacement of a first unique contactor subassembly with a second unique contactor subassembly, whereafter a second cartridge including the second unique contactor subassembly is again removably mounted to the apparatus frame.

Sections of a vacuum passage 662 are formed through the rear portion 630 of the cylinder, the piston 604, and the stiffener substrate 614. An outlet of the vacuum passage 662 is connected to a pump 664. When the pump 664 is switched on, a vacuum is created in a space between the piston 604 and the stiffener substrate 614 and in cavities between the stiffener substrate 614 and the distribution board 616. Because of the vacuums that are created, the stiffener substrate 614 and the piston 604 are pulled against one another and the distribution board 616 is pulled against the stiffener substrate 614. The stiffener substrate 614 is manufactured so that lower surfaces thereof are planar to a tight degree of tolerance. The distribution board 616 is a printed circuit board, which is typically manufactured to be planar to between 5 and 20 mils per inch. However, by pulling the distribution board 616 against the stiffener substrate 614 with the vacuum, the distribution board 616 has a planarity that is less than 1 mil per inch.

Figure 39:
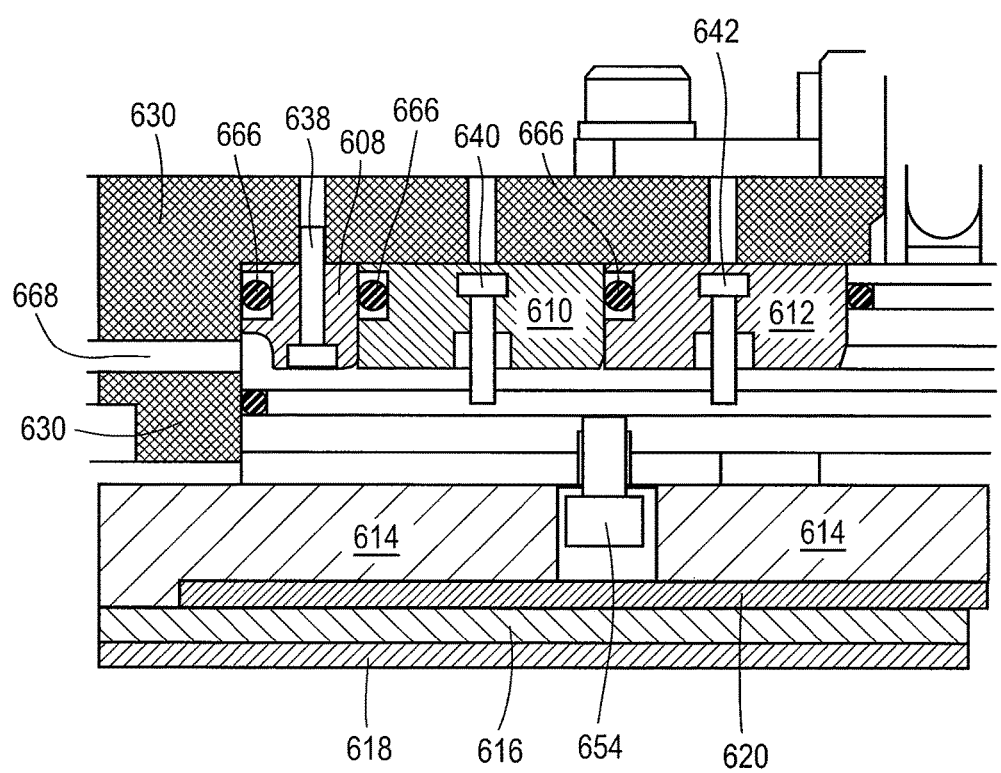
FIG. 39 is a cross-sectional side view of a portion marked "detail A" in FIG. 38.

As shown in FIG. 39, O-rings 666 are located between the volume-defining rings 608, 610, and 612 and between the volume-defining ring 608 and the side portion of the cylinder. A pressure and vacuum actuation passage 668 is formed in the lower backing plate 624 and has first and second ends 670 and 672 as shown in FIG. 38. The first end 670 is located on a lower surface of the lower backing plate 624 and the second end 672 is located on an inner surface of the side portion 628 of the cylinder just below a lower surface of the first volume-defining ring 608. A fluid line (not shown) is connected to the second end 672.

Figure 40:
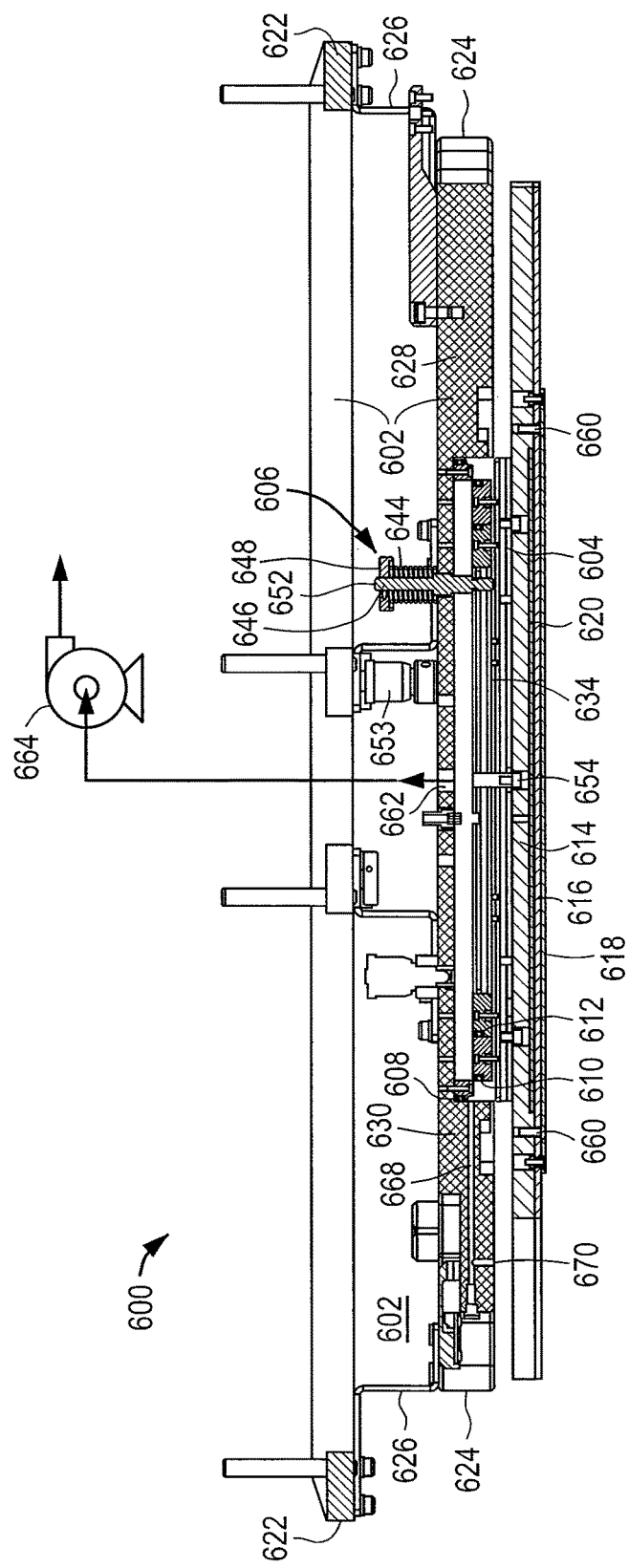
FIG. 40 is a view similar to FIG. 38, illustrating how a force is created by the piston when two of the volume-defining rings are secured to the piston.

FIG. 40 illustrates how the cylinder formed by the rear portion 630 and the side portion 628, the volume-defining rings 608, 610, 612, and the piston 604 form an actuator that moves the stiffener substrate 614 relative to the cartridge frame 602. A pressure is applied through the pressure and vacuum actuation passage 668 to a space between a lower surface of the first volume-defining ring 608 and a corresponding area on an upper surface of the external portion 634 of the piston 604. Upper surfaces of the internal portion 632 of the piston 604 and the second and third volume-defining rings 610 and 612 remain only slightly below ambient pressure. A force is created with a magnitude equal to the pressure that is applied to the pressure and vacuum actuation passage 668 and a surface area of the lower surface of the first volume-defining ring 608. The force is used to move the piston 604 downward against a spring force of springs on the contactor board 618 and spring forces of the springs 644 in FIG. 35. The elongate member 646 and the nut 648 move downward together with the piston 604 relative to the cartridge frame 602, thereby compressing the spring 644 between the nut 648 and the lower backing plate 624. When the pressure and vacuum actuation passage 668 returns to ambient pressure, the spring forces are not large enough to return the piston 604 to the position shown in FIG. 38. When a pressure below ambient pressure is applied to the pressure and vacuum actuation passage 668, the piston 604 moves from its position shown in FIG. 40 to its position shown in FIG. 38.

Figure 41:
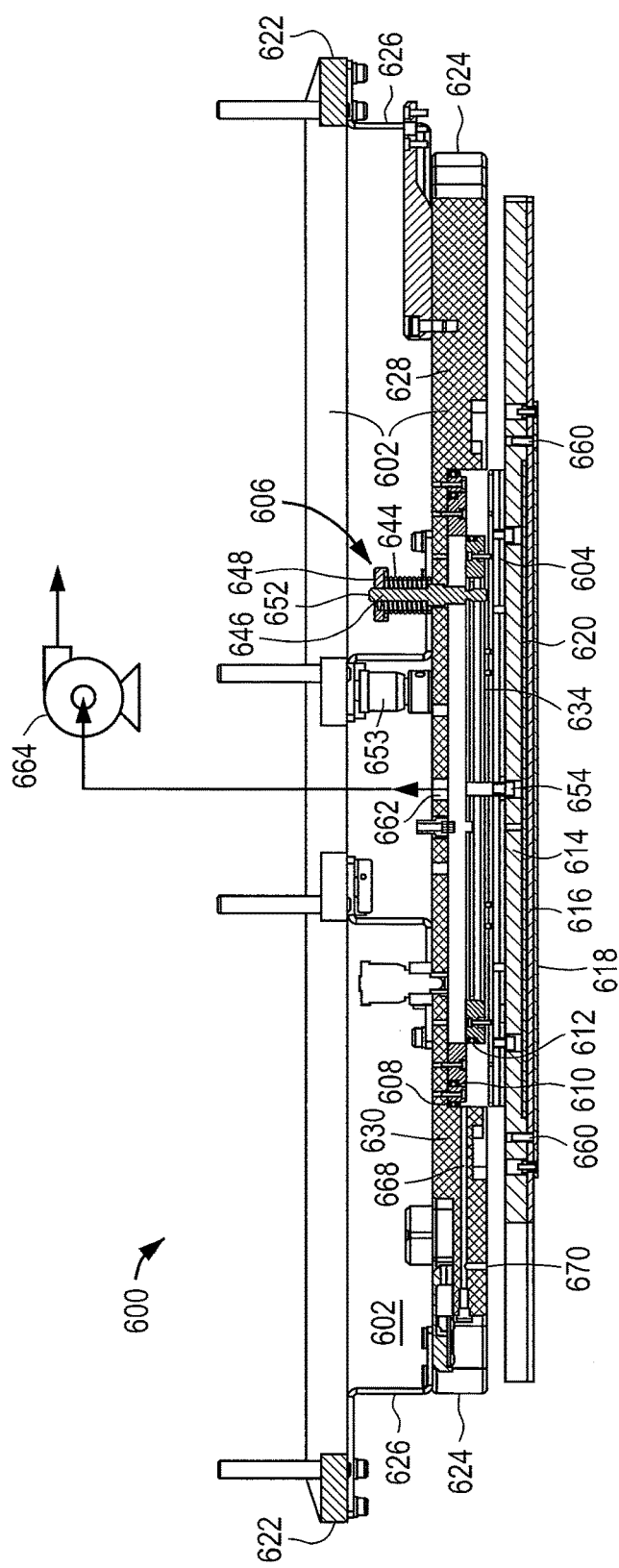
FIG. 41 is a view similar to FIG. 40, showing how a force is created by the piston when only one of the volume-defining rings is secured to the piston.

FIG. 41 shows how the force created by the piston 604 can be increased without increasing the pressure within the pressure and vacuum actuation passage 668. The piston 604 is removed from the lower backing plate 624 as shown in FIG. 33. The second volume-defining ring 610 is removed by unscrewing the fastener 640 from the external portion 634 of the piston 604. The second volume-defining ring 610 is then flipped over and inserted within the first volume-defining ring 608, where after the fastener 640 is screwed into the rear portion 630 of the cylinder. The cartridge 600 is then reassembled as shown in FIG. 38, except that the second volume-defining ring 610 is secured to the lower backing plate 624 and not the piston 604.

A pressure is applied through the pressure and vacuum actuation passage 668 to an area below lower surfaces of the first and second volume-defining rings 608 and 610. An upper surface of the external portion 634 having the same surface area as the combined surface areas of the lower surfaces of the first and second volume-defining rings 608 and 610 is also exposed to the pressure applied through the pressure and vacuum actuation passage 668. Because a larger surface area of the piston 604 is exposed to the pressure applied to the pressure and vacuum actuation passage 668 in FIG. 41 than in FIG. 39, the force applied by the piston 604 is proportional to the pressure multiplied by the surface area that is exposed to the pressure, a larger force is created by the piston in the configuration of FIG. 41 than in the configuration of FIG. 39.

An even larger force can be created by the piston 604 by mounting the third volume-defining ring 612 to the rear portion 630 of the cylinder instead of the piston 604.

The O-rings 666 shown in FIG. 39 serve the purpose of isolating the high pressure below the lower surface of the first volume-defining ring 608 from almost ambient pressure above upper surfaces of the second and third volume-defining rings 610 and 612, while allowing for sliding movement of the second volume-defining ring 610 relative to the first volume-defining ring 608. The O-rings 666, however, lead to static friction and therefore non-linear force created by the piston 604.

Figure 42:
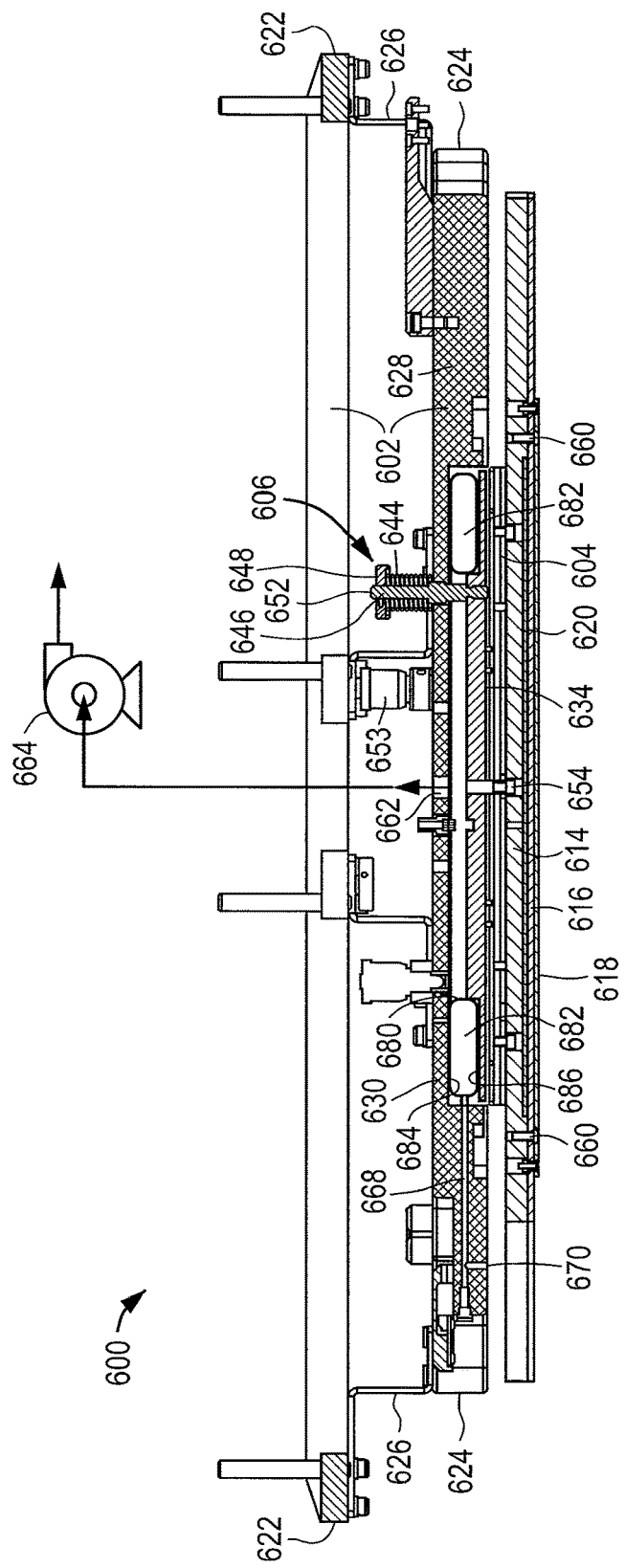
FIG. 42 is a cross-sectional side view similar to FIG. 40 of a further embodiment of the invention, utilizing an inflatable and deflatable bladder to reduce static friction.

FIG. 42 illustrates an alternative embodiment wherein the volume-defining rings 608, 610, and 612 of FIG. 39 are replaced with an actuator bladder 680. The actuator bladder 680 forms a toroidal ring around the internal portion 632 of the piston 604 and is located between an upper surface of the external portion 634 of the piston 604 and a lower surface of the rear portion 630. The pressure and vacuum actuation passage 668 is connected to an internal volume 682 of the actuator bladder 680. Upper and lower sides 684 and 686 of the actuator bladder 680 move away from one another when the actuator bladder 680 is inflated through the pressure and vacuum actuation passage 668, and move toward one another when air is removed from the internal volume 682 through the pressure and vacuum actuation passage 668. Movement of the sides 684 and 686 away from one another causes downward movement of the piston 604. The pressure within the internal volume 682 can also create a force that is counteracted by spring forces of springs in the contactor board 618 and spring forces of the springs 644.

An advantage of the actuator bladder 680 is that no static friction is created and the force created by the actuator bladder 680 is therefore linear. An advantage of the volume-defining rings 608, 610, and 612 is that a cross-sectional surface area of the volume of an actuator normal to the direction of movement of the piston 604 relative to the cylinder defined by the rear portion 630 and the side portion 628 can be modified, and such modification will cause a corresponding modification in force that is applied by the piston 604.

Figure 43:
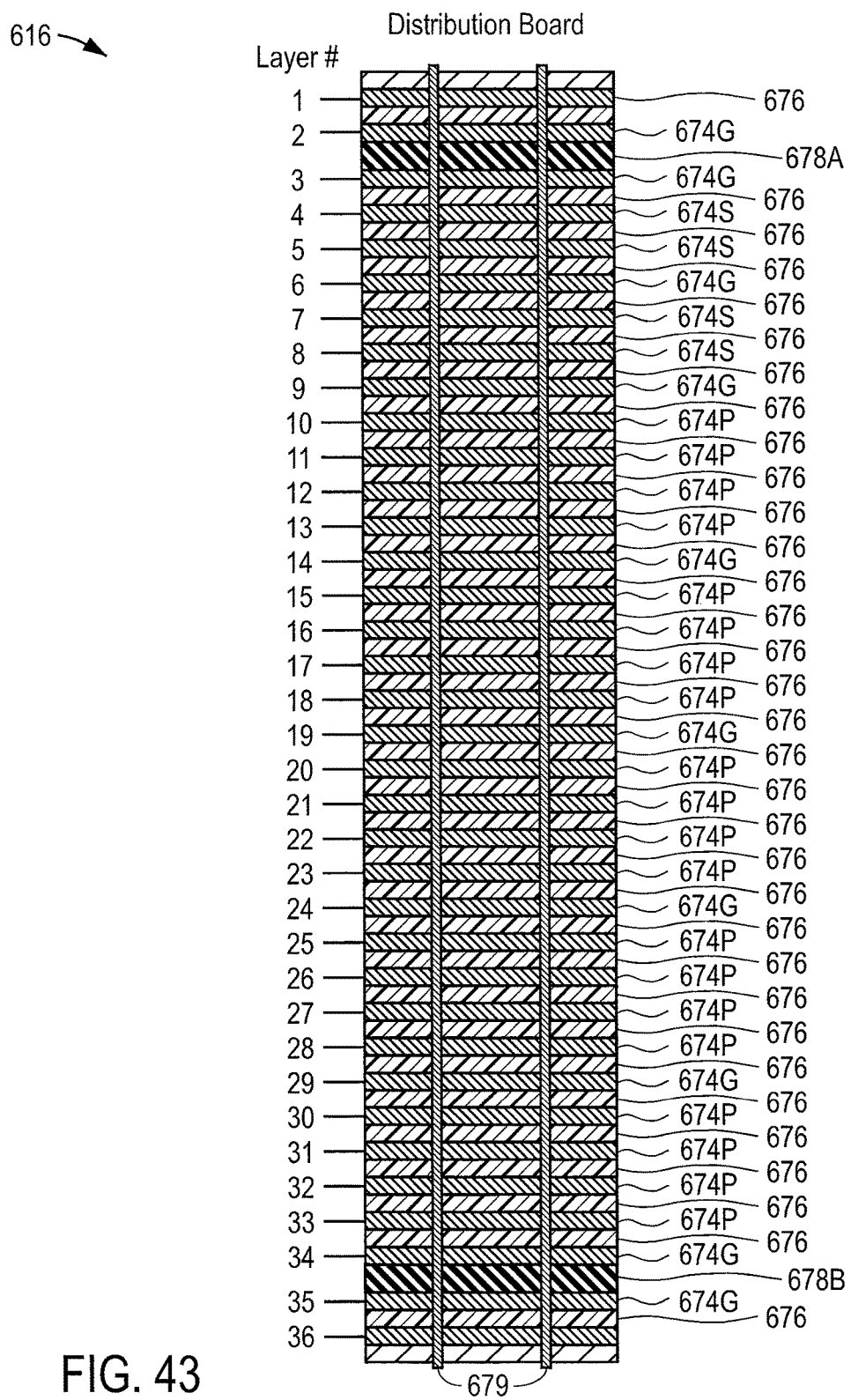
FIG. 43 is a cross-sectional side view of a portion of the distribution board.

FIG. 43 illustrates the distribution board 616 in more detail. The distribution board 616 includes a plurality of horizontal layers 674G, 674S, 674P, 676, 678A, and 678B located vertically on top of one another, and a plurality of vertical vias 679 extending through the layers. The layers include metal layers in the form of ground layers 674G, signal layers 674S, and power layers 674P, and the plurality of insulating layers including laminate layers 676 and coefficient of thermal expansion (CTE) controlled layers 678A and 678B from a material such as invar. A total of n (in this example, 36) metal layers 674G, 674S, and 674P are included, which are alternated by a total of n−1 (in this example, 35) insulating layers 676, 678A and 678B.

Each one of the metal layers 674G, 674S, and 674P, in isolation, has about the same stiffness as every other metal layer 674G, 674S, and 674P. Each one of the laminate layers 676, in isolation, also has approximately the same stiffness. The CTE controlled layer 678A in the top half of the distribution board 616, in isolation, has higher stiffness than any one of the metal layers 674G, 674S, 674P, or any one of the laminate layers 676. The CTE controlled layer 678A also has a lower CTE than any one of the laminate layers 676 or the metal layers 674G, 674S, or 674P, so that the overall CTE of the distribution board 616 is between that of the CTE controlled layer 678A and that of one of the laminate layers 676 or metal layers 674G, 674S, or 674P. The CTE controlled layers 678A and 678B combine to reduce the overall CTE of the distribution board 616. The number or thicknesses of the CTE controlled layers can be increased to further decrease the overall CTE of the distribution board 616. The CTE controlled layer 678A and the CTE controlled layer 678B in the bottom half of the distribution board 616 have approximately the same stiffnesses, each in isolation. The CTE controlled layers 678A and 678B provide the distribution board 616 with additional stiffness, and therefore more planarity. The CTE controlled layer 678A at the top is particularly useful for providing the distribution boards 616 with additional stiffness and planarity, because it is located on the outside of the contactor board assembly formed by the distribution board 616 and contactor board 618 shown in FIG. 33.

Each one of the horizontal layers 674P is a power layer that is separately connected to one of the vias 679. Each one of the layers 674G is a ground layer, and all the ground layers are connected to a common via 679. Current cannot conduct from one of the power vias 679 to one of the ground vias 679. A respective capacitor connects each one of the power vias 679 to each one of the ground vias 679, and may be one of the electric components 656 shown in FIG. 36. Each one of the metal layers 674S is a signal layer. Two or more signal layers 674S are connected to each one of the vias 679. The signal layers 674S are electrically disconnected from both the power layers 674P and the ground layers 674G.

Figure 44:
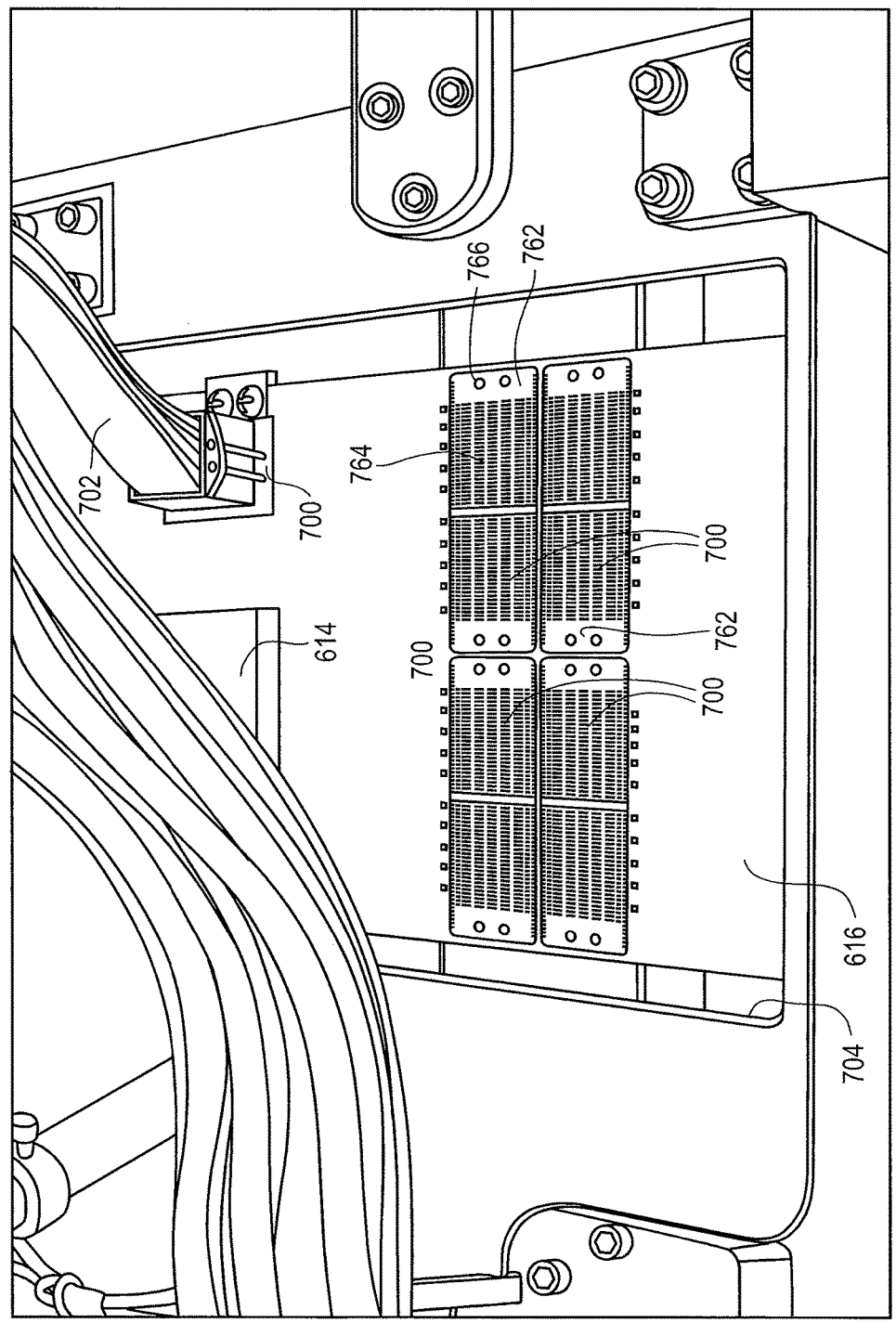
FIG. 44 is a perspective view, showing a flexible attachment connected to the distribution board of the cartridge.

FIG. 44 illustrates a plurality of substantially identical contactor interfaces 700 and a flexible attachment 702 connected to one of the contactor interfaces 700. The contactor interface 700 is formed on an upper surface of the distribution board 616 in an area outside of the stiffener substrate 614. An opening 704 is formed in the lower backing plate 624. A first end of the flexible attachment 702 is inserted through the opening 704 so that the first end of the flexible attachment 702 can reach the contactor interface 700. An opposite end of the flexible attachment 702 is connected to a connector array module such as the first connector sets 44 in FIG. 17.

Figure 45:
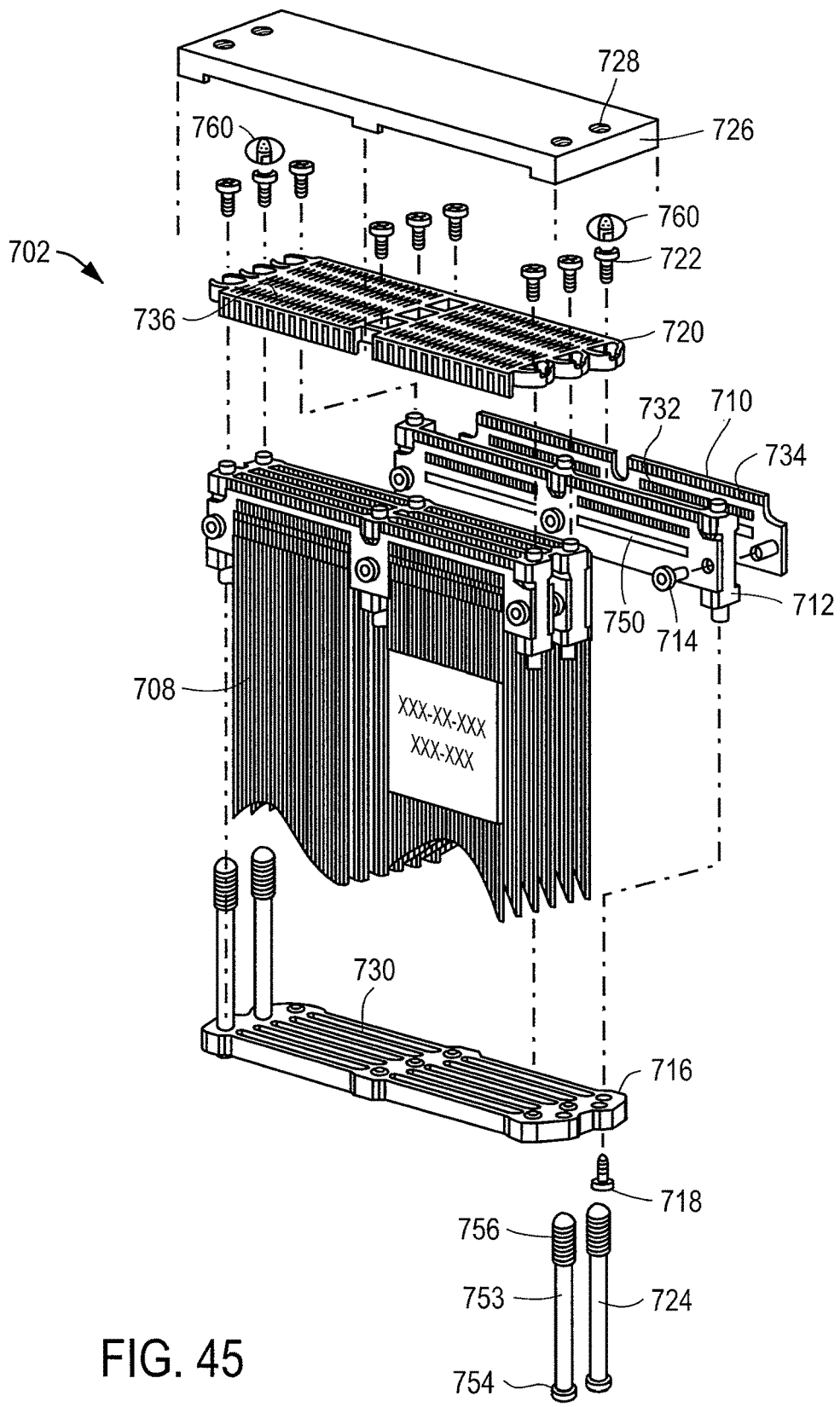
FIG. 45 is a perspective view, showing components of the flexible attachment in exploded form.

FIG. 45 shows components of the first end of the flexible attachment 702, including a plurality of flexible cables 708, a plurality of printed circuit boards 710, a plurality of metal end pieces 712, a first plurality of fasteners 714, a metal holding piece 716, a second plurality of fasteners 718, a plurality of caps 720, a third plurality of fasteners 722, and a fourth plurality of fasteners 724. FIG. 45 also shows a stiffener plate 726 having a plurality of threaded openings 728.

Each one of the flexible cables 708 is inserted through a respective opening 730 in the holding piece 716. Two of the flexible cables 708 are secured to each one of the printed circuit boards 710. The fasteners 714 secure two of the printed circuit boards 710 to each one of the metal end pieces 712. Three of the metal end pieces 712 are used to secure two of the printed circuit boards 710 to one another. The fasteners 718 are then used to secure each one of the metal end pieces 712 to the holding piece 716. Each one of the caps 720 is subsequently positioned over a respective one of the printed circuit board 710. A connector body is thereby formed by the holding piece 716, the metal end pieces 712, connected to substantially parallel connector body substrates of the printed circuit boards 710, and the caps 720.

The fasteners 722 are used to secure the caps 720 to the metal end pieces 712. Each one of the caps 720 can be independently removed in order to replace either the cap 720 that is being removed or the printed circuit board 710 to which the cap 720 is secured. The fasteners 724 are used to secure the holding piece 716 to the distribution board 616 in FIG. 44.

A plurality of signal and ground conductors are held by the connector body. Each signal conductor includes one of a plurality of signal cores (not shown in FIG. 45), in each one of the flexible cables 708, a respective signal contact 732 on the substrate of one of the printed circuit boards 710, a respective edge finger 734 on an edge of the substrate of the printed circuit board 710, and a respective contact 736 on one of the caps 720.

Figure 46:
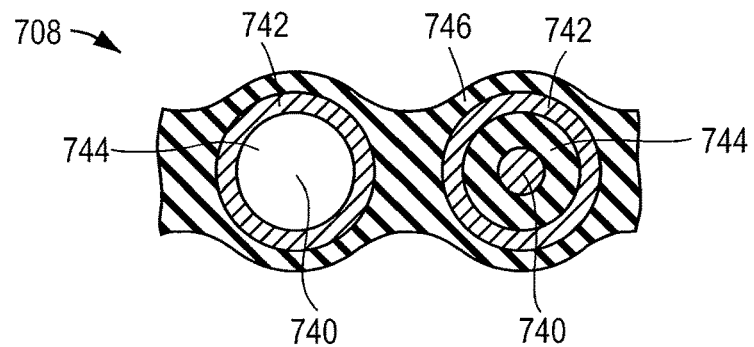
FIG. 46 is a cross-sectional side view of a flexible cable forming part of the flexible attachment.
Figure 47:
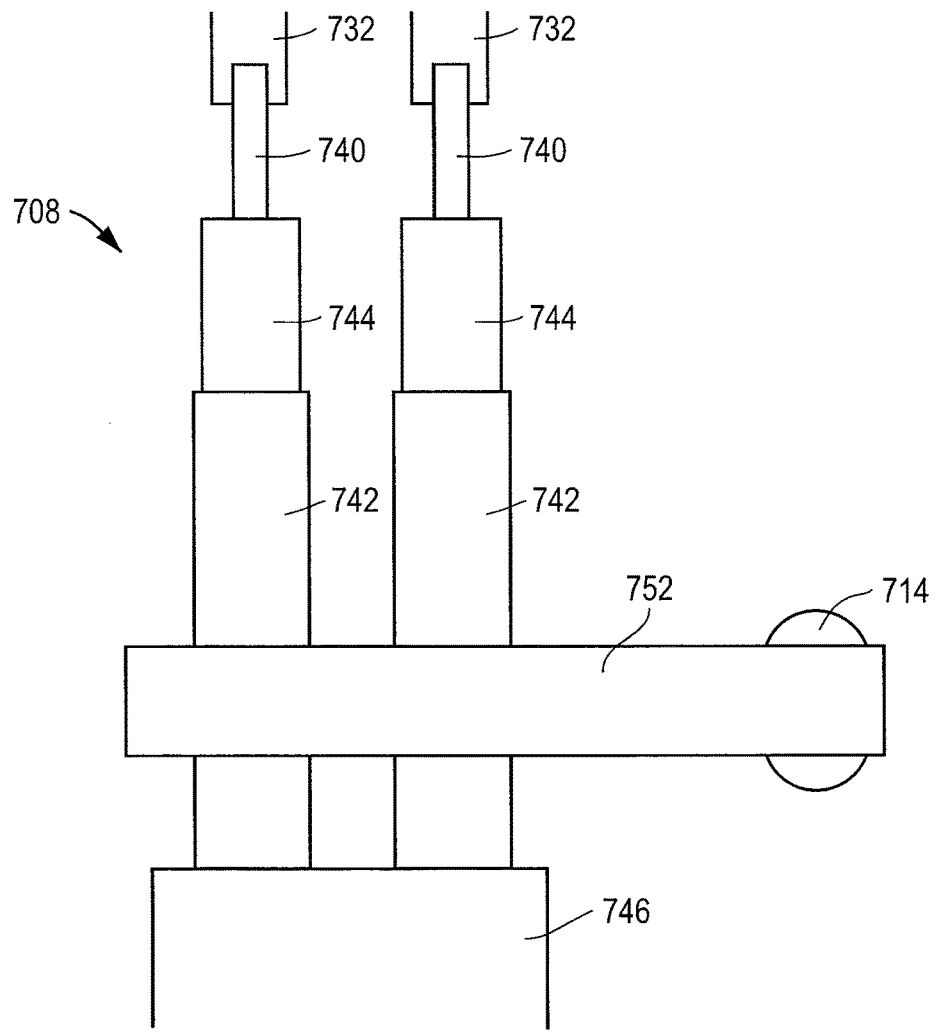
FIG. 47 is a top plan view of a portion of the flexible cable, illustrating how ground conductors thereof are connected to one another.

As shown in FIGS. 46 and 47, each flexible cable 708 is a coaxial cable having a plurality of conductive signal cores 740, a plurality of ground conductors 742 that are coaxially located around the respective conductive signal cores, a plurality of separating insulating layers 744, each separating a respective conductive signal core 740 from a respective ground conductor 742, and an outer insulating sheet 746.

Each ground conductor 742 protrudes from an end of the insulating sheet 746. Each conductive signal core 740 protrudes from a respective one of the ground conductors 742. Each one of the conductive signal cores 740 is independently soldered to a respective one of the signal contacts 732. Each one of the ground conductors 742 is also soldered to a ground contact 750 shown in FIG. 45. A solder bar 752 is used to connect the ground conductors 742 electrically to one another so that the ground conductors 742 are at the same reference voltage. The solder bar 752 extends to the fastener 722, which connects the solder bar 752 electrically to one of the metal end pieces 712 in FIG. 45. Each one of the metal end pieces 712 is electrically connected to the holding piece 716, so that the ground conductors 742 connected to all of the printed circuit boards 710 are also electrically connected to the holding piece 716. A large conductor is provided by the combined metal of all the ground conductors 742. Although a large conductor is formed by the ground conductors 742, the separation of the individual ground conductors 742 from one another allows for the flexible cables 708 to remain more flexible than if a single ground conductor is used having the same amount of metal as all the ground conductors 742 combined.

Traces are formed within each one of the printed circuit boards 710 that connect the ground contacts 750 to edge fingers 734 that are not used for signals. Ground can thus be provided through the flexible cable 708 to the contacts 736 on the caps 720.

Referring again to FIG. 45, each one of the fasteners 724 has a shank 753, a head 754, and thread 756. The thread 756 and the head 754 are on opposite sides of the shank 753. Two of the fasteners 722 also have pins 760 extending therefrom, while other ones of the fasteners 722 do not have any pins extending therefrom.

Referring to FIGS. 44 and 45 in combination, alignment openings 762 are formed in the distribution board 616. Each one of the pins 760 is aligned with and inserted into each one of the alignment openings 762. The locations of the pins 760 and the alignment openings 762 are sufficiently precise to ensure proper contact between surfaces of contacts 736 on the caps 720 and surfaces of terminals 764 on the contactor interface 700. Openings 766 are also formed through the distribution board 616, and the shanks 753 are inserted through the openings 766 so that the heads 754 are on the front of the distribution board 616. The thread 756 protrudes from the rear of the distribution board 616 and engages with the threaded openings 728 of the stiffener plate 726. The stiffener plate 726 provides a strong mount for the flexible attachment 702 without adding stresses to the distribution board 616. The distribution board 616 is securely held or "sandwiched" between the stiffener plate 726 and the components of the flexible attachment 702. The thread in the threaded opening 766 and the thread 756 of the fasteners 724 are by themselves not manufactured to a high degree of tolerance to ensure proper contact between the contacts 736 of the caps 720 and the terminal 764 of the contactor interface 700.

What should also be noted is that the alignment openings 762 are positioned to ensure correct orientation of the connector subassembly of the flexible attachment 702. One of the alignment openings 762 at one end of the connector interface 700 is located on a center line of the connector interface 700. Another alignment opening 762 at an opposing end of the connector interface 700 is located off-center with respect to a center line of the connector interface 700. The alignment openings 762 are thus not at the same locations on both ends of the connector interface 700. The locations of the alignment pins 760 are in the same locations as the alignment pins 760. The alignment pins 760 will enter into the alignment openings 762 if the connector subassembly of the flexible attachment 702 is aligned correctly, but will be misaligned with respect to the alignment openings 762 if the connector subassembly of the flexible attachment 702 is rotated through 180 degrees and will not allow for connection between the connector interface 700 and the contacts 736.

Figure 48:
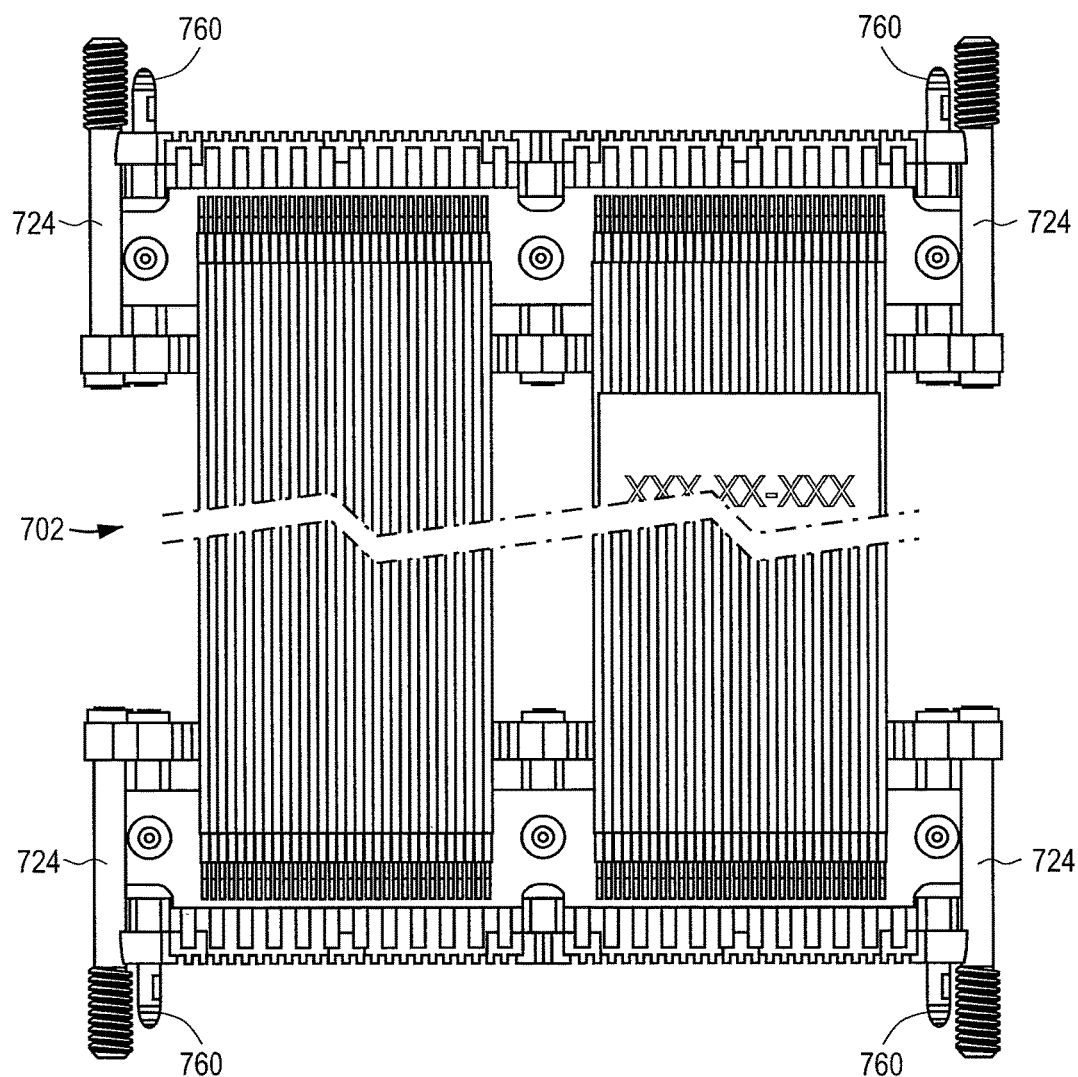
FIG. 48 is a top plan view of two connectors with the flexible cable attached to the connectors.

FIG. 48 shows that alignment pins 760 are located at opposing ends of the flexible attachment 702. The alignment pins 760 are arranged the same at both ends of the flexible attachment 702 so that an operator can reverse the direction of the flexible attachment 702 while still ensuring proper connection. Identical connectors are thus provided at both ends of the flexible cable 708.

Figure 49:
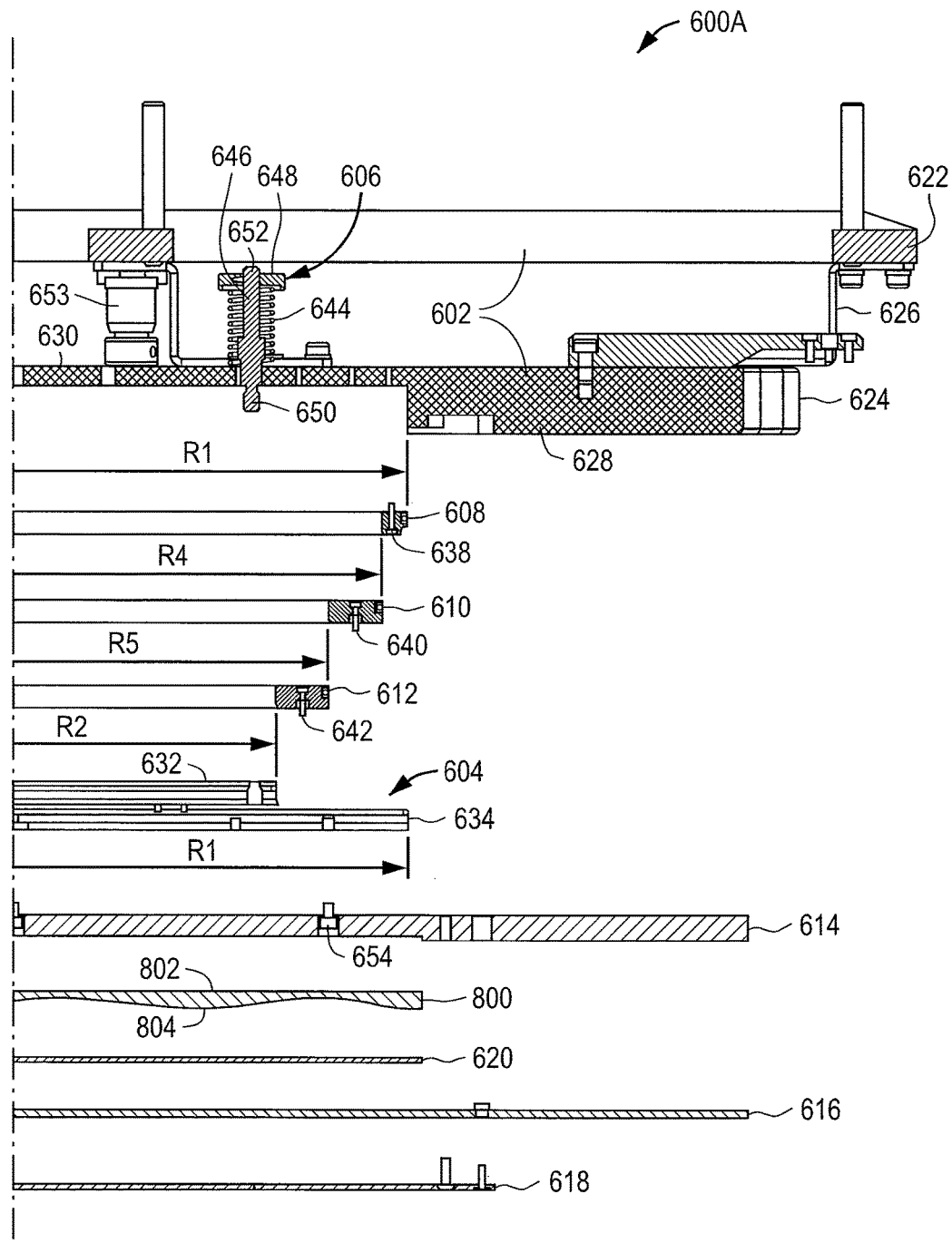
FIG. 49 is a cross-sectional side view illustrating components of a right half of a replaceable cartridge, according to a further embodiment of the invention.

FIG. 49 shows a cartridge 600A according to a further embodiment of the invention. The cartridge 600A of FIG. 49 is similar to the cartridge 600 of FIG. 32 and like reference numerals indicate like or similar components. The cartridge 600A further includes a compensating piece 800 that is located between the stiffener substrate 614 and the stand-off layer 620. The standoff-layer 620 and the stiffener substrate are thus first and second pieces of a subassembly of the cartridge 600A.

The compensating piece 800 has an upper surface 802 that is substantially flat and matches the substantially flat lower surface of the stiffener substrate 614. The compensating piece 800 has a lower surface 804 that is not flat and has an undulating profile.

Figure 50A:
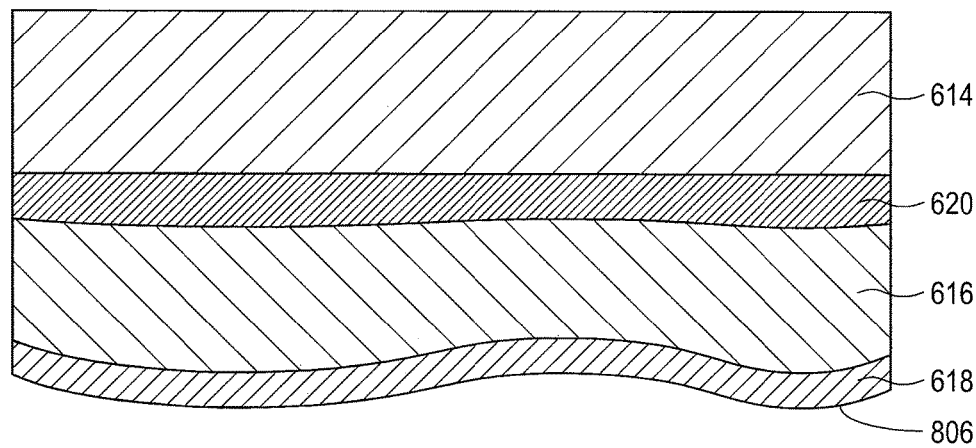
FIG. 50A is a cross-sectional side view of a portion of the cartridge of FIG. 49 before a compensating piece is included.
Figure 50B:
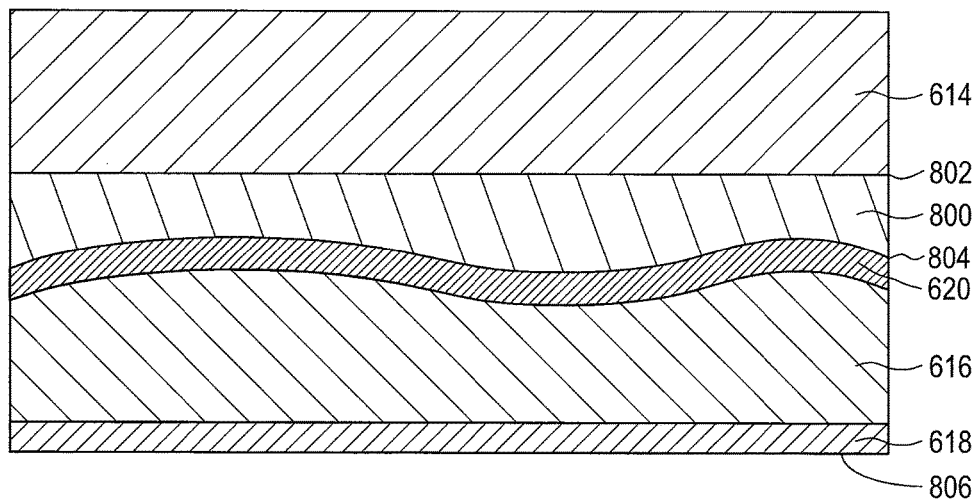
FIG. 50B is a view similar to FIG. 50A, but including the compensating piece.

As shown in FIG. 50A, without the compensating piece 800, a lower surface of the distribution board 616 and a lower surface 806 of the contactor board 618 is not planar. Non-planarity of the lower surface of the distribution board 616 and the lower surface 806 of the contactor board 618 is due to non-uniform thicknesses and due to compression of the stand-off layer 620 and the distribution board 616. FIG. 50B shows the entire subassembly including the compensating piece 800. The compensating piece 800 compensates for the non-planarity of the lower surface of the distribution board 616 and the lower surface 806 of the contactor board 618 so that the lower surface 806 is substantially planar. Specifically, the undulating lower surface 804 of the compensating piece 800 is substantially a mirror reflection of the lower surface 806 of the contactor board 618.

Figure 51:
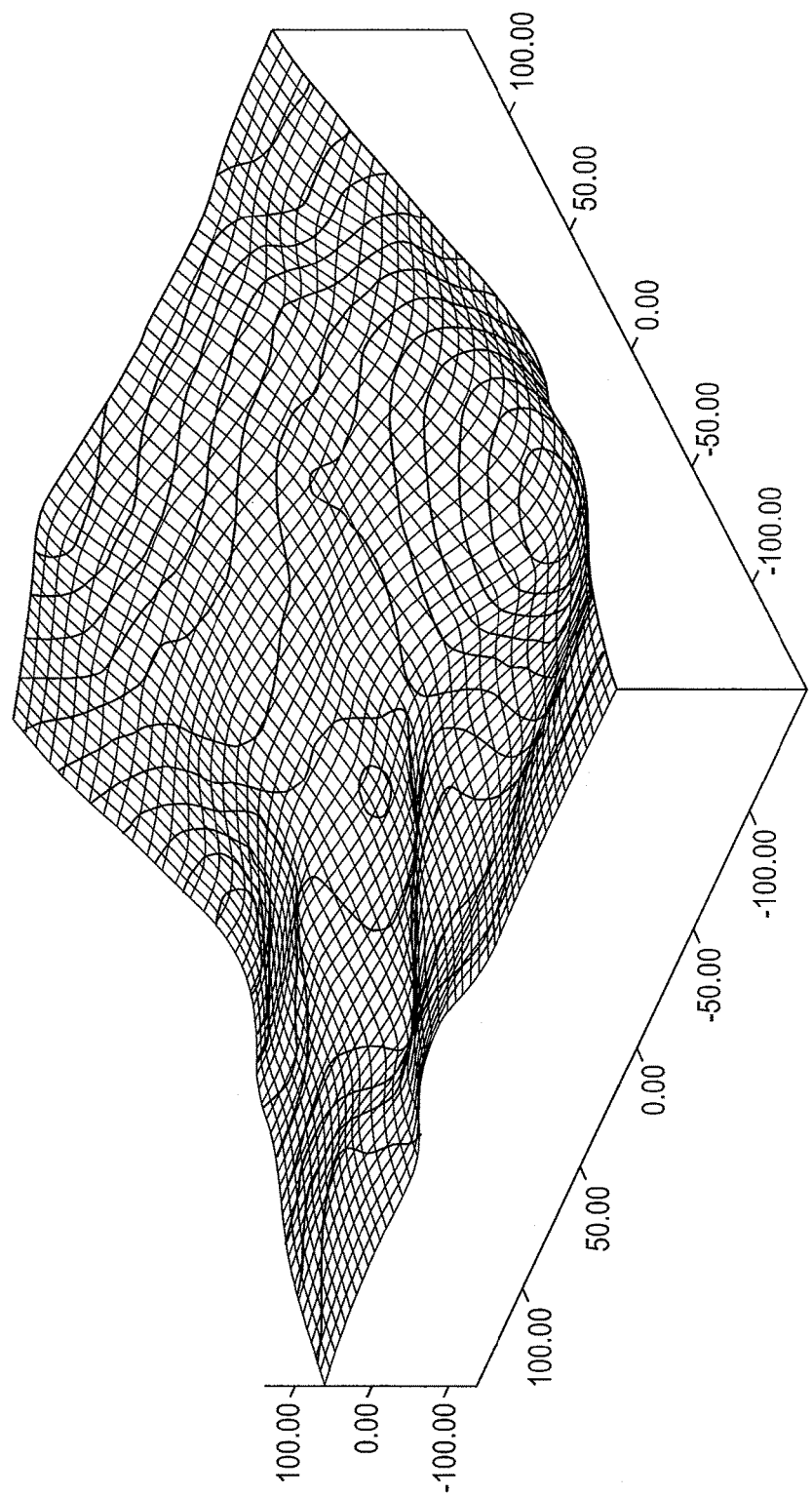
FIG. 51 is a computer rendering of a surface in FIG. 50A, illustrating measured differences in elevation of the surface.
Figure 52:
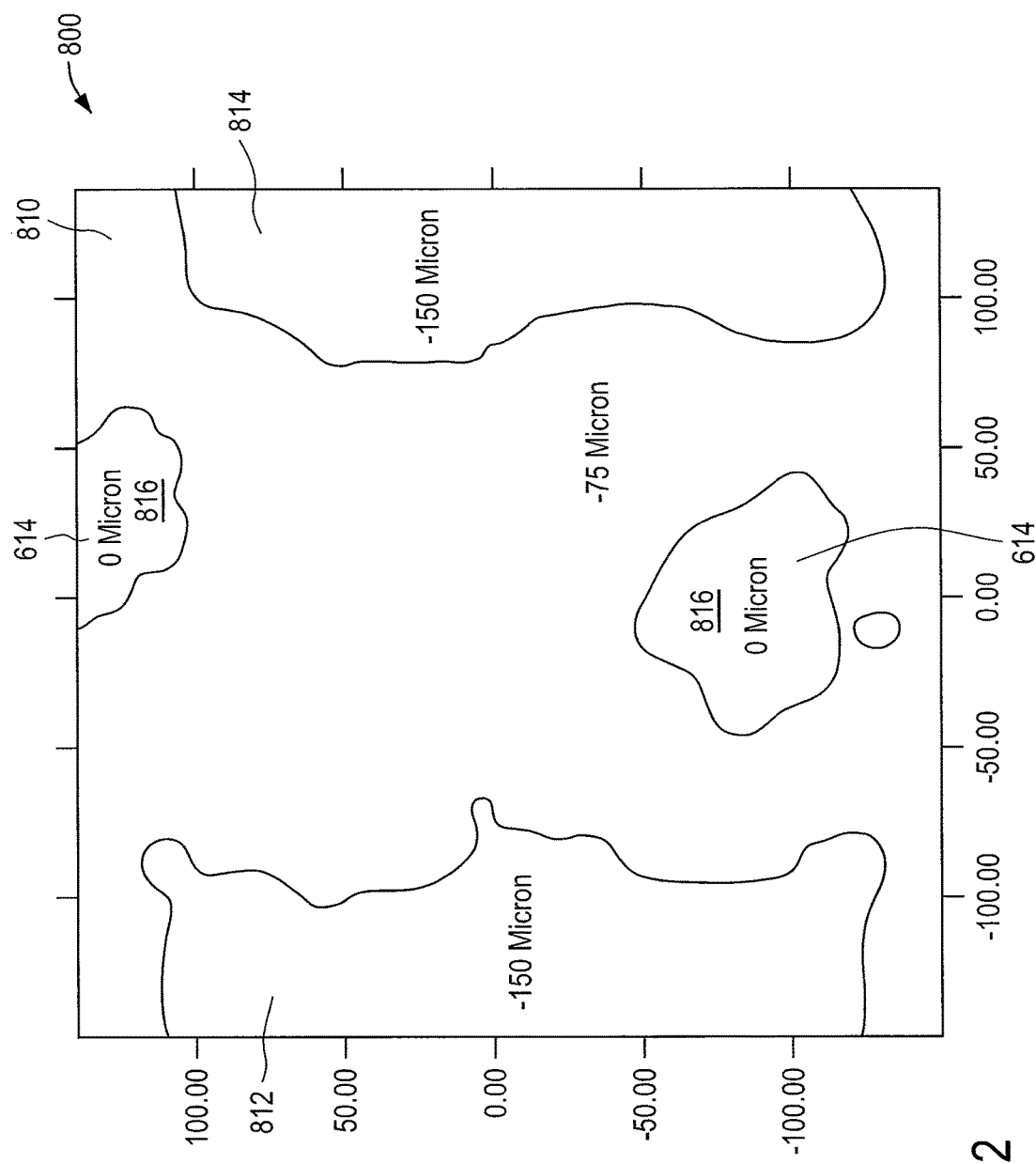
FIG. 52 is a computer rendering illustrating different overlaying shims that are used for making the compensating piece.

FIG. 50A illustrates only an edge, and therefore only a two-dimensional profile of the lower surface 806. As shown in FIG. 51, the lower surface 806 has a three-dimensional profile, with a third dimension that extends into the paper in FIG. 50A. FIG. 52 illustrates a topography of the lower surface 804 of the compensating piece 800 in FIG. 50B. The compensating piece 800 consists of three shims 810, 812, and 814. Each one of the shims 810, 812, and 814 is 75 microns thick. Thinner shims will allow for more control. The shim 810 has a plurality of openings 816 form therein to expose the lower surface of the stiffener substrate 614 at an elevation of 0 microns. A lower surface of the shim 810 is at elevation of 75 microns below the lower surface of the stiffener substrate 614. The shims 812 and 814 are located on the lower surface of the shim 810 such that the shims 812 and 814 have lower surfaces at an elevation of 150 microns below the lower surface of the stiffener substrate 614.

Figure 53:
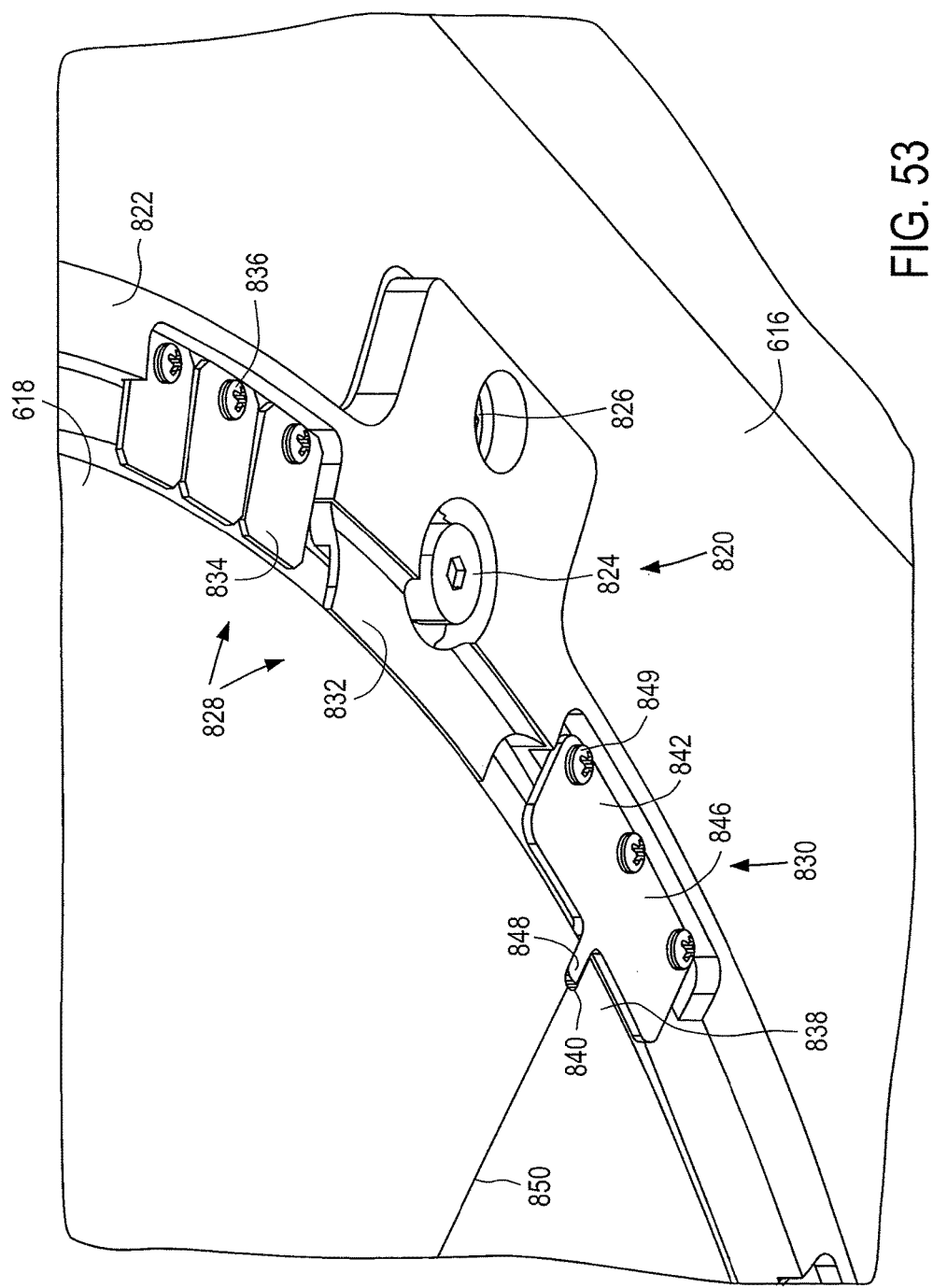
FIG. 53 is a bottom perspective view showing inner and outer connector arrangements that are used for maintaining contact between a contactor and a wafer both before and after heating of the contactor and the wafer at different rates.

FIG. 53 illustrates the distribution board 616, the contactor board 618, and a mounting arrangement 820 that is used to mount the contactor board 618 to the distribution board 616. The mounting arrangement 820 includes a mounting ring 822, a plurality of fasteners 824 and 826, a support arrangement 828, and an inner connecting arrangement 830.

The mounting ring fastener 826 secure the mounting ring 822 to the distribution board 616. The support arrangement 828 includes a plurality of flanges 832 and 834, and a plurality of flange fasteners 836. The flange 832 is integrally manufactured with the mounting ring 822. The flange fasteners 836 secure the flanges 834 to the mounting ring 822. An edge of the contactor board 618 rests on upper surfaces of the flanges 832 and 834.

The inner connecting arrangement 830 includes a first connecting piece 838 forming part of the contactor board 618 and defining a slot 840 that extends in a radial direction towards a center point of the contactor board 618, a second connecting piece 842, and a plurality of connecting piece fasteners 844. The second connecting piece 842 has a main portion 846 and a finger 848 extending from the main portion 846. The fasteners 844 secure the main portion 846 to the mounting ring 822. The finger 848 extends in a radial direction towards a center point of the mounting ring 822.

When the second connecting piece 842 is mounted to the mounting ring 822, the slot 840 is aligned with the finger 848. The slot 840 is longer than the finger 848 so that the finger 848 is permitted to slide relatively within the slot 840 in a radial direction towards the center point of the contactor board 618 and a center point of the mounting ring 822. Inter-engagement of the finger 848 with the slot 840 prevents tangential movement of the first connecting piece 838 relative to the second connecting piece 842, i.e. rotation of the contactor board 618 relative to the distribution board 616 about a center point of the contactor board 618 or a center point of the mounting ring 822. Relative movement between the contactor board 618 and the mounting ring 822 is thus restricted to a line 850 extending in a radial direction through a center point of the distribution board 618 and the mounting ring 822.

Figure 54:
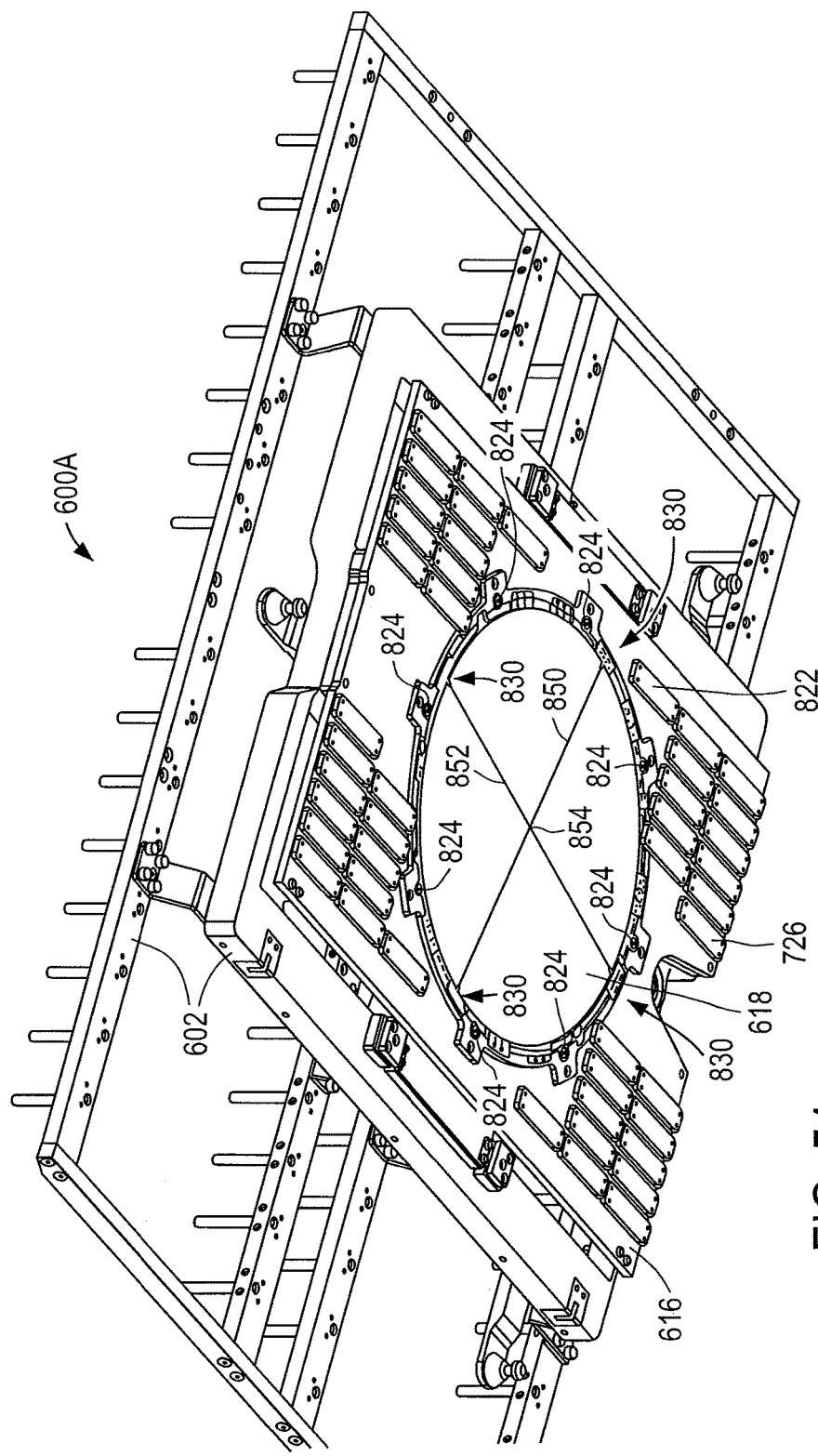
FIG. 54 is a bottom perspective view of the cartridge of FIG. 49, specifically illustrating positioning of more inner and outer connector arrangements.

Referring to FIG. 54, four inner connecting arrangements 830 are located at 90° angles about a circumference of the mounting ring 822. Two of the connecting arrangements 830 opposing one another restrict movement of the contactor board 618 relative to the distribution board 616 along the line 850. The other two connecting arrangements 830 restrict movement along a line 852. The lines 850 and 852 are at right angles to one another and cross at a center point 854 of the contactor board 618 and the mounting ring 822.

As previously mentioned, the materials of the contactor board 618 and the distribution board 616 are engineered so that terminals and contacts on the contactor board 618 and the distribution board 616 match one another at different temperatures. However, during a transition from one temperature to another, it may happen that there is relative movement between corresponding contacts and terminals of the contact board 618 and the distribution board 616 due to non-uniform expansion. If unchecked, non-uniform expansion can thus lead to misalignment between contacts and terminals. The connecting arrangements 830 ensure that a center point (within a central area) of contactor board 618 is always at a center point of the mounting ring 822. The center points will thus coincide with one another at a first temperature, during a transition from the first temperature to a second temperature and at the second temperature. Because the center points coincide and because the materials of the contactor board 618 and the distribution board 616 are engineered to ensure matching between contacts and terminals, the contacts and terminals will match one another at the first temperature and at the second temperature.

Figure 55:
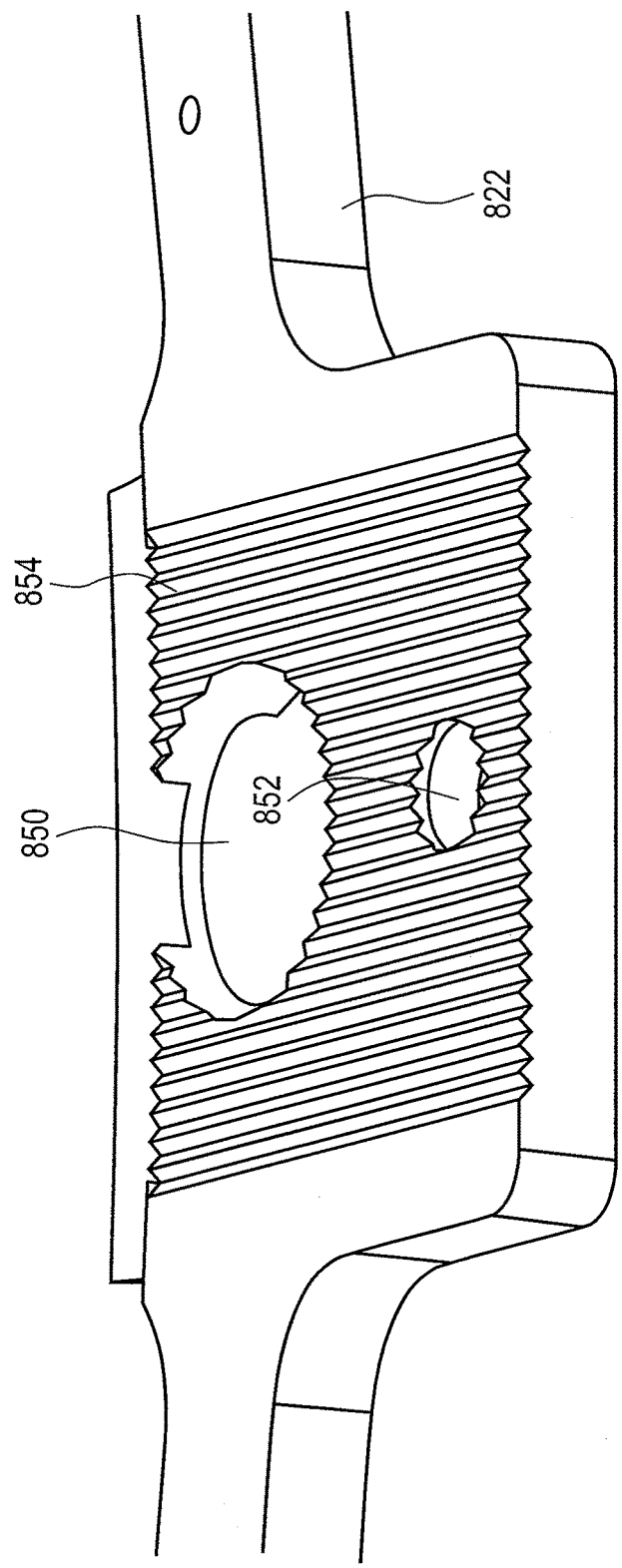
FIG. 55 is a top perspective view of a portion of a mounting ring forming part of the outer connector arrangement.

A shown in FIG. 55, two fastener openings 850 and 852 are formed through a portion of the mounting ring 822 and a plurality of grooves 854 are formed on an upper surface of the portion having the fastener openings 850 and 852. Extensions of the grooves 854 cover a center point of the mounting ring 822.

Figure 56:
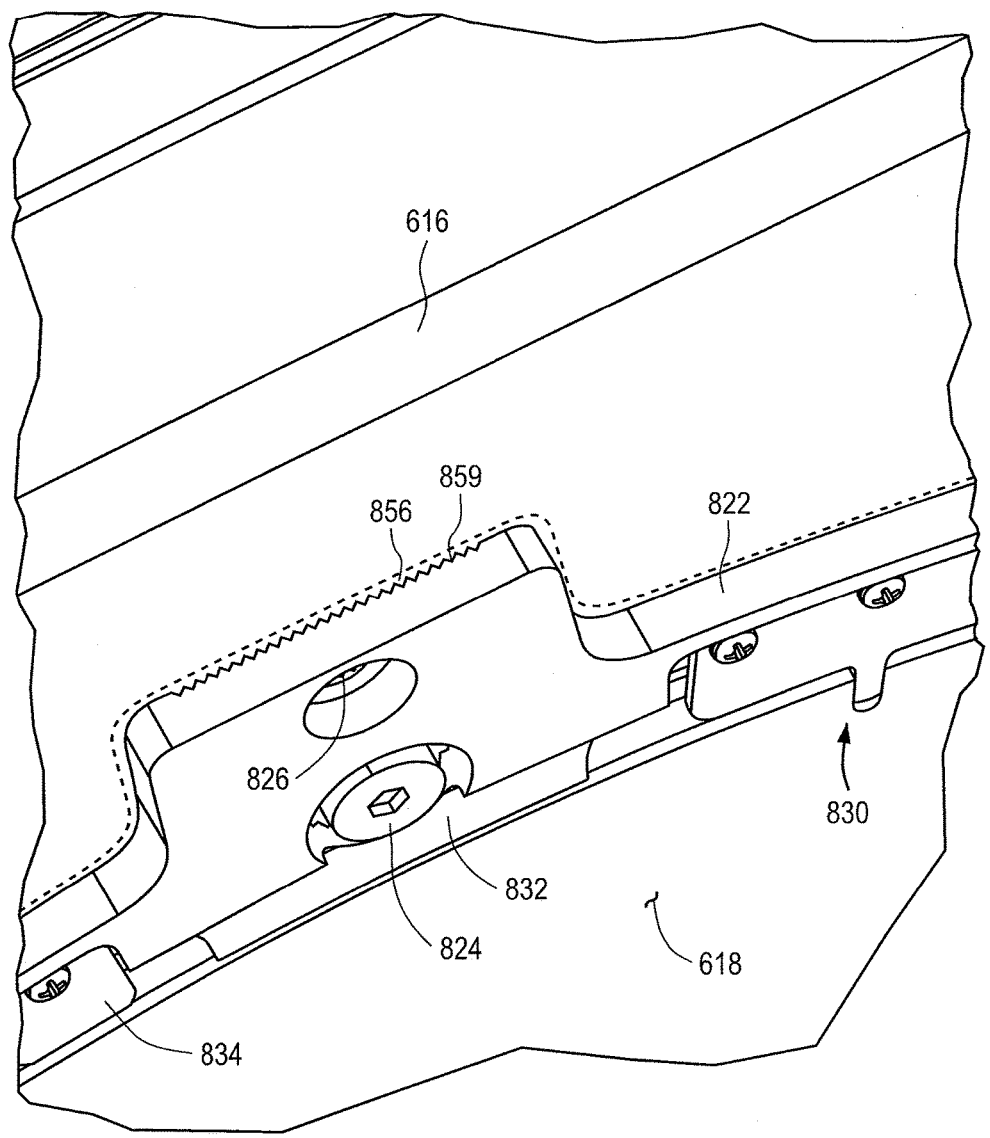
FIG. 56 is a bottom perspective view of the connector arrangements from an opposing side than shown in FIG. 53.

Referring to FIG. 56, a compliant piece 856 is located between the portion of the mounting ring 822 having the grooves 854 and the distribution board 616. The compliant piece 856 is made of a compliant material such as Kapton® so that a lower surface of the compliant piece 856 acquires the shape of the grooves 854 when the compliant piece 856 is sandwiched between the mounting ring 822 and the distribution board 616. Relative movement of the portion of the mounting ring 822 having the grooves 854 and the complementary interengaging compliant piece 856 is restricted to the direction in which the grooves 854 extend. The portion of the mounting ring 822 with the grooves 854 and the compliant piece 856 form one outer connecting arrangement.

Referring again to FIG. 54, eight fasteners 824 are located on the mounting ring 822 at 45° intervals about the center point 854. Each fastener 824 corresponds to the location of a respective compliant piece such as the compliant piece 856 in FIG. 56. The grooves 854 and the compliant pieces 856 restrict movement of the mounting ring 822 so that the center point 854 of the mounting ring 822 is always at the same location relative to a corresponding location on the distribution board 616 at any temperature or during a transition from one temperature to another. The grooves 854 and the compliant pieces 856 thus further assist in maintaining contacts and terminals on the contactor board 618 and the distribution board 616 in substantially the same locations relative to one another.

Figure 57:
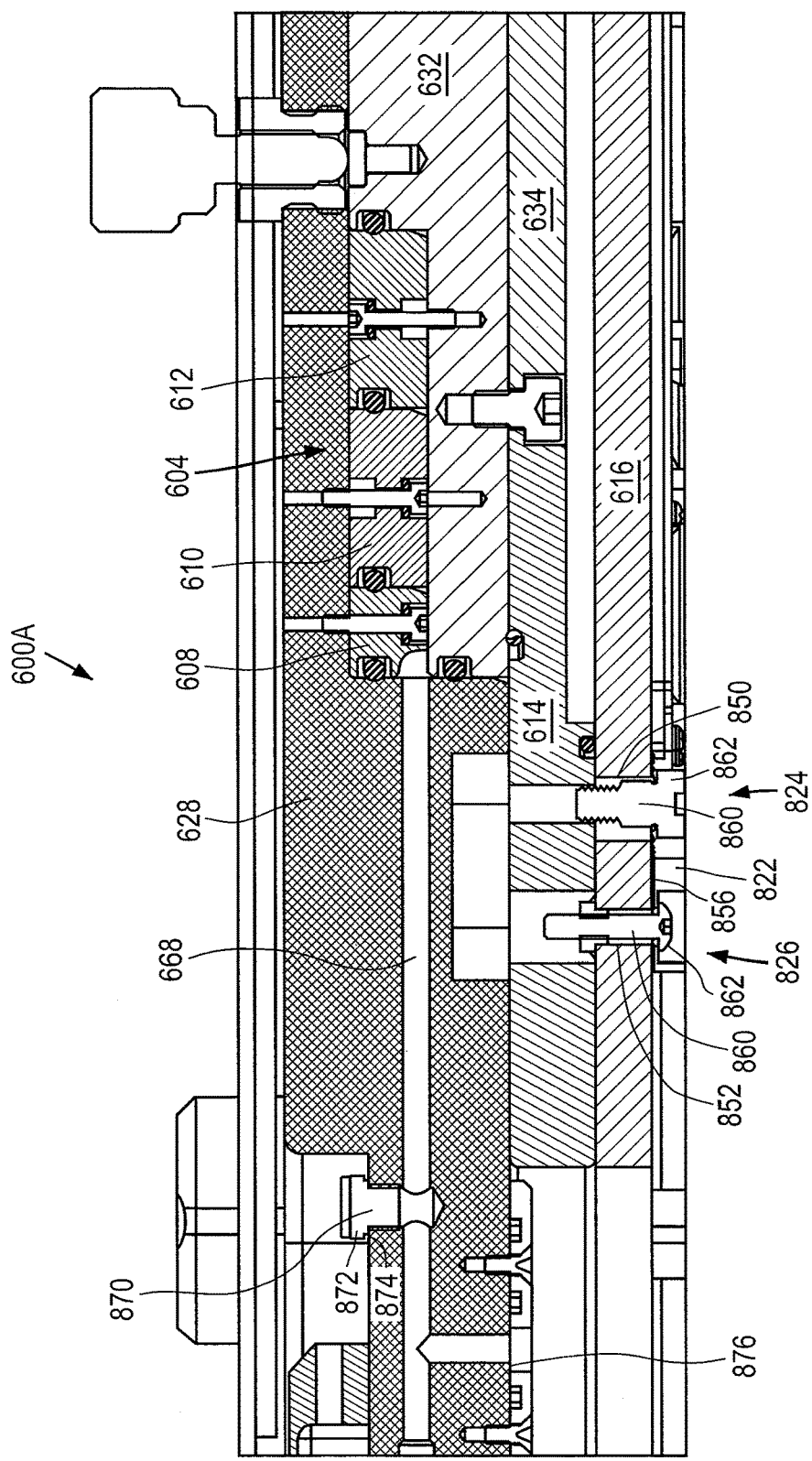
FIG. 57 is a cross-sectional side view of the cartridge of FIG. 49, specifically showing how the connector arrangement is assembled and also illustrating a pressure relief valve and an orifice that are used to prevent over pressurizing of a volume behind a piston.

FIG. 57 shows that the fasteners 824 and 826 are bolts, each having a shank 860 and a head 862. The shank 860 of the fastener 824 has thread that is screwed into complementary thread of the stiffener substrate 614. The shank 860 of the fastener 826 has thread that is screwed into a complementary thread of a nut 864 with the head 862 of the fastener 826 located on an opposite side of the distribution board 616 than the nut 864. The fastener 824 thus secures the distribution board 616 to the stiffener substrate 614 and the fastener 826 secures the mounting ring 822 to the distribution board 616. What should further be noted is that the openings 850 and 852 are larger than the shanks 860 of the fasteners 824 and 826. The shanks 860 can thus move relatively within the openings 850 and 852 to allow for sliding movement of the mounting ring 822 on the compliant piece 856. The fasteners 824 and 826, nuts 864, stiffener substrate 614, and the openings 850 and 852 all form part of the outer connecting arrangements.

As further illustrated in FIG. 57, a pressure relief valve 870 is connected to the pressure and vacuum actuation passage 668. The pressure relief valve 870 includes a valve component 872 and a spring (not shown). The spring keeps the valve component 872 seated on a surface 874 of the lower backing plate 628 as the pressure within the pressure and vacuum actuation passage 668 increases, the spring thus prevents opening of the valve component 872 to atmosphere. Once the pressure in the pressure and vacuum actuation passage 668 goes above a predetermined pressure above atmosphere pressure, the pressure acts on a lower surface of the valve component 872 to overcome a spring force of the spring and move the valve component 872 off the surface 874. Air within the pressure and vacuum actuation passage 668 then vents past the valve component 872 to atmosphere. Air is thus automatically vented to atmosphere when the pressure within the pressure and vacuum actuation passage 668 goes above the predetermined value.

Air continues to vent to atmosphere as long as the pressure within the pressure and vacuum actuation passage 668 is above the predetermined pressure. When the pressure within the pressure and vacuum actuation passage 668 again drops below the predetermined pressure, the spring force of the spring overcomes a force created by the pressure on the lower surface of the valve component 872 so that the valve component 872 moves down and seats on the surface 874.

Venting of air to atmosphere is thus automatically terminated when the pressure within the pressure and vacuum actuation passage 668 falls below the predetermined pressure. It can thus be seen that the valve 870 prevents a pressure behind the piston 604 from becoming too large and thereby prevents damage to the cartridge 600A and to the wafer.

An orifice 876 is located within the pressure and vacuum actuation passage 668. The size of the orifice 876, and therefore its resistance to airflow, is chosen so that the valve 870 has a bleeding capacity that is more than a capacity for air flowing through the orifice 876. As such, the mass of air within the pressure and vacuum actuation passage 668 will not increase if the valve 870 is open. The orifice 876 thereby further prevents damage to the cartridge 600A and to the wafer.

Figure 58:
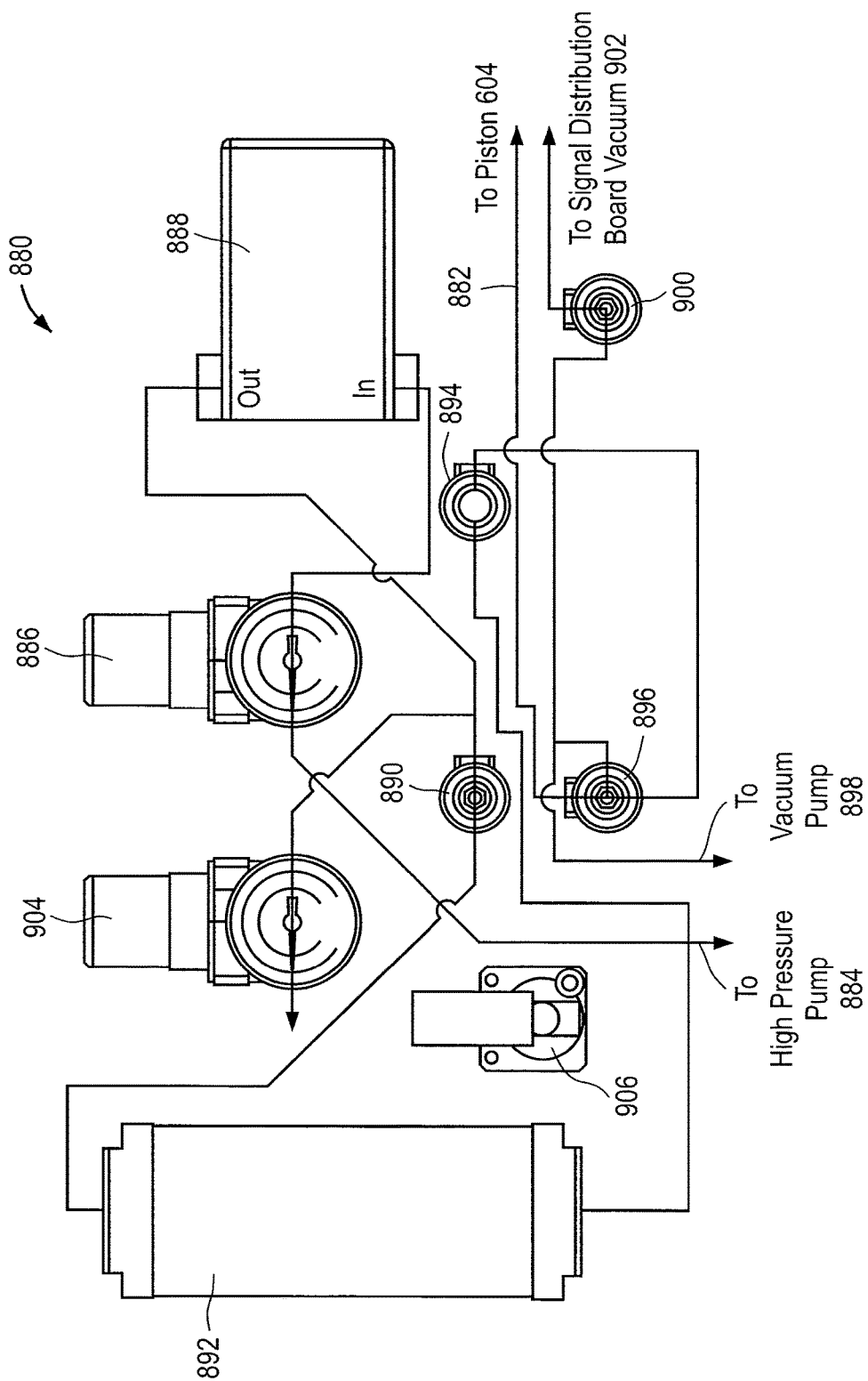
FIG. 58 is a schematic view of a pneumatic system that is used to control movement of the piston in FIG. 57.

FIG. 58 shows a pneumatic system 880 that is used for controlling the piston 604 in FIG. 49. The pneumatic system 880 includes a high pressure line, a low pressure line, and a vacuum line. The high pressure line and the low pressure line carry fluid in the form of air at pressures above atmospheric pressure, and the vacuum line carries air at a pressure below atmospheric pressure. The pneumatic system 880 further includes an actuation line 882 connected to the volume behind the piston 604.

The high pressure line includes a line connected to a high pressure pump 884, and an air regulator 886. Air at high pressure is provided from the pump 884 to the air regulator 886. The air regulator 886 reduces the pressure of the air and provides the air at reduced pressure to the low pressure line. The low pressure line includes a proportional controller 888, a probe piston 890, an air tank 892, an isolation valve 894, and a probe piston 896 located in series after one another. The vacuum line includes a line connected to a vacuum pump 898, the probe piston 896, a cartridge clamp 900, and to the signal distribution board vacuum area 902 as hereinbefore described. The low pressure line and the vacuum line are thus both connected to the probe piston 896. The probe piston 896 can be operated to selectively provide air from either the low pressure line or from the vacuum line to the activation line 882 connected to the piston 604. The pneumatic system 880 also includes a vent valve 904 that is connected to the low pressure line between the proportional controller 888 and the probe piston 890, and an air pressure sensor 906 that is connected to the high pressure line.

It will be understood that many of the components of the pneumatic system 880 are under the control of a computer or provide a control input into the computer. Such a computer has a processor and memory connected to the processor. A program having a series of instructions is stored in the memory and is executable by the processor. The air pressure sensor 906 is one component that provides a control input into the computer for purposes of controlling other components of the pneumatic system 880. Specific components of the pneumatic system 880 that are controlled by the computer include the vent valve 904, the isolation valve 894, the probe piston 896, the probe piston 890, and the proportional controller 888. The computer for example controls the piston 896 to provide either air from the low pressure line or vacuum pressure to the piston 604. The computer also controls the isolation valve 894 to isolate a volume behind the piston 604 from the high pressure pump 884 and the vacuum pump 898.

Figure 59:
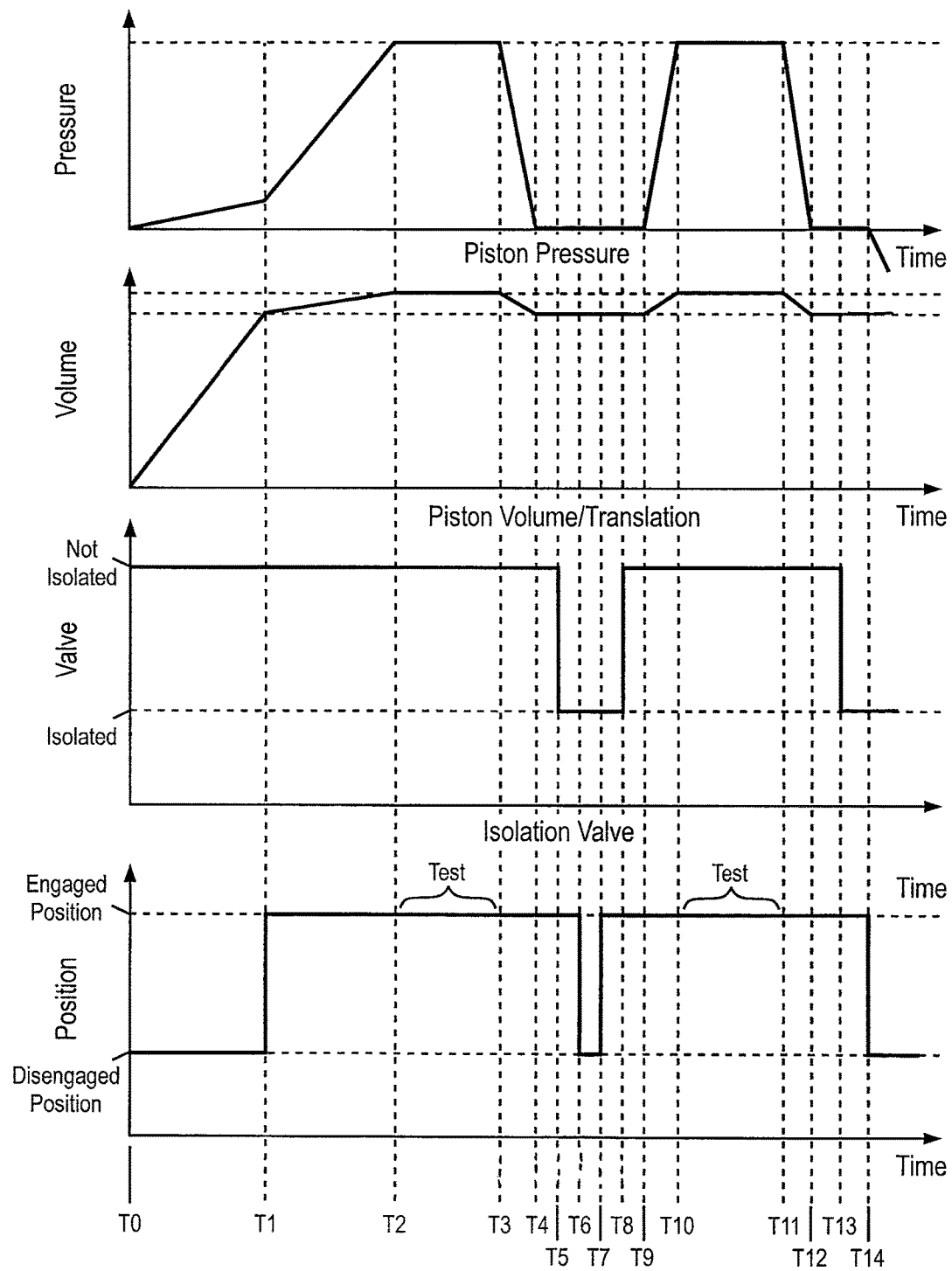
FIG. 59 show graphs of piston pressure, piston volume and translation, the state of an isolation valve, and the positioning of a wafer chuck over time in the operation of the pneumatic system of FIG. 58.

FIG. 59 illustrates how the pneumatic system 880 of FIG. 58 is used to control movement and a force created by the piston 604 in FIG. 49. At Time T0 the piston 604 is fully retracted into the lower backing plate 624 in FIG. 49 so that the volume behind the piston 604 is at a minimum and the pressure behind the piston 604 is at negative or zero relative to atmospheric pressure. The isolation valve 894 in FIG. 58 is open so that the volume behind the piston 604 is not isolated. The wafer chuck 130 of FIG. 8 is moved into an upward z-direction so that the terminals 72 can come down and engage with the contacts on the wafer 76.

Between Time T0 and Time T1, the volume behind the piston 604 is increased by operating the probe piston 896 in FIG. 58 such that air from the pressure line 882 is provided to the piston 604. There is only a slight increase in the pressure behind the piston 604 to overcome the force of the spring 644 in FIG. 49. At Time T1, the wafer chuck 130 is engaged, i.e. the contacts on the wafer 76 make contact with the terminals 72 in FIG. 8.

Between Times T1 and T2, the probe piston 896 in FIG. 58 remains open so that the pressure behind the piston 604 increases. There is only a slight increase in the volume behind the piston 604 as the terminals 72 compress. At Time T2, the forces created by the terminals 72 are sufficient to initiate testing. Testing is carried out for an interval between Time T2 and T3.

Between Times T3 and T4 the pressure behind the piston 604 is reduced to zero. The volume only decreases slightly as the terminals 72 again expand. The wafer chuck 130 remains engaged. At Time T5, the isolation valve 894 is closed. The volume behind the piston 604 is thus isolated. When the volume behind the piston 604 is isolated, no air can flow into or out of the volume behind the piston 604. It is also not possible to increase or decrease the pressure of the air in the volume behind the piston 604.

At Time T6, the wafer chuck 130 in FIG. 8 is moved vertically downward into a disengaged position wherein the terminals 72 do not make contact with the contacts on the wafer 76. Because the isolation valve 894 in FIG. 58 is closed, and the volume behind piston 604 is isolated, the piston 604 remains in a stationary position relative to the lower backing plate 624. Between Times T6 and T7, the wafer 76 on the wafer chuck 130 is replaced with another wafer and the wafer chuck 130 is again moved into the engaged position. Contacts on the new wafer are now in contact with the terminals 72. By maintaining the piston 604 in a z-position, more consistent planarity in x- and y-directions can be maintained from one wafer to the next.

At Time T8, the isolation valve 894 in FIG. 58 is again opened. Between Times T9 and T10, the pressure is again increased and the volume increases only slightly as the terminals 72 compress. The sequence of events at Times T10, T11, T12, T13 and T14 are the same as the sequence of events at Times T2, T3, T4, T5, and T6 respectively. The sequence of events can be repeated any number of times to test three wafers or more.

At Time T14, following testing a number of the wafers, the pressure is reduced to below atmospheric pressure. Negative pressure causes the piston 604 to retract in a vertical z-direction into the lower backing plate 624 of FIG. 49.

The features of the cartridge 600A in FIGS. 49 to 59 may find application in a system having an actuator other than a piston such as the piston 604. For example, features of cartridge 600A may find application in conjunction with an activator in the form of a bladder as hereinbefore described.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method of testing integrated circuits of devices, comprising:
   holding the first device against a surface of a holder;
   moving a contactor board assembly relative to the holder to bring terminals of the contactor board assembly into contact with contacts on the first device;
   allowing air through a fluid line to modify a size of a volume defined between the first and second portions of the actuator, thereby actuating first and second portions of an actuator to move a contactor support structure relative to an apparatus frame and urge terminals on the contactor support structure against contacts on the first device;
   providing signals through the terminals and contacts to an integrated circuit of the first device;
   reducing a pressure in the internal volume while maintaining the terminals in contact with the contacts;
   moving the holder relative to the apparatus frame to disengage the terminals from the contacts while maintaining the first and second components of the actuator in a substantially stationary relationship with one another;
   replacing the first device with a second device by removing the first device from the holder and holding the second device against the surface of the holder;
   moving the holder relative to the frame to bring the terminals into contact with contacts of the second device while the first and second components of the actuator remain substantially in the stationary relationship relative to one another;
   increasing the pressure in the volume to urge the terminals against the contacts on the second device; and
   providing signals through the terminals and the contacts of the second device to an integrated circuit of the second device.

2. The method of claim 1, further comprising:
   closing an isolation valve while the first and second components are in the stationary relationship to isolate the internal volume; and
   opening the isolation valve before increasing the pressure in the volume to urge the terminals against the contacts on the second device.

3. The method of claim 2, wherein the terminals make contact with the contacts of the second device before and after closing the isolation valve.

4. The method of claim 1, wherein the first and second portions of the actuator are a cylinder and a piston, respectively, the piston being located in the cylinder so that the cylinder and the piston jointly define the volume, further comprising:
   modifying a pressure of the volume and move the piston relative to the cylinder.

5. The method of claim 4, further comprising:
   adjusting the force of at least one spring that connects the piston to the cylinder to level the piston relative to the cylinder.

6. The method of claim 1, wherein the actuator includes inflatable and deflatable bladder, the first and second portions of the actuator being opposing sides of the bladder.

7. The method of claim 1, wherein the contactor support structure includes a distribution board substrate and a contactor substrate mounted to the distribution board substrate.

8. The method of claim 1, further comprising:
   removably mounting a cartridge frame of a cartridge to the apparatus frame, the contactor board assembly forming part of the cartridge; and
   connecting a surface of a connector interface to a surface of a contactor interface.

9. The method of claim 8, wherein the cartridge includes a common subassembly and a first unique contactor subassembly, further comprising:
   replacing the first unique contactor subassembly with a second unique contactor subassembly.

10. The method of claim 9, further comprising:
    reducing a pressure in an area between the common subassembly and the second unique contactor subassembly.

11. An apparatus for testing integrated circuits of devices, comprising:
    an apparatus frame;
    a holder for the first device, secured to the apparatus frame;
    a contactor support structure;
    a plurality of terminals held by the contactor support structure;
    an actuator connected between the apparatus frame and the contactor support structure, having first and second portions that are movable relative to one another and a volume defined between the first and second portions and a fluid line connected to the volume to allow air through the volume and thereby modify a size of the volume and move the contactor support structure relative to the apparatus frame to move the contactor support structure relative to the apparatus frame and toward the surface of the holder so that the terminals are urged against contacts of the first device;
    a fluid line connected to the volume to allow air through the volume and thereby modify a size of the volume and move the contactor support structure relative to the apparatus frame toward the holder so that the terminals are urged against contacts of the first device;
    a power source;
    a power electrical path connecting the power source to a power terminal of the terminals held by the support structure;
    a signal source;
    a plurality of signal electrical paths, each connecting the signal source to a respective signal terminal of the terminals held by the support structure;
    a processor;
    a memory connected to the processor; and
    a computer program stored in the memory and executable by the processor to carry out a method comprising:

reducing a pressure in the internal volume while maintaining the terminals in contact with the contacts;

moving the holder relative to the apparatus frame to disengage the terminals from the contacts while maintaining the first and second components of the actuator in a substantially stationary relationship with one another;

replacing the first device with a second device by removing the first device from the holder and holding the second device against the surface of the holder;

moving the holder relative to the frame to bring the terminals into contact with contacts of the second device while the first and second components of the actuator remain substantially in the stationary relationship relative to one another;

increasing the pressure in the volume to urge the terminals against the contacts on the second device; and providing signals through the terminals and the contacts of the second device to an integrated circuit of the second device.

12. The apparatus of claim 11, further comprising:
closing an isolation valve while the first and second components are in the stationary relationship to isolate the internal volume; and
opening the isolation valve before increasing the pressure in the volume to urge the terminals against the contacts on the second device.

13. The apparatus of claim 12, wherein the terminals make contact with the contacts of the second device before and after closing the isolation valve.

14. The apparatus of claim 11, wherein the first and second portions of the actuator are a cylinder and a piston, respectively, the piston being located in the cylinder so that the cylinder and the piston jointly define a volume, further comprising, the fluid line being connected to the volume to modify a pressure of the volume and move the piston relative to the cylinder.

15. The apparatus of claim 14, further comprising:
a spring; and
a spring adjustment mechanism having a first portion secured to the piston and a second portion connected to the spring, the spring adjustment mechanism being adjustable to adjust a force of the spring and level the piston relative to the cylinder.

16. The apparatus of claim 11, wherein the actuator includes inflatable and deflatable bladder, the first and second portions of the actuator being opposing sides of the bladder.

17. The apparatus of claim 11, wherein the contactor support structure includes a distribution board substrate and a contactor substrate mounted to the distribution board substrate.

18. The apparatus of claim 11, further comprising:
a cartridge including a cartridge frame that is removably mountable to the apparatus frame, the contactor board forming part of the cartridge;
a contactor interface on the contactor support structure; and
a connector interface having a surface for connecting to a surface of the contactor interface.

19. The apparatus of claim 18, wherein the cartridge includes a common subassembly and a first unique contactor subassembly that is replaceable with a second unique contactor subassembly.

20. The apparatus of claim 19, further comprising:
a pressure reduction passage in communication with an area between the common subassembly and the second unique contactor subassembly and having an outlet on an external side of the cartridge; and
a pump connected to the outlet of the pressure reduction passage so as to reduce a pressure in the area between the common subassembly and the second unique contactor subassembly.

\* \* \* \* \*